United States Patent [19]
van Phuoc et al.

[11] Patent Number: 5,789,899
[45] Date of Patent: *Aug. 4, 1998

[54] SMART BATTERY SYSTEM WITH AN A/D CONVERTER THAT CONVERTS BOTH POSITIVE AND NEGATIVE ANALOG INPUT SIGNALS

[76] Inventors: Duong van Phuoc, Lohweg 51, 85386 Eching; Rudi Wieczorek, Agnesstrasse 64, 80797 Munchen; Elmar Zeising, Freisinger Strasse 7, 85354 Haindlfing, all of Germany; Louis Hruska, 385 Davis St., Northboro, Mass. 01532; Alwyn H. Taylor, 25 Hawthorne Rd., Wellesley Hills, Mass. 02181; Daniel D. Friel, 4 Surrey Rd., Woburn, Mass. 01801; Matthew P. Hull, 89 Cole St., Jamestown, R.I. 02835

[*] Notice: The term of this patent shall not extend beyond the expiration date of Pat. Nos. 5,652,502, 5,646,508, 5,691,621 and 5,633,573.

[21] Appl. No.: 751,109

[22] Filed: Nov. 15, 1996

Related U.S. Application Data

[62] Division of Ser. No. 486,071, Jun. 7, 1995, which is a division of Ser. No. 336,945, Nov. 10, 1994.

[51] Int. Cl.$^6$ ...................................................... H02J 7/04
[52] U.S. Cl. ...................................................... 320/30; 320/48
[58] Field of Search .................................... 320/30, 48, 49; 341/143, 155, 158

[56] References Cited

U.S. PATENT DOCUMENTS

| | | |
|---|---|---|
| 3,971,980 | 7/1976 | Jungfer et al. . |
| 4,289,836 | 9/1981 | Lemelson . |
| 4,377,787 | 3/1983 | Kikuoka et al. . |
| 4,390,841 | 6/1983 | Martin et al. . |
| 4,455,523 | 6/1984 | Koenck . |
| 4,583,034 | 4/1986 | Martin . |
| 4,595,880 | 6/1986 | Patil . |
| 4,677,363 | 6/1987 | Kopmann . |
| 4,709,202 | 11/1987 | Koenck ................................ 320/43 |
| 4,725,784 | 2/1988 | Peled et al. . |
| 4,743,831 | 5/1988 | Young . |
| 4,885,523 | 12/1989 | Koenck . |
| 4,947,123 | 8/1990 | Minezawa . |
| 4,949,046 | 8/1990 | Seyfang . |
| 4,961,043 | 10/1990 | Koenck . |
| 5,027,294 | 6/1991 | Fakruddin et al. . |
| 5,047,961 | 9/1991 | Simonsen . |
| 5,151,644 | 9/1992 | Pearson et al. . |
| 5,196,779 | 3/1993 | Alexandres et al. . |
| 5,200,689 | 4/1993 | Interiano . |
| 5,216,371 | 6/1993 | Nagai . |
| 5,254,928 | 10/1993 | Young et al. . |
| 5,278,487 | 1/1994 | Koenck . |
| 5,284,719 | 2/1994 | Landau et al. . |
| 5,287,286 | 2/1994 | Ninomiya . |
| 5,315,228 | 5/1994 | Hess et al. . |
| 5,321,627 | 6/1994 | Reher . |
| 5,325,041 | 6/1994 | Briggs . |
| 5,341,084 | 8/1994 | Gotoh et al. . |

OTHER PUBLICATIONS

Markus Bullinger, "Quick Cahrging with Intelligence–An IC Controls NiCad and NiMH Battery Chargers," *Electronik*, 42, No. 6, Mar. 23, 1993, pp. 74–77.

Patrick Guelle, "Integrated Circuits for Rapid Chargers", *Electronique Radio Plans*, Feb. 1993, No. 543, pp. 57–64.

Jacques Robert, et al., "A 16–bit Low–Voltage CMOS A/D Converter," *IEEE Journal of Solid State Circuits*, vol. SC–22, No. 2, Apr. 1987, pp. 157–159.

*Primary Examiner*—Peter S. Wong
*Assistant Examiner*—Gregory J. Toatley, Jr.
*Attorney, Agent, or Firm*—Scully, Scott, Murphy and Presser

[57] ABSTRACT

A battery pack and a method of operating a battery system. The battery pack includes a rechargeable battery, an analog-to digital converter, and a processor. The analog-to digital converter is able to convert both positive and negative analog signals to digital signals; and, in use, the converter receives analog signals representing battery voltage, battery temperature, and battery current, and converts those signals to digital signals. The processor receives those digital signals from the converter and uses those digital signals to perform a series of calculations.

37 Claims, 31 Drawing Sheets

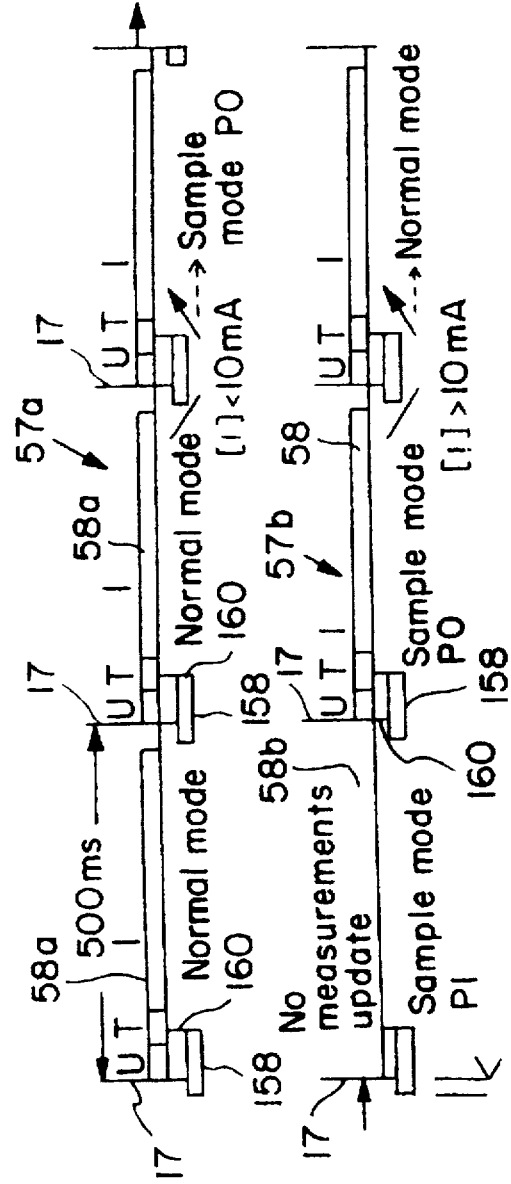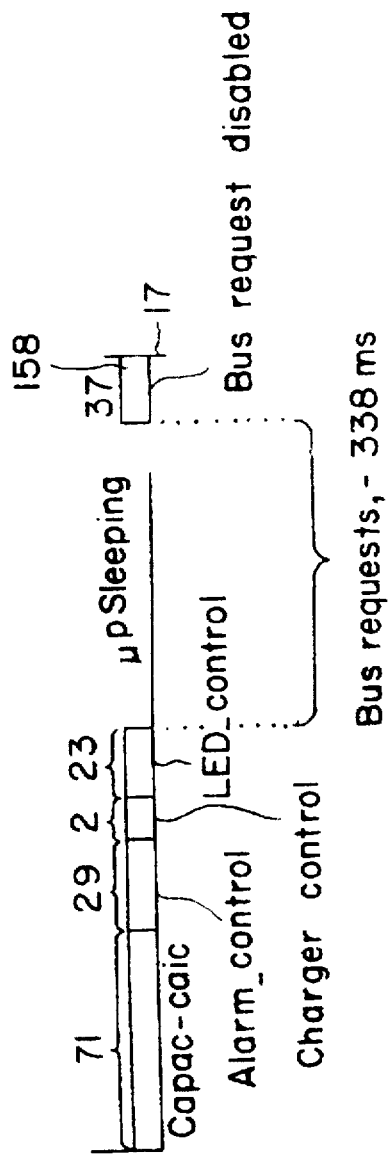

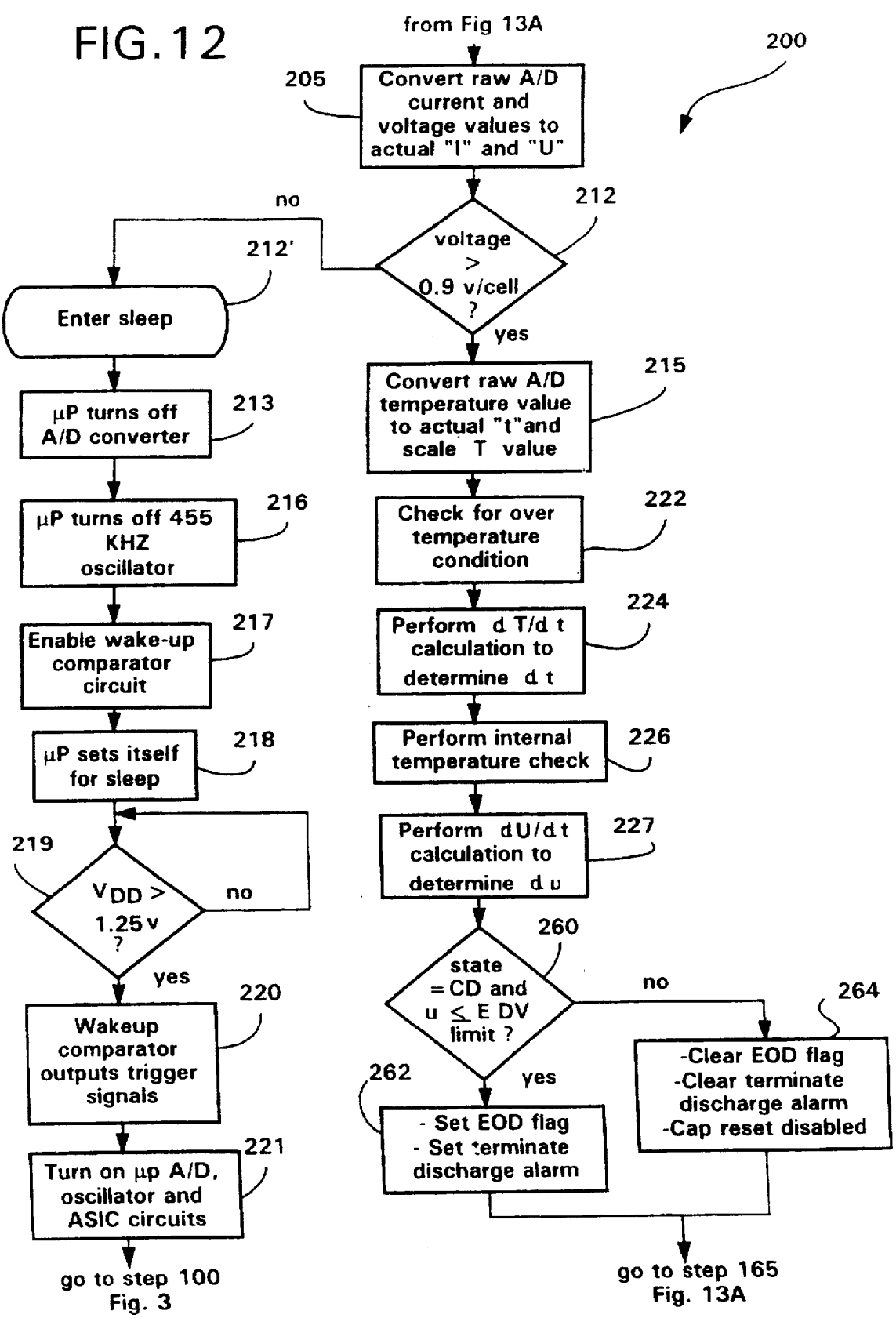

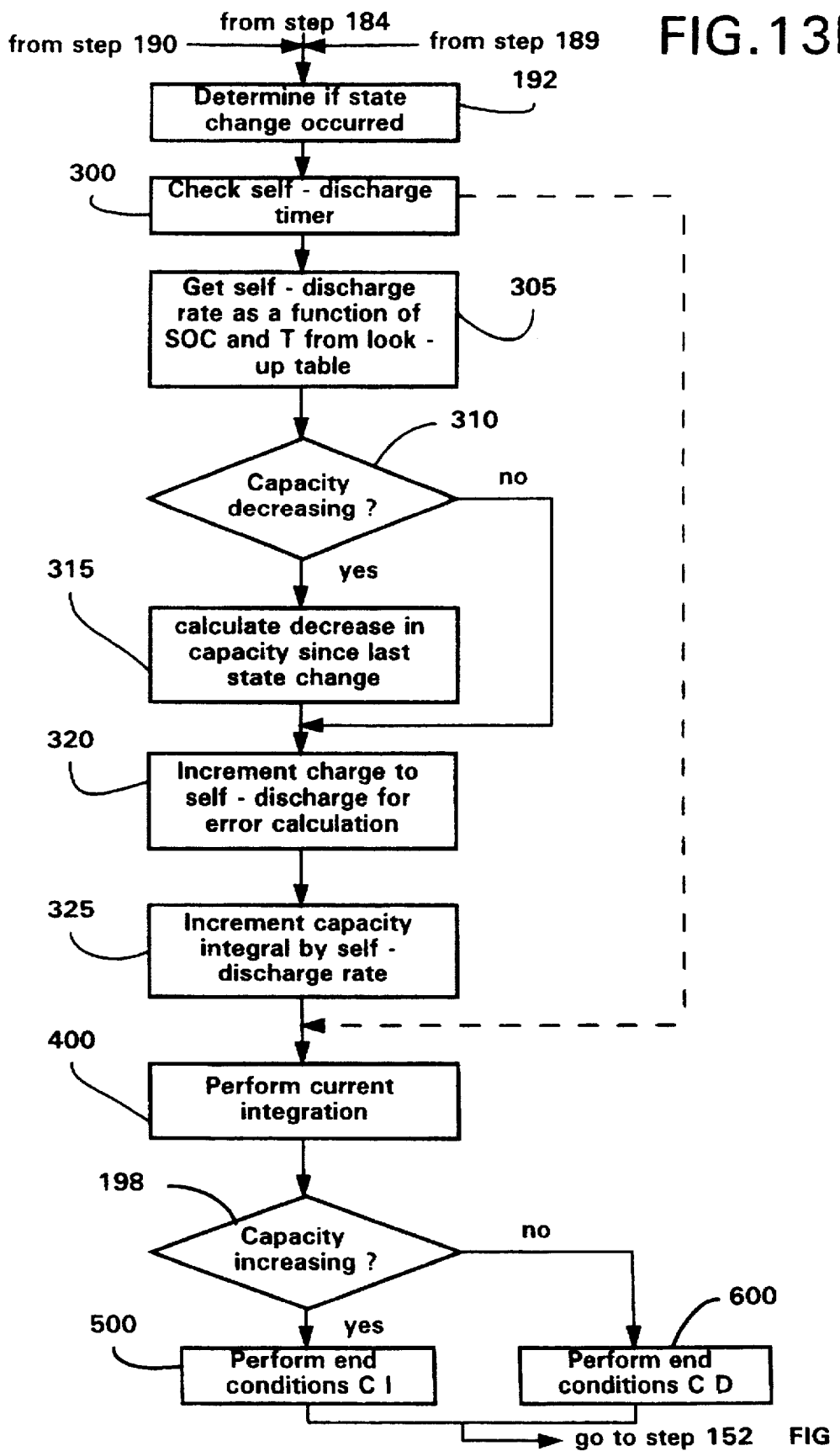

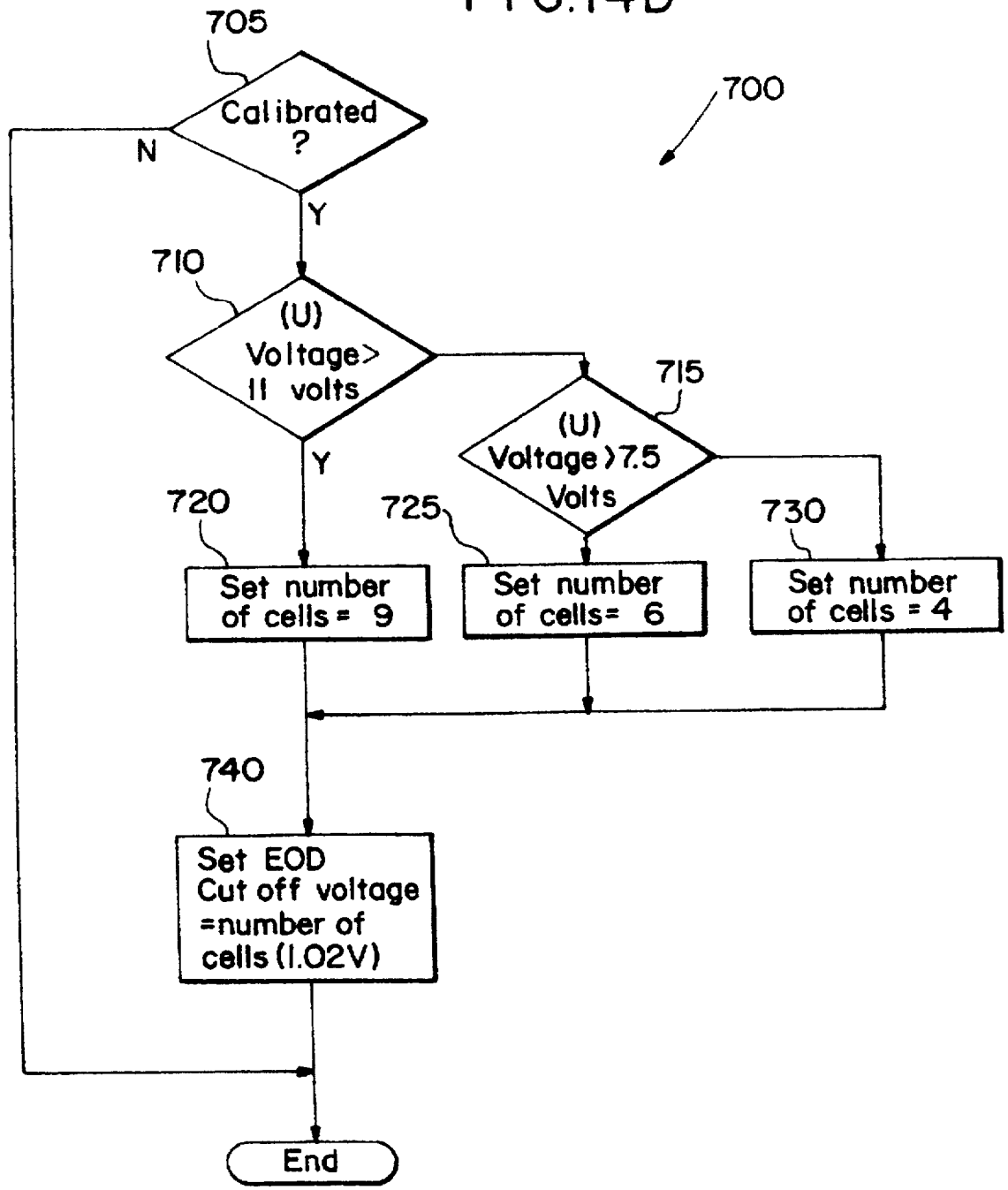

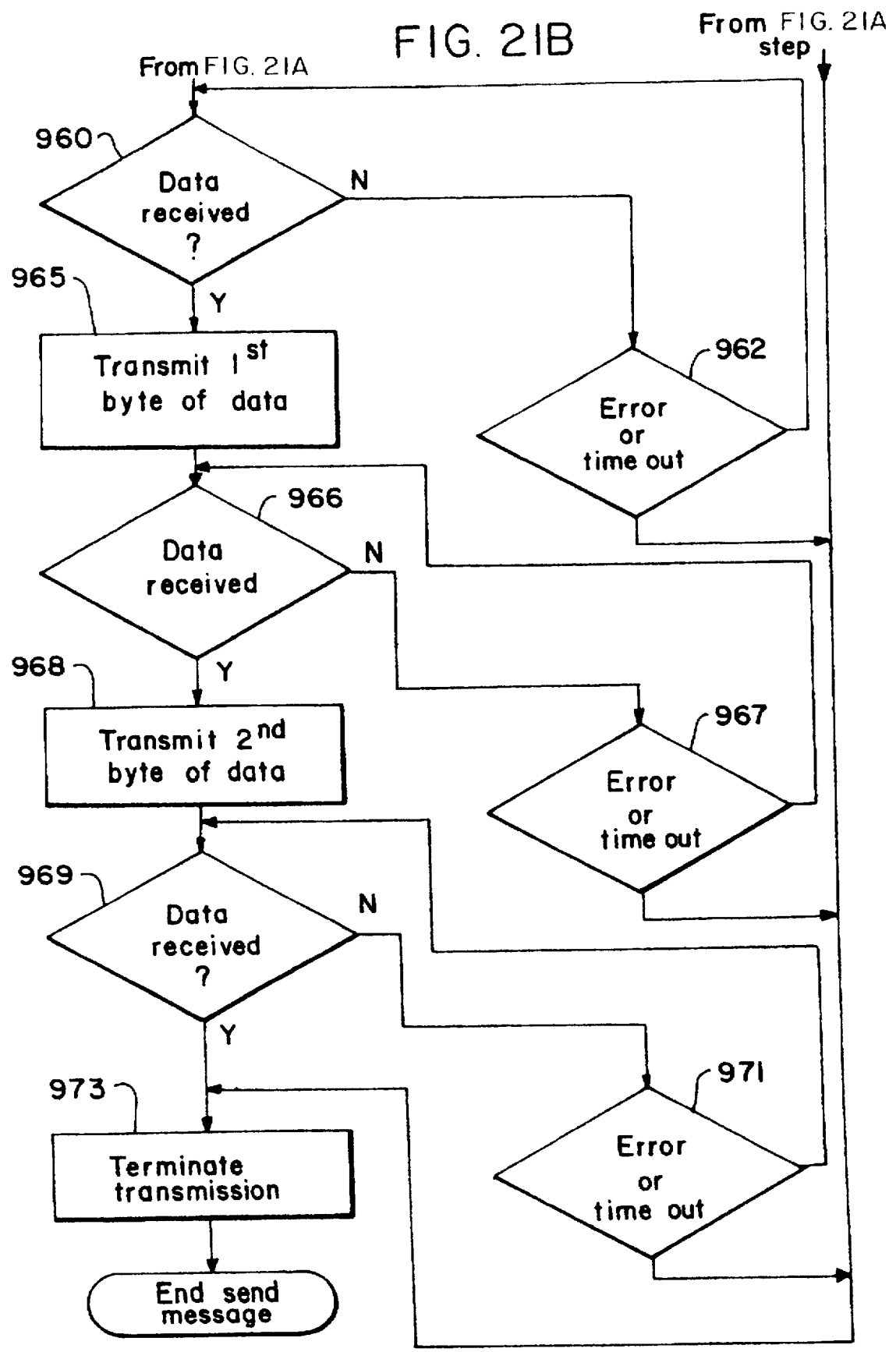

SMART BATTERY SYSTEM WITH AN A/D CONVERTER THAT CONVERTS BOTH POSITIVE AND NEGATIVE ANALOG INPUT SIGNALS

CROSS-REFERENCE

This is a divisional of copending application Ser. No. 08/486,071, filed on Jun. 7, 1995, which is a divisional of Ser. No. 08/336,945, filed on Nov. 10, 1994.

FIELD OF THE INVENTION

The present invention relates to generally to the art of rechargeable batteries and more specifically to a smart battery for use in an intelligent device having power management capabilities. The invention is a smart battery apparatus for controlling the operation of rechargeable Nickel Metal Hydride (NiMH) or Nickel Cadmium (NiCad) batteries, and the like, to enable the reporting of accurate information to the intelligent device for power management and charge control specific to the battery's state of charge and chemistry.

DESCRIPTION OF THE PRIOR ART

The advent of intelligent portable electronic devices such as notebook computers, video cameras, and cellular phones has enabled the development of smart rechargeable batteries that can communicate with the intelligent device to provide accurate information on the battery's present state of charge, and how best to recharge the battery to maintain maximum battery life, thus enabling the highest number of charge-discharge cycles. A user of such intelligent portable devices utilizing such smart batteries will not only know how much charge is left in the battery, but battery run time at various rates of power consumption. This enables the user to select a mode of operation that will enable maximum service life on the remaining state of charge and, how long the device will continue to operate.

Prior art rechargeable battery units have been provided with means for generating some desired information to their users, including for instance, a charge monitor and fuel gauge such as that disclosed in U.S. Pat. No. 5,315,228 which discloses a method for calculating state of charge and reporting run time to empty to the host computer system.

However, there is a need for a rechargeable power unit that will accurately maintain its own state of charge information even when nominally fully discharged such that a user will have instantaneous access thereof. Moreover, there is also a need for an intelligent rechargeable battery that can provide the user with an accurate prediction of its remaining operating time at various levels of power consumption. The user of such an intelligent device, such as a portable computer, can thus elect to power down a hard disk drive to extend the operation of the portable computer for a longer period of time than would had been possible at the higher rate of power consumption.

SUMMARY OF THE INVENTION

Accordingly, it is an object of the present invention to provide a smart battery device for use with a rechargeable battery to be installed in a host computer that will optimize the performance of the rechargeable battery throughout its life cycle.

It is another object of the instant invention to provide a smart battery device that includes a microprocessor for controlling a rechargeable battery that performs battery capacity calculations for communication to a host computer device or a smart battery charge device.

It is still another object of the instant invention to provide a smart battery device that includes a microprocessor for controlling a rechargeable battery and that provides intelligence in the form of present state of charge and battery charge parameters to a host device for communication to a smart charger.

It is yet still a further object of the instant invention to provide a smart battery device that includes a microprocessor for controlling a rechargeable battery that monitors battery operating parameters such as voltage, current, and temperature to thereby enable either a rapid charging rate or an optimal charging rate from any charged state.

Still yet another object of the instant invention is to provide a smart battery device that includes a microprocessor for controlling a rechargeable battery that calculates predictive data such as the battery's remaining life at the current rate of drain and at alternate rates of drain.

It is still a further object of the instant invention to provide a smart battery device that is an application specific integrated circuit (ASIC) having analog and digital components.

Furthermore, another object of the present invention is to provide a smart battery device that includes an analog to digital (A/D) converter for measuring battery charge parameters such as voltage, current, and temperature.

Yet still another object of the present invention is to provide a smart battery device having an A/D converter with a single positive power supply that is capable of bipolar operation for converting both positive and negative analog signals representing battery charge and discharge currents, respectively.

Another object of the instant invention is to provide a smart battery device as above wherein the analog and digital components of the ASIC comprise CMOS semiconductor technology designed for improved accuracy, and high A/D converter resolution with minimal power consumption.

Still another object of the present invention is to provide a smart battery device having a microprocessor such that, when nominally discharged, will place itself in a sleep mode with virtually no power consumption.

Yet a further object of the present invention is to provide a smart battery device that includes a microprocessor with RAM memory, and comprises means for retaining RAM memory contents when the device is in sleep mode.

Yet still a further object of the invention is to provide a smart battery device that comprises short circuit protection means for preserving RAM memory contents when battery is temporarily short circuited.

Another object of the instant invention is to provide a smart battery device that includes a ROM memory that is manufactured by a process that facilitates the programming of ROM in an upper or respectively later produced layers.

Yet furthermore, an object of the instant invention is to provide a smart battery device that includes a ROM memory device whereby the programming of ROM is effected in a metal mask.

Furthermore, an object of the instant invention is to provide a smart battery device having incorporated therein an error treatment algorithm, for taking into account measurement errors, interpolation from look-up tables, etc., wherein the errors are considered to be a function of time. It is contemplated that if a total error is larger than a predetermined value, certain operating modes are disabled, and, in particular, variables are substituted by default values to result in a smaller error. In case of displayed information, such as LED battery pack display, the error can be additionally taken into account, for e.g., a quantity of: capacity—total error in capacity, may be displayed. If an error that is too big is produced, the end criterion for determining end of charge condition may be changed, for e.g., using a change in battery voltage instead of the error influenced criterion.

These and other objects of the present invention are attained with a smart battery device which provides electrical power and which reports predefined battery parameters to an external device having a power management system, wherein the battery includes:

(a) at least one rechargeable cell connected to a pair of terminals to provide electrical power to an external device during a discharge mode and to receive electrical power during a charge mode, as provided or determined by said remote device, (b) a data bus for reporting predefined battery identification and charge parameters to the external device, (c) an analog means for generating analog signals representative of battery voltage and current at said terminals, and an analog signal representative of battery temperature at said cell, (d) a hybrid integrated circuit (IC) having a microprocessor for receiving the analog signals and converting them to digital signals representative of battery voltage, current and temperature, and calculating actual charge parameters over time from said digital signals, said calculations including one calculation according to the following algorithm:

$$CAP_{rem} = CAP_{FC} - \Sigma I_d \Delta t_d - \Sigma I_s \Delta t_s + \Sigma \epsilon_c I_c \Delta t_c$$

wherein $\epsilon_c$ is a function of battery current and temperature; and $I_s$ is a function of battery temperature and $CAP_{FC}$, (e) a data memory defined within said hybrid IC for storing said predefined battery identification and actual charge parameters, even when nominally fully discharged, said charge parameters including at least full charge capacity and remaining capacity, (f) a bus controller defined within said hybrid IC for sending battery messages to said remote device over said data bus, said messages including said predefined battery identification and said actual charge parameters.

Superimposed on this equation is reset logic, to be explained below, that self corrects the value of $CAP_{FC}$ with a capacity calculation at each full charge (EOC) and each end of full discharge.

Further benefits and advantages of the invention will become apparent from a consideration of the following detailed description given with reference to the accompanying drawings, which specify and illustrate preferred embodiments of the invention.

BRIEF DESCRIPTION OF THE DRAWINGS

FIG. 8(a) illustrates the timing of the operating cycles under normal and sample mode operating conditions.

FIG. 8(b) illustrates the approximate time durations for the various measurements per operating cycle.

FIG. 12 is a flow diagram illustrating the IUT (current, voltage, and temperature) calculation program 200.

FIGS. 13(a) and 13(b) are flow diagrams 1illustrating the sequential processes 151 programmed in the microprocessor for calculating the current capacity and the amount of battery self discharge for the smart battery of the instant invention.

FIG. 14(d) illustrates a flow diagram of the learn number of cells program 700.

DETAILED DESCRIPTION OF THE PREFERRED EMBODIMENT

The smart battery device of the present invention is intended for use with an intelligent host device such as a portable computer, portable video camera or cellular telephone having a system management bus and a smart charger, or an intelligent host device having a system power manager that can receive and send data over a system management bus.

Figure 1:
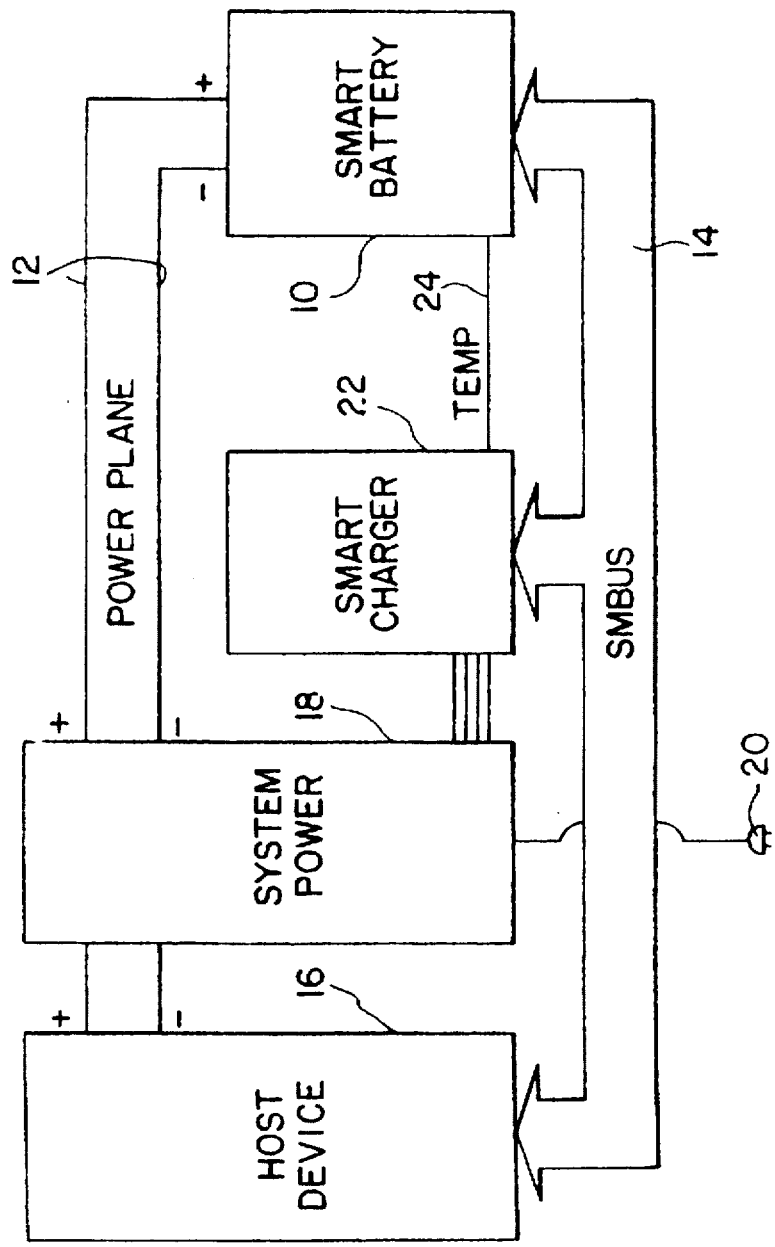
FIG. 1 is a diagrammatic block diagram of a smart battery device connected to a host computer and battery charging device.

A representative example of such a system is illustrated in FIG. 1, wherein the smart battery 10 is connected to a power plane 12 to supply and receive electrical energy over the power plane, and a system management bus 14, which is a bi-directional modified I2C data bus (communication interface) that communicates with a host device 16 which may be a portable computer. The host device 16 may be powered by the smart battery 10, or by the system power supply 18 and a conventional AC source 20. A system power supply or power management system also communicates with a smart charger 22 which may be used to determine the rate and duration of charge sent to the smart battery by the power supply. Smart charger 22 also communicates with the system management bus 14, and may receive a temperature signal representative of battery cell temperature on a separate line 24. A detailed functional description of the system management bus 14 (bi-directional modified I2C data bus) can be found in the Intel\Duracell System Management Bus Specification, Rev 0.95, (April 1994).

The power management system 18 may supply or draw power to/from the smart battery 10 over power plane 12, depending upon the state of charge in smart battery 10, and depending upon the presence or absence of power at AC source 20.

The smart charger 22 may periodically poll the smart battery 10 for charge characteristics, and adjust output to match a smart battery charge request. Optionally, and if selected by the user of the host device, the smart charger 22 can override the smart battery's charge rate request and charge the smart battery at a higher or quick charge rate. The user of the host device does not necessarily need to override the smart battery's request. As will be explained in greater detail below, the smart battery may periodically broadcast the desired charging current, or the smart charger 22 polls the smart battery for a charging current. The host or the charger need not comply with the smart battery's request and can provide a greater or lesser amount of power than requested.

The host device 16 may communicate with the smart battery over the system management bus 14 and request information from the battery for use in the system power management scheme, thereby providing the user of the host device with information about the battery's present state and capabilities. The host device 16 will also receive notice of critical events, including alarm conditions, remaining capacity below a user set threshold value, a remaining run time below a user set threshold value, or an end of discharge signal. The alarm conditions include but are not limited to overcharging, overtemperature, a remaining charge capacity below a predetermined or user set capacity, or, a run time below a predetermined or user set run time remaining.

As will be hereinafter explained in greater detail, the smart battery can report out an instantaneous current value being drawn from the battery, current values averaged over predetermined time intervals, present temperature and present voltage.

The smart battery may also report out a number of battery status indicators, indicating whether or not the battery is charging or discharging, that charging is complete, or, that the battery is fully discharged.

In addition, the algorithm can provide calculated values including run time remaining at a present current usage, a run time remaining at an average current use, a run time remaining at optimal current use, and a predicted run time remaining at a host device selected current level (discharge rate).

The smart battery device 10 is also provided with a read-only memory (ROM) that is manufactured to contain a set of predefined battery identification parameters which may include manufacturer data, cell chemistry, design capacity, design voltage, and a unique device identification number. The predefined battery identification parameters are available, for either the host device or the smart charger, to assist them in the selection of optimal usage and charge parameters for the smart battery.

The smart battery is also capable of recommending a desired charge current, reporting a time remaining to full charge, a battery capacity available at full charge, and the number of times the battery has been charged or discharged.

The smart battery of the present invention utilizes a hybrid integrated chip (IC) containing an embedded microprocessor and a novel analog to digital converter which receives analog signals from the battery and converts them to digital signals representative of battery voltage, current and temperature. The smart battery microprocessor then calculates actual charge parameters over time from these digital signals according to a predetermined algorithm in which $CAP_{rem}$ is the remaining capacity of the battery which is continuously assigned a new value to reflect adjustments for effective charge, discharge, and self discharge.

The charge delivered to the battery is measured, and adjusted by an efficiency factor which is a function of current, temperature, and relative state of charge. It should be mentioned that the remaining capacity, $CAP_{rem}$, and the relative state of charge, SOC, represent the same thing (remaining battery capacity) and differ in that relative state of charge is indicated as a percentage of the last full charge capacity. The charge efficiency is a value determined as a function of the above variables and may be derived from a look up table, hereinafter described with respect to FIG. 22(c), or calculated from a formula which provides a stepwise approximation of charge efficiency behavior, depending upon current, temperature and state of charge. It is understood that the charge efficiency factor can be obtained from a response equation or interpolation between several different values stored in memory.

Likewise, the remaining battery capacity $CAP_{rem}$ is decremented by the measured discharge rate over time. A predictive model of residual capacities determines expected $CAP_{rem}$ for a present current and temperature. This predictive model may also estimate when the battery voltage will drop to a predetermined cut-off voltage for the present rate of discharge. This residual capacity model may be calculated from a formula or obtained from a look up table, which includes values of residual capacities as a function of discharge current and temperature.

Finally, $CAP_{rem}$ is also adjusted by subtracting self discharge. Self discharge is calculated as a function of temperature and state of charge, and is always subtracted from $CAP_{rem}$, regardless of whether the battery is discharging or being charged. Self discharge may be derived from a look up table of empirical models of identical cell chemistry that predict self discharge as a function of temperature and state of charge, or may be calculated by the microprocessor.

As will be hereinafter explained in greater detail, $CAP_{FC}$ is a learned value which is self correcting because of reset logic incorporated in the capacity algorithm. The capacity algorithm takes actions on four types of end of charge (EOC) signals, including a negative voltage slope at a full charge voltage, a temperature rise that exceeds a predetermined rate, or a calculated state of charge that is equivalent to a value of 100% to 150% of the previous $CAP_{FC}$ value, if an optimal charging current has been used, or a high temperature limit value. When one of the first three of the above four types of conditions is encountered, the reset logic resets $CAP_{rem}$ to the previous $CAP_{FC}$ value, sets a fully charged status flag, and, signals the host device and charger to terminate charge. If the high temperature limit is reached, only a signal to terminate charge is invoked.

The charge algorithm terminates its integration of the present discharge state when it reacts to an end of discharge (EOD) signal between 0.9 volts/cell and 1.1 volts/cell and preferably 1.02 volts per cell. At that point it resets $CAP_{rem}$ to a new learned value of residual capacity, as determined from the integration of the discharge current, as a function of discharge current and temperature.

As will be hereinafter explained in greater detail, the reset logic will reset $CAP_{FC}$ as a function of which EOD signal was acted on. Thus a new $CAP_{FC}$ value for the smart battery's actual capacity is learned after each full discharge cycle, as a function of the last fully integrated battery discharge cycle. The smart battery 10 of the present invention is thus able to self correct $CAP_{FC}$ within one full cycle to readjust its capacity at each EOC and EOD, and effectively relearn full battery capacity within a single cycle, even if all prior battery history has been extinguished by virtue of a catastrophic memory failure. The smart battery of the present invention is therefore able to accurately predict actual capacity, and typically is able to correctly predict the remaining run time to empty within a few minutes for a 2400 maH battery.

Figure 2A:
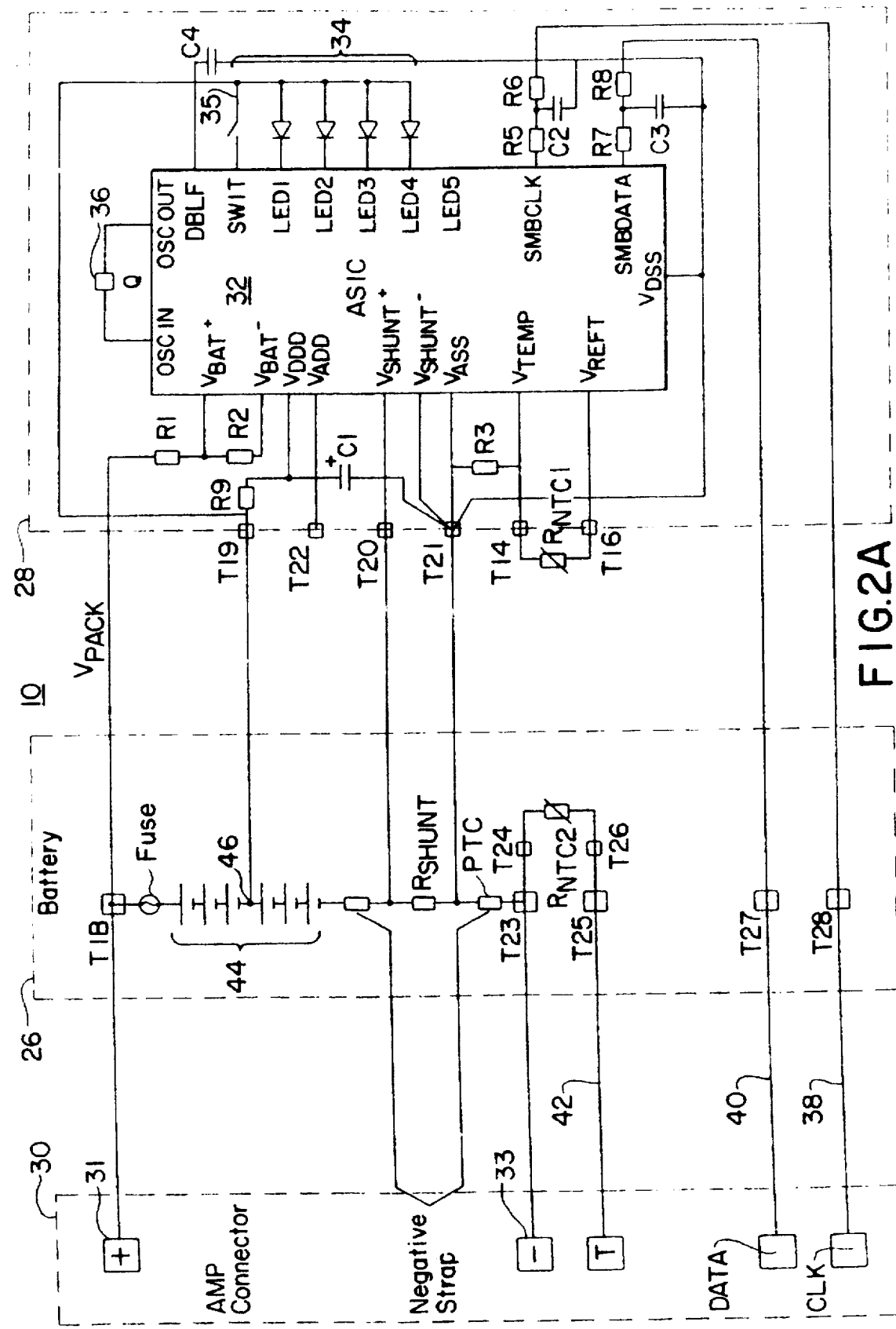
FIG. 2(a) is a simplified block diagram of the smart battery device and connector, including a pinout diagram of an Application Specific Integrated Circuit (hybrid IC) used in the present invention.

Smart battery 10 of the present invention is more fully illustrated in FIG. 2(a) which is a simplified block diagram of the smart battery, an advanced design multi-pin connector, and a battery module 28 which includes a pinout diagram of the hybrid ASIC 32 used in the present invention. As illustrated in FIG. 2(a), the smart battery device 10 includes a plurality of rechargeable cells generally indicated at 26 which may be Nickel Metal Hydride (NiMH) or Nickel Cadmium (NiCad) cells.

For the purposes of an illustrative but not limiting example, in the following specification, 6 NiMH cells having a nominal 2400 maH capacity, will be assumed. Such an arrangement of cells is particularly appropriate for powering a portable computer.

A suitable advanced design multi-pin battery connector 30 is used to connect the smart battery to a host device 16 or power supply 18, as previously described with respect to FIG. 1. The multi-pin connector 30 includes a positive power supply terminal 31 which is connected to the positive terminal of the first cell, and a negative power supply terminal 33 which is connected to the negative terminal of the last cell. A plurality of rechargeable cells may be connected in series therebetween as illustrated in FIG. 2(a).

Figure 2B:
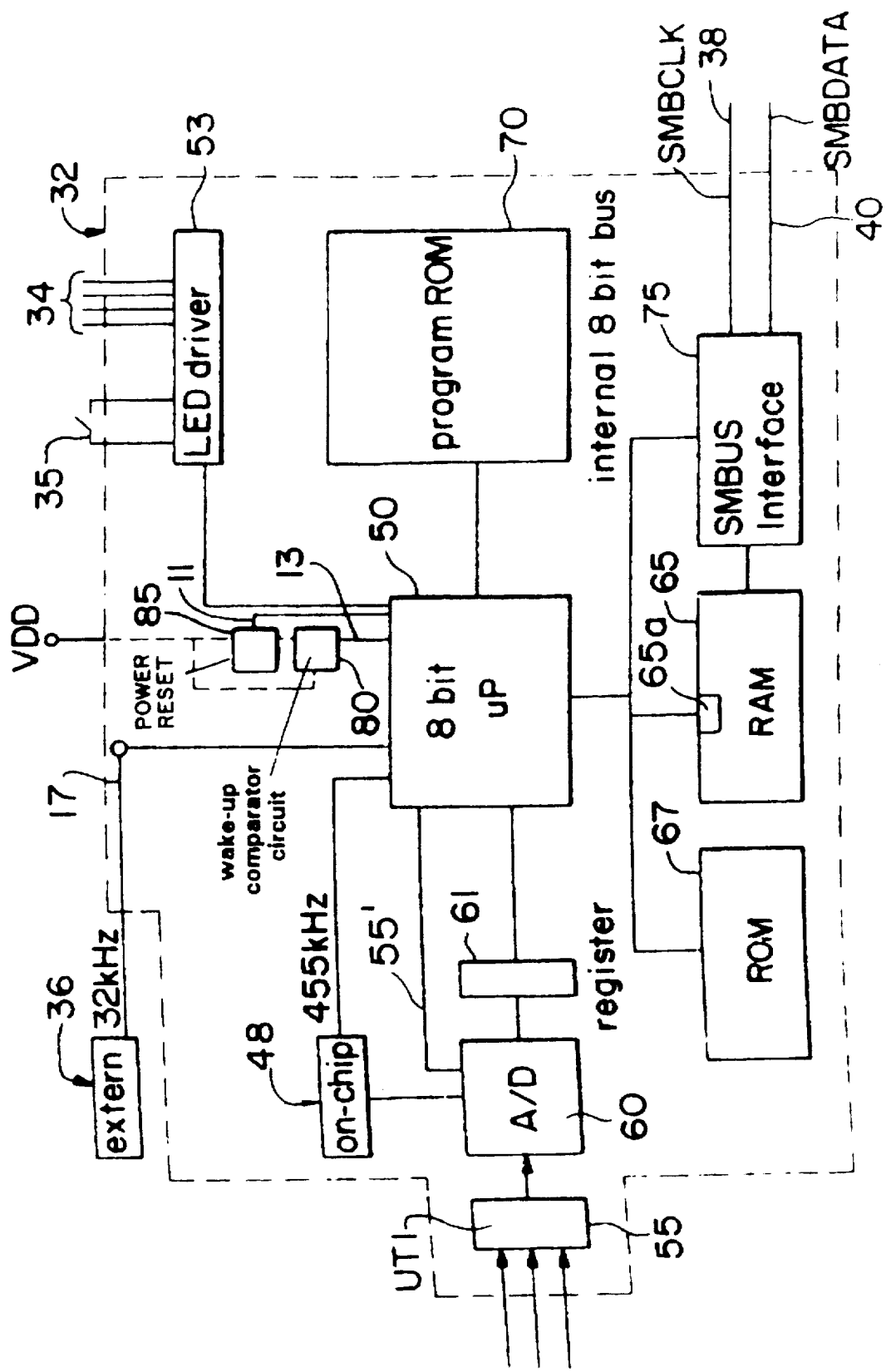
FIG. 2(b) illustrates a simplified block diagram of the hybrid IC 32 that includes the microcontroller of the smart battery device of the instant invention.

The smart battery module 28 includes a hybrid IC 32 containing a microprocessor 50 (FIG. 2(b)) and a plurality of sensor means for generating analog signals representative of battery voltage, current and temperature. The module also includes a series of four (4) LEDS 34 driven by an LED drive circuit 53 and a switch 35 which may be manually actuated by an end user to determine the state of charge in the battery even when the battery module has been removed from the host device 16. The LEDS 34 may be used to represent a relative state of charge (SOC) in a logic scheme as follows: if the state of charge is greater than 75% (or less than 100%) then all 4 LEDS are illuminated; if the SOC is from 50% to 75%, then 3 LEDS are illuminated; if SOC is from 25% to 50%, then 2 LEDS are illuminated; if SOC is from 10% to 25%, then 1 LED is illuminated, and if SOC is less than 10%, a single LED is flashing. As mentioned above, relative SOC is remaining capacity relative to last full capacity.

As shown in FIGS. 2(a) and 2(b), the hybrid ASIC 32 also includes an external crystal 36 operating at a fixed frequency which is used as a time base for integration of battery current over time, and to ensure stable start up after a prolonged standby period when power is reapplied to the smart battery 10. The smart battery of the present invention utilizes two separate oscillators, a low power RC oscillator 48 formed within the hybrid IC 32 and used as an operating clock for the hybrid IC and the A/D converter 60 therein, and, the external crystal 36. As will be hereinafter described in greater detail, the external crystal 36 is used to restart the measurement period after each predetermined interval to provide for accurate measurements and integration of battery conditions, regardless of battery temperature, which can adversely affect the accuracy of the internal oscillator. The frequency value of external crystal 36 may range from 10 kHz to 66 kHz, preferably at 32 kHz and the frequency value of oscillator 48 may range from 450 kHz to 460 kHz.

The hybrid IC 32 includes a MIKRON GmbH low cost, high performance, CMOS 8 bit microcontroller (μP) 50 with an advanced RISC architecture. A reduced set of 32 instructions that are all single cycle instructions (except for program branches which are two cycles), and a Harvard architecture scheme achieves a high level of performance with minimal power drain. The microprocessor operates at a clock input anywhere from DC to 10 MHz with 12 bit wide instructions and 8 bit wide data path. A free programmable Counter/Timer circuitry is provided as well as a free programmable Watchdogtimer. Additionally, the microprocessor is addressable in direct, indirect, and relative addressing modes. The microprocessor 50 is commercially available from Mikron Gmbh, located at Breslauer Straβe 1-3, D-85386, Eching, Germany, and is available in the U.S.A. through MICROCHIP Technology, Inc., Chandler, U.S.A.

The hybrid IC 32 also includes a plurality of analog circuits which are used, in combination with external analog sensors, to generate digital signals representative of battery voltage, current and temperature as will be hereinafter explained.

For example, as shown in FIG. 2(a) battery voltage is obtained from a voltage divider circuit which includes resistors R1 and R2 which are internally switched by a NMOS transistor within the hybrid IC 32 to provide voltage measurement during a small portion of each measurement interval, thereby minimizing current drain on the battery cells 26.

The measurement of battery temperature is accomplished with an NTC-thermistor, illustrated as $R_{NTC1}$ in FIG. 2(a), which varies resistance as its temperature varies. A resistor R3 is connected in series to form a voltage divider circuit between $V_{ASS}$, (negative analog power supply voltage) $V_{TEMP}$, (the temperature voltage input) and $V_{REFT}$, which is a reference voltage applied to the thermistor/resistor string by the hybrid ASIC 32 at pin $V_{REFT}$. The temperature voltage input is measured at $V_{TEMP}$ according to the following formula:

$$V_{TEMP} = \frac{R3}{R3 + R_{NTC1}} \times V_{REFT}$$

wherein the NTC1 value may be 10 kohms at 25° C. and varies with temperature. If desired, a look-up table with a plurality of temperature values and a plurality of $V_{TEMP}$ values may be defined to calculate the battery temperature, and between these values, the temperature is linearly interpolated by the microprocessor within IC 32.

The measurement of battery current is measured through a shunt resistor, illustrated in FIG. 2(a) as $R_{shunt}$, that is connected in series with the battery cells and negative terminal 33 of cell pack 26. The shunt resistor is of small value, but may range anywhere from 1 mohm to 200 mohms depending on the number of cells and expected usage of the battery. The voltage drop across the shunt is sensed between $V_{SHUNT+}$, the shunt resistor positive input pin of ASIC 32, and $V_{ASS}$, the negative analog power supply voltage.

As shown in FIG. 2(b), whenever the analog signals representing battery voltage, current, and temperature are obtained, they are input into an ASIC multiplexor or switching network 55 which enables only one analog signal at a time to be input to the A/D converter 60 for digital conversion. The switching network acts in conjunction with digital logic circuitry for informing the A/D converter, via line 55', shown in FIG. 2(b), of the amount of integration cycles to perform depending upon the type of measurement to be converted. For instance, more integration cycles are needed when making a current measurement conversion to ensure a higher bit resolution as compared to when a voltage or temperature measurement is being converted, as will be explained in further detail below with respect to FIG. 8(a).

Figure 4:
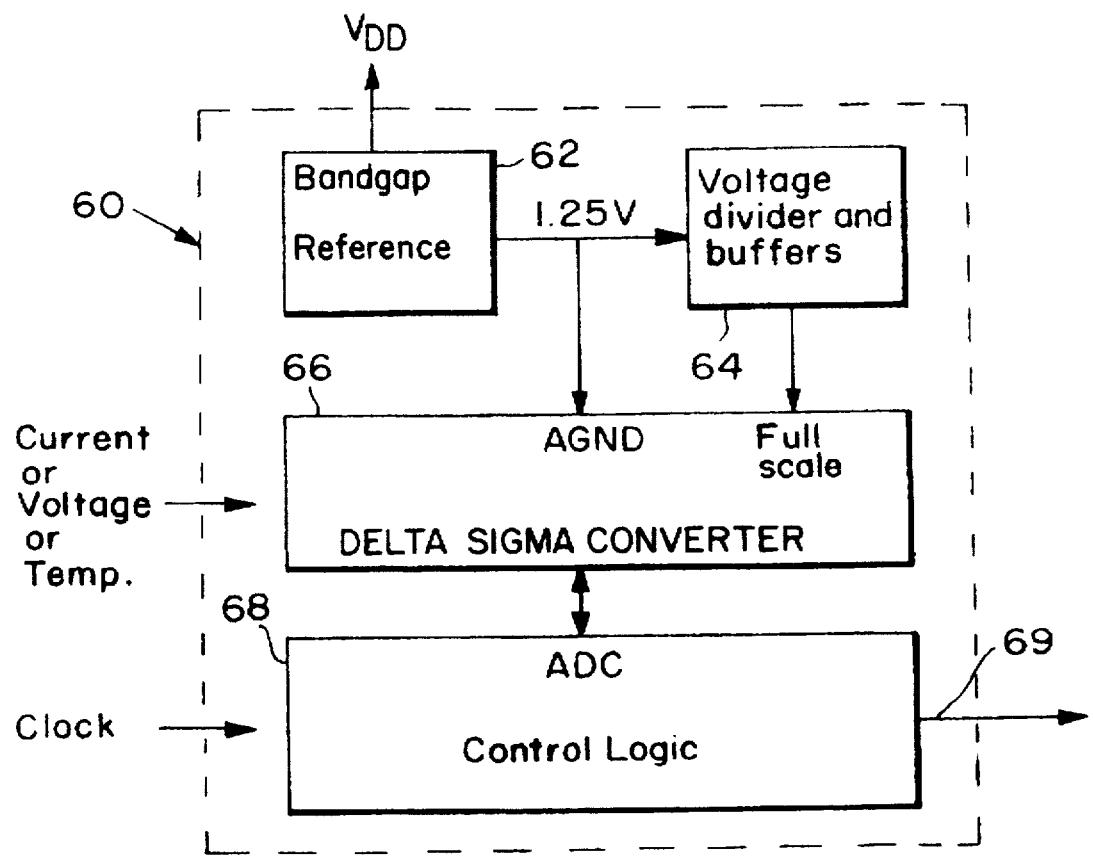
FIG. 4 illustrates a general schematic diagram of the A/D converter 60.

A general schematic diagram of the A/D converter 60 is shown in FIG. 4. In the preferred embodiment, the A/D converter 60 is a bipolar, high resolution, incremental sigma-delta converter and consists of three parts: a bandgap reference circuit 62 which provides a preset analog voltage which is used as an analog ground for the A/D; a voltage divider network 64 which divides the present voltage to the analog voltages which are used as the full-scale voltage for the A/D; and, a sigma delta circuit 66 for converting the analog signal to a digital word output at line 69. A/D control circuit 68 having a clock input from the IC oscillator, provides the control for the sigma delta converter which has a different degree of resolution depending on the type of measurement. For instance, in one embodiment of the invention, the A/D converter was configured as having a resolution of 13 bits and a conversion time ranging from 300 to 400 msec for current measurements, and, was configured as having a resolution of 10 bits and a conversion time ranging from 30 to 60 msec for voltage and temperature measurements. The timing diagram for the voltage, current, and temperature measurements in each operating cycle is illustrated as 58a in the timing of operating cycles diagram of FIG. 8(a), as explained below.

In one embodiment of the invention, the voltage divider circuit 64 of the A/D converter divides the preset bandgap reference voltage into the following full scale voltages: a 150 mV signal used as the full scale voltage for the battery current measurement; 150 mV, 250 mV, or 350 mV signals used as the full-scale voltage for the battery pack voltage measurement and dependent upon the number of battery cells; and 150 mV used as the full-scale voltage for the battery temperature measurement. These values are illustrative and may vary as battery design varies.

The A/D converter of the smart battery device utilizes a sigma-delta converter circuit 66 as explained above in view of FIGS. 4 and 6. Details of the sigma-delta converter circuit 66 capable of bipolar conversion are explained hereinbelow in view of FIGS. 5(a),5(b) and FIGS. 6 and 7. FIG. 6 particularly illustrates a switching capacitor network for receiving positive and negative voltage values, indicated as $V_{IN}$ in FIG. 6 for input into an integrator circuit 88 and comparator circuit 89 for output into control and logic circuit 68. In the reference, Jacques Robert et al., (1987) "A 16-bit Low-Voltage CMOS A/D Converter", *IEEE Journal of Solid-State Circuits*, Vol. sc-22, No. 2, 157–159, an incremental (integrating) sigma-delta converter implementing 4-µm CMOS, switched capacitor technology similar to that implemented in the A/D converter of the smart battery device is disclosed. What is described in the reference is a simplified, unipolar A/D converter that is largely insensitive to variations in clock frequency and clock waveforms due to the fact that all signals are represented by charges, rather than currents, as in the switched capacitor integrator that forms the core of the converter.

In the prior art, to measure positive and negative input voltages, a negative power supply is necessary in addition to the positive voltage supply. Thus, where it is desired to measure negative voltages (or currents) such as smart battery discharging current, external components (such as inverters) and circuitry that consume extra power are required, and the prospect of utilizing such circuitry for the low power application such as needed in the smart battery device of the instant invention, is diminished. Instead, to overcome this drawback, the A/D converter 60 of the instant invention does not utilize a negative voltage power supply, but makes use of an available on-chip A/D bandgap reference voltage "AGND" to be used as a virtual ground. The concept of utilizing a "virtual ground" is based on the fact that a voltage stored on a capacitor can be transferred to another d.c. voltage reference point using analog switches with virtually no loss of charge.

Figure 5A:
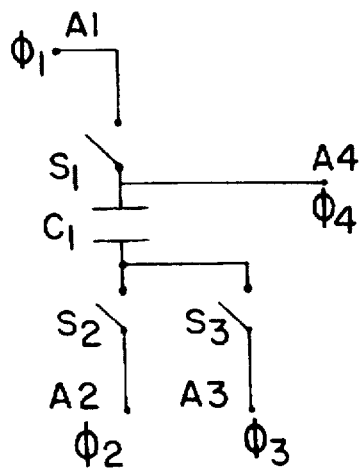
FIG. 5(a) illustrates a schematic sketch of dc voltage shifting circuit arrangement.
Figure 6:
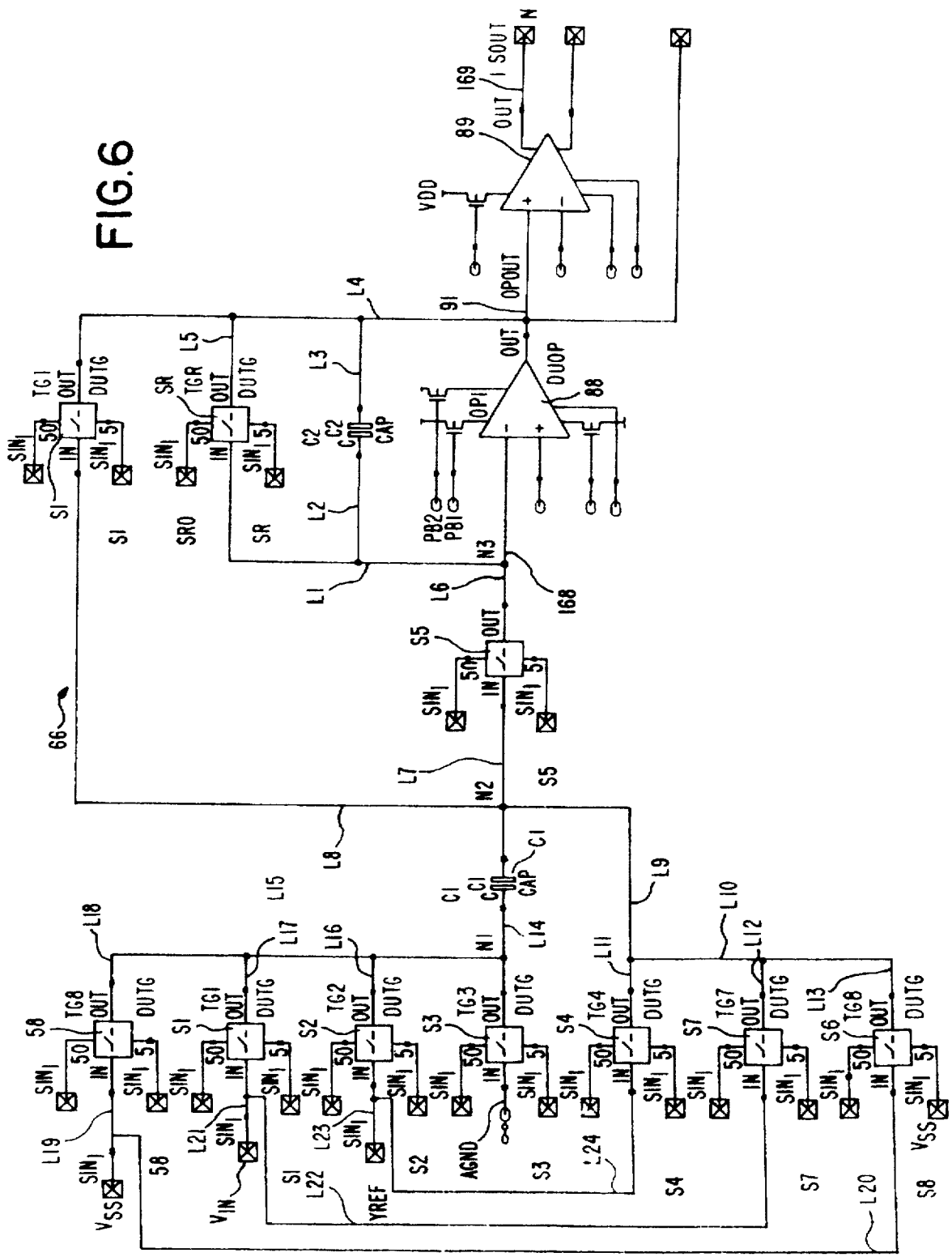
FIG. 6 is a schematic sketch of the circuit arrangement in the A/D converter 60.

In FIG. 5(a) there is represented a first embodiment of the dc voltage shifting circuit arrangement, consisting of three switches S1 through S3, and four connectors A1 through A4 and a capacitor C1 (with the capacitance C1). The connectors A1, through respectively A4 are at the potentials $\phi_1$ through respectively $\phi_4$. As shown in FIG. 5(a), the switch S1, and the combination of parallel-connected switches S2 and S3 are connected to opposite terminals of the capacitor C1.

In the following there is described the operation of the inventive circuit arrangement. At the beginning, the switches S1 and S2 are closed and the switch S3 is open. The capacitor charges itself up due to the voltage differential $\phi_1 - \phi_2$ and stores a charge $C1 \times (\phi_1 - \phi_2)$.

In the next step of the inventive process, the switches S1 and S2 are opened and one pole of the capacitor is connected through switch S3 with a potential $\phi_3$. Present at the capacitor C1 is now a voltage $\phi_3+(\phi_1-\phi_2)$ which can be tapped off through connection with the connectors A3 and A4 which lie on the potentials $\phi_3$ and $\phi_4$.

Figure 5B:
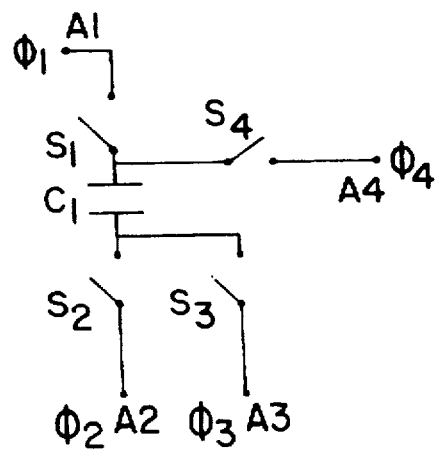
FIG. 5(b) illustrates a second embodiment of the dc voltage shifting circuit arrangement.

In FIG. 5(b) there is now represented a further embodiment of the dc voltage shifting circuit whereby an additional switch S4 is provided which, when open, prevents the presence of a potential $\phi_1$ at the tapping off of the voltage $\phi_3+(\phi_1-\phi_2)$ present at the connectors A3 and A4, when switch S1 is closed.

In FIG. 6 there is illustrated the schematic circuit diagram of the inventive circuit arrangement in a switched capacitor A/D converter. The A/D converter 66 possesses an operational amplifier 88 which is utilized as an integrator, and an operational amplifier 89 which is utilized as a comparator. The non-inverted input of the comparator 89 by means of the line 91 stands in connection with the output of the integrator 88. The inverted input of the comparator 89 and the non-inverted input of the integrator 88, are connected with a reference potential AGND, (analog ground=1.25 volt). The output of the comparator 89 is "high", in the event that the output voltage of the integrator 88 is higher than the reference voltage AGND and "low" in the event that the output voltage of the integrator 88 is lower than the reference voltage AGND. By means of the lines L1, L2, L3 and L4, the integrator 88 or, in essence, the inverted input and the output of integrator 88 have connected in parallel therewith a capacitor C2 with a capacitance C2. The capacitor C2 has a switch SR connected in parallel therewith through lines L1 and L5, which can effectuate a discharge of the capacitor C2. Through a line L6, the inverted input of the integrator 88 stands in connection, by means of a switch S5 and a line L7, with a capacitor C1 having the capacitance C1. A line L8 connects the line L7 through a switch SI and the line L4 with the output of the integrator 88. The line L9 connects the pole of the capacitor C1 facing towards the integrator 88 in FIG. 6 with a line L10, which stands in connection through the lines L11, L12 and respectively L13, with the switches S4, S7 and, respectively S6. Connected to the other pole of the capacitor C1 is a line L14, which is connected through the switch S3 with the reference voltage AGND=1.25 volt. A line L15 stands in connection with line L14 and connects through the lines L16, L17, and respectively L18, the pole of the capacitor C1, which faces away from the integrator 88 in FIG. 6, with the switches S2, S1, and respectively, S8. The internal mass of the chips $V_{SS}=0$ volt stands through the lines L19 and, respectively, L20, in connection with the switches S8, respectively, S6. In this manner, through suitable opening and closing of the switches S8 and S6, the voltage $V_{SS}$ can be applied to both poles of the capacitor C1. The input voltage $V_{IN}$ which is to be digitized stands in connection with the switches S1 and, respectively, S7, through lines L21 and, respectively, L22. In this manner, through suitable opening and closing of the switches S1 and S7, the input voltage $V_{IN}$ can be applied to either of the two poles of the capacitor C1. The reference voltage $V_{REF}$ which determines the resolution of the A/D converter is connected through lines L23 and, respectively, L24 with the switch S2 and, respectively, S4. In this manner, the reference voltage $V_{REF}$, which, for example, consists of 150 milli-volt, can be applied to one of the two poles of the capacitor C1. The switches S1, . . . .S8, SR and SI are preferably CMOS switches, especially CMOS transmission gates. The connection of the input voltage $V_{IN}$, the reference voltage $V_{REF}$ and the mass $V_{SS}$ with the input capacitor C1 of the A/D converter is known in the technology. Inventively there is connected through the switch S3 a reference voltage AGND=1.25 volt ($\neq V_{SS}=0$ volt) to the input capacitor C1. Similarly, through the inventive circuit, that $V_{IN}$, $V_{REF}$ and AGND can be applied to both sides of the input capacitor C1, which presently causes a charging up at different polarity of the capacitor C1.

Figure 7:
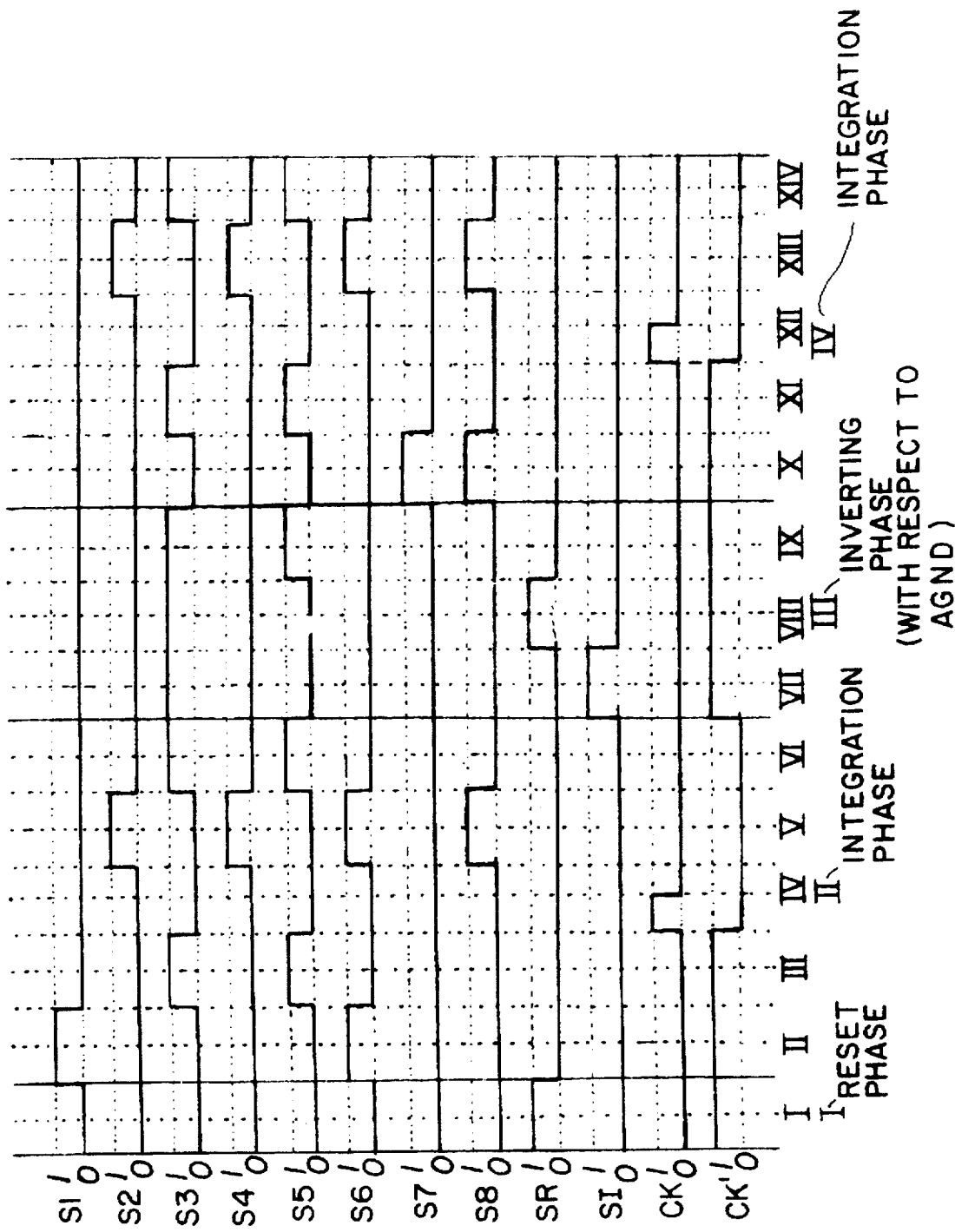
FIG. 7 is a phase diagram in the operation of the A/D converter pursuant to FIG. 6.

In FIG. 7, there is illustrated the operation of the A/D converter in a phase diagram.

Thereby, S1 through S8, SR and SI designate the switches of the A/D converter 66 pursuant to FIG. 6, and CK is the pulse signal of the comparator 89 in FIG. 7. CK' represents a further tapped-off pulse signal.

In the diagram, the switch conditions fluctuate between 0 and 1, whereby 1 signifies that the switch is closed, whereas 0 stands for the opened switch. The operation of the A/D converter can be divided into four phases which are designated with I, II, III and IV whereby I designates a RESET or resetting phase; II an integration phase, III and inverting phase and IV an integration phase of the input voltage of reverse polarity or sign. The cycle is more finely subdivided into steps i,—xiv. As shown as step i in FIG. 7, during the reset phase I, only the switch SR is closed, whereas all other switches are opened. This causes a discharge of the capacitor C2. At the beginning of phase II, as indicated as step ii, in FIG. 7 the switches S1 and S6 are closed, whereas all remaining switches remain further open. This causes a charging up of the capacitor to a charge $\Delta Q=C1\times(V_{IN}-V_{SS})=C1\times V_{IN}$. In step iii, the switches S3 and S5 are closed, whereas all other switches remain open. One pole of the capacitor is now set to the potential AGND, whereas the other pole of the capacitor C1, through closing of the switch S5, stands in connection with the capacitor C2. There now takes place a charge transfer from the capacitor C1 to the capacitor C2. Inasmuch as the integrator 88 resultingly causes the two input potentials to be equalized, there is present at the output 91 of the integrator 88 the output voltage $V_{OUT}$ equal $-(C1/C2)\times V_{IN}+AGND$. In step iv all switches are opened and the comparator pulse CK is 1, meaning, the comparator 89 carries out a comparison between $V_{OUT}$ and AGND. Upon the result of this comparison there now depends the further cycle. The representation of the switch conditions in step v must be understood in the following manner: In step v the switches S2 through S8 are not closed, but the switches S2 and S6 are closed, and S1, S3, S4, S5, S7, SR and SI are open, in the event that the output of the comparator is 0, in effect "low", while the switches S4 and S8 are closed and S1, S2, S3, S5, S6, S7, SR and SI are open when the output of the comparator is 1, meaning, "high", and in other instances remain open. When the output of the comparator is 0, meaning the output voltage $V_{OUT}$ is lower than AGND, then the switches S2 and S6 are closed. At the capacitor C1 there are now present $V_{REF}$ and $V_{SS}$. In the instance in which the output of the comparator is 1, meaning, $V_{OUT}$ is higher than AGND, then the switches S4 and S8 are closed, whereby similarly $V_{SS}$ and $V_{REF}$ are present at the two poles of the capacitor C1, but with the reverse sign or polarity than in the instance in which the output of the comparator is 0. In step v, the switches S1, SR and SI are opened, and in step vi, the switches S3 and S5 are closed (compare step iii) which causes the capacitors C1 and C2 to be interconnected. As in step iii, voltage AGND is applied to one pole of the capacitor C1. There again, in turn takes place a charge transfer between the capacitors C1 and C2, as result of which a voltage $-(C1/C2)\times V_{REF}+AGND$ is added to or, respectively, subtracted from that of the output voltage of the integrator 88, in accordance with the result of the comparison by the comparator in step iv. During the steps i through vi of phase II there is processed an input voltage which is phase shifted with respect to AGND, with a reference voltage which is shifted relative to AGND. Similarly, at the non-inverted input of the integrator 88 and the inverted input of the comparator 89 there lies AGND, which causes that the output voltage is referenced to AGND and causes a comparison by the comparator 89 not with $V_{SS}=0$ voltage, but with AGND=1.25 volt.

In the following there is now discussed phase III consisting of steps vii to ix. In this phase, a sign or polarity reversal is implemented for the output voltage $V_{OUT}$ of the integrator 88 with reference to AGND. During the entire phase III the switch S3 is closed. The closure of the switch S3 during the phase III causes the voltage AGND to be applied to one pole of the capacitor C1, as a result of which the voltage $V_{OUT}$ is also inverted with regard to AGND and not with regard to $V_{SS}=0$, as in the known A/D converters. In step vii there is now closed the switch S1, whereas all remaining switches are open, except switch S3. This causes that the voltage $V_{OUT}$ is temporarily in the capacitor C1, such that in step viii all switches are opened except switch SR. The switch SR is in effect closed, which causes a discharge of the capacitor C2. In the step ix the switch S5 is closed additionally to switch S3, while all remaining switches are opened. This causes that the negative voltage which is phase shifted at AGND is present at the output of the integrator 88. The negative sign is obtained, as previously through the charge transfer from the capacitor C1 to the capacitor C2. In step x of Phase IV, the switches S7 and S8 are closed, whereas all remaining switches are opened. Compared with the step ii the input voltage $V_{IN}$ is present with a reverse polarity at the capacitor C1. This causes a change in the sign of the integration of the input voltage, which is also well recognizable in FIG. 6 of the above mentioned publication of Jacques Robert et al. The steps xi through xiv correspond with the steps iii through vi, meaning, there is implemented an integration of the input voltage (only due to step x with a reverse sign of $V_{IN}$), and in accordance with the result from the comparator 89 in step xii $V_{REF}$ is added or, respectively, subtracted after the integration (in case C1=C2). For a 14-bit A/D-converter, after implementing step i there is carried out phase II ($2^{14}-2$ (for the phases I, and III)]: 2=8191 times), as well as phase IV. The output of the comparator is connected to a up/down counter, which each time, in accordance as to whether $V_{REF}$ is added or subtracted, increases or lowers its count condition by 1. The result of the counter is then a 14-bit representation of the ratio of $V_{IN}$ to $V_{REF}$. The phases III and IV are necessary since through the integration with reverse signs of $V_{IN}$ offset errors encountered in, for example the operational amplifiers, are reported or, respectively eliminated.

The multi-pin connector 30 includes two pins for the system management bus interface 75, which include a serial clock I/O line 38 and a bidirectional serial data I/O line 40. These lines are connected to the SMBCLK and SMBD data pins, respectively, of the hybrid IC 32. As explained generally above, and, in greater detail below, the smart battery module 28 communicates with the host device 16 and the smart charger 22 over the system management bus and data line 40 to communicate both stored battery parameters and calculated battery parameters.

The smart battery 10 also includes a separate thermistor $R_{NTC2}$ which is connected across the negative terminal of multi-pin connector 30 and a temperature or thermistor line 42. Thermistor $R_{NTC2}$ may be used independently by the smart charger 22 to determine battery temperature, in a manner similar to that previously described with respect to $R_{NTC1}$.

A positive digital power supply voltage is obtained from the plurality of rechargeable battery cells 44, and supplied to the hybrid IC through pin $V_{DD}$ as the positive power supply voltage for the chip. It should be understood that the supply voltage for the hybrid IC does not necessarily have to be obtained at the battery midpoint 46, but should be obtained at a point from the battery cells in order to receive a voltage of approximately 3 to 4.8 volts, i.e., the equivalent voltage of three (3) cells. As will be hereinafter explained in greater detail, the use of a battery midpoint for the positive voltage supply enables the hybrid IC to remain powered even when the battery is accidently shorted and removed from terminals 31–33, and enables the A/D converter 60 to determine whether the battery is discharging or being charged as will hereinafter be explained in greater detail. Suitable fuse elements (one of which is shown in FIG. 2(a)), and a positive temperature coefficient (PTC) elements (one of which is shown in FIG. 2(a)), are provided in series with the battery pack cells to protect the battery from very high current and excessive temperatures caused by a temporary short circuit across the battery terminals or other thermal event.

As shown in FIG. 2(b), the hybrid IC 32 further includes RAM memory 65 which can store up to 128 8-bit registers for communication of calculated battery parameters, and a ROM memory 67 for storing look-up table values utilized in the battery capacity calculation algorithm (explained in detail below). The exact amount of RAM, ROM, and program ROM memory is a design choice, and these values change as the ratio between calculated and preset parameters vary.

As shown in FIG. 2(a), the addition of capacitor C4 acts as a buffer to maintain the integrity of the RAM memory contents in the case of a battery short-circuit or temporary power loss. Preferably, the capacitor C4 is connected to the negative analog voltage supply terminal, and its value is chosen to ensure that a source of supply voltage is supplied to the embedded memory (RAM) for a time dependent upon the RAM leakage current. In the preferred embodiment, the power to RAM memory is unlatched if a temporary short circuit condition exists. However, capacitor C4 preferably of capacitance 330 nF, provides a source voltage to the RAM for a period of time necessary for the PTC element to ramp to a high resistance value. The PTC element will create a high impedance between battery terminals when a short circuit across the battery pack terminals creates a high circuit drain.

The hybrid IC 32 further includes up to 4 kbytes of additional ROM memory 70 for addressing and storing the various algorithms, subroutines, manufacturer data, and data constants utilized by the smart battery module for calculating the battery capacity, sending messages such as alarms and battery charger control commands etc., and handling message requests from external devices.

The programmable ROM generator is implemented by means of a metal mask (not shown) as opposed to conventional ROM generation by means of diffusion masking. In accordance with the information which was to be permanently stored, transistors were generated in a matrix arrangement through diffusion, whereby the information was coded in the plane through the distribution of the transistors in the diffusion step. Thus, the ROM generator generates in effect, a ROM matrix, whereby the presence or respective absence of an MOS transistor stands for a logic "0" respectively "1." A disadvantage of a ROM matrix with the programmable level of diffusion is that the diffusion process, which is incorporated as one of the first steps of a CMOS process, can not be changed when there is a change in ROM contents. thus, rendering impossible the production of wafer stock for a particular type of ROM.

By contrast, the advantage of a ROM matrix programmable in a metal layer is that wafer stock with the same basic layers up to the metal may be fabricated. Thus, a microprocessor family with different ROM contents can be realized with low cost and fast turn around time. Additionally, the pre-manufacture of a portion of the ROM with the flexibility of programming in application specific information in the upper or respectively later produced layers, is possible.

The hybrid IC chip itself may comprise thirteen or fourteen layers, with the $9^{th}$ or $10^{th}$ layer (i.e. one of the upper layers) being a layer of metal, wherein the distribution of the metal is characteristic for the storing contents of the ROM. Thus, in the hybrid IC ROM manufacturing process, nine (9) layers are grown and the next four ROM programming layers are grown dependent upon the customer's particular needs (i.e., special properties of the battery pack).

Figure 9A:
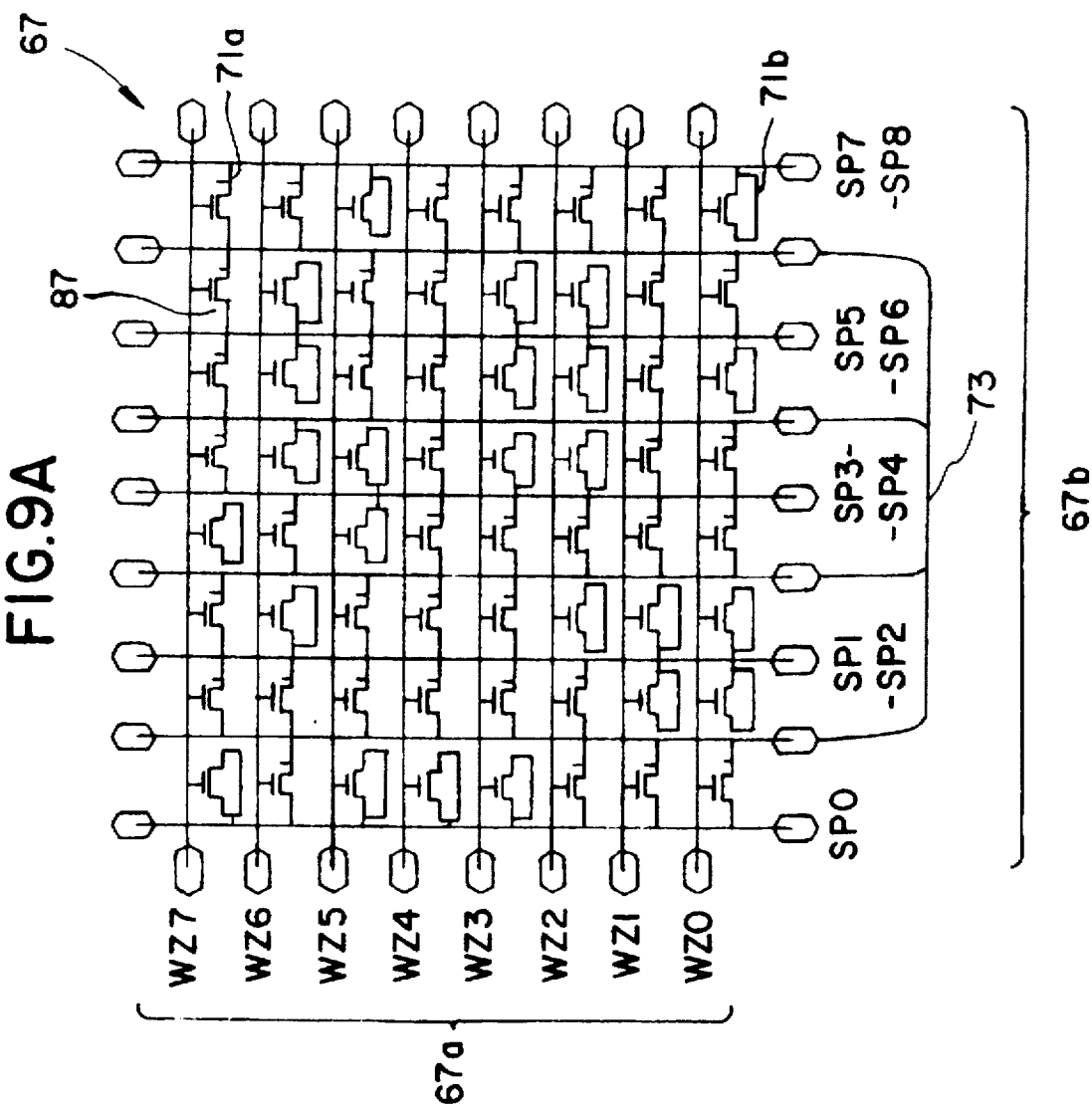
FIG. 9(a) illustrates a schematic sketch of a sample transition arrangement for the ROM included in the smart battery device.

FIG. 9(a) shows a ROM matrix with the metal layer as a programmable layer. A MOS transistor, e.g. 71(a) for the matrix is always present on the matrix and will either serve as a logical "0" or "1". Specifically, FIG. 9(a) schematically illustrates the ROM 67 of the smart battery device that is programmed according to the unique process as follows: The represented ROM matrix consists of eight word lines 67a and indicated as WZ0, . . . , WZ7 and 8 spaces 67b and indicated as SP0, . . . , SP8, whereby the spaces SP1,SP3, SP5,SP7 connect with a virtual ground line 73. At each location of the matrix, there is produced a transistor in the diffusion step, three transistors 71a, 71b, and 87 of the matrix are shown in FIG. 9(a). For the programming of a logic "0," in a respective word line, the drain or respective source electrodes of a transistor are connected to a metal mask with the corresponding source or respectively drain electrodes of the joining transistors or the joining transistor. The drain or respective source electrodes of such a transistor are connected with the gap lines or, respectively, the virtual ground lines 73. Transistor 71a in word WZ7, as shown in FIG. 9(a), is programmed for a logic "0" as its drain terminal is connected with the source terminal of connecting MOS Transistor 87 which is tied to virtual ground line SP7.

Logic "1" in contrast therewith is probed in, in that the drain or respectively source electrodes are connected to a common line, preferably, as can be ascertained from FIG. 9(a), to a gap line SP0,SP2,SP4,SP6,SP8. Thereby, the transistors, such as the transistor 71b of word WZ0 as shown in FIG. 9(a), are short circuited.

The connections of the transistors are thus initially determined with the application of the metal mask. In the usual manner two (through contacting) metal masks are applied on the ROM. In should be understood that in this instance preferably the lower of the two metal masks, meaning the mask which is located closer to the transistors, is employed for the short circuiting and the connection of the applicable transistors. Inasmuch as the transistors are short circuited, this does not influence the operation of the metal mask which is employed for the contacting. Since this metal mask is usually one of the uppermost layers, for example the tenth of about 14 layers, the inventive ROM can be pre-manufactured up to the ninth layer and then programmed and manufactured in accordance with the application.

Figure 9B:
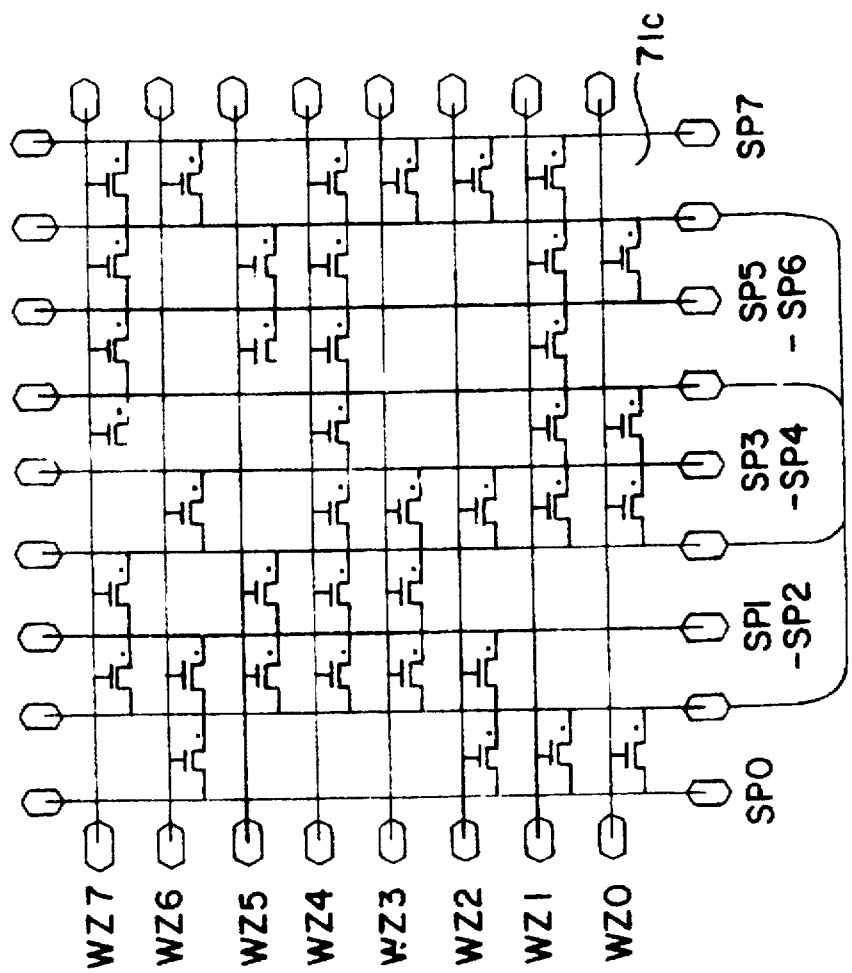
FIG. 9(b) is a schematic sketch of the transistor arrangement of an ROM programmed pursuant to the prior art.

In FIG. 9(b) there is illustrated a usual programmed ROM. It can be ascertained from FIG. 9(b) that the transistors, which are short circuited in FIG. 9(a), are in any event not produced in the diffusion mask. As shown in FIG. 9(b), the transistor 71c which is not present corresponds to a short circuited transistor 71b in the metal mask pursuant to the process described above.

Each of the algorithms, subroutines, manufacturer data, and data constants stored in ROM and utilized by the smart battery module for calculating the battery capacity, etc. as mentioned above, will now be explained in further detail below. Further details of the smart battery algorithm for reporting battery parameters to an external device is found in applicant's co-pending patent application U.S. Ser. No. 08/318,004 assigned to the assignee of the instant invention and the disclosure of which is incorporated by reference herein.

Figure 3:
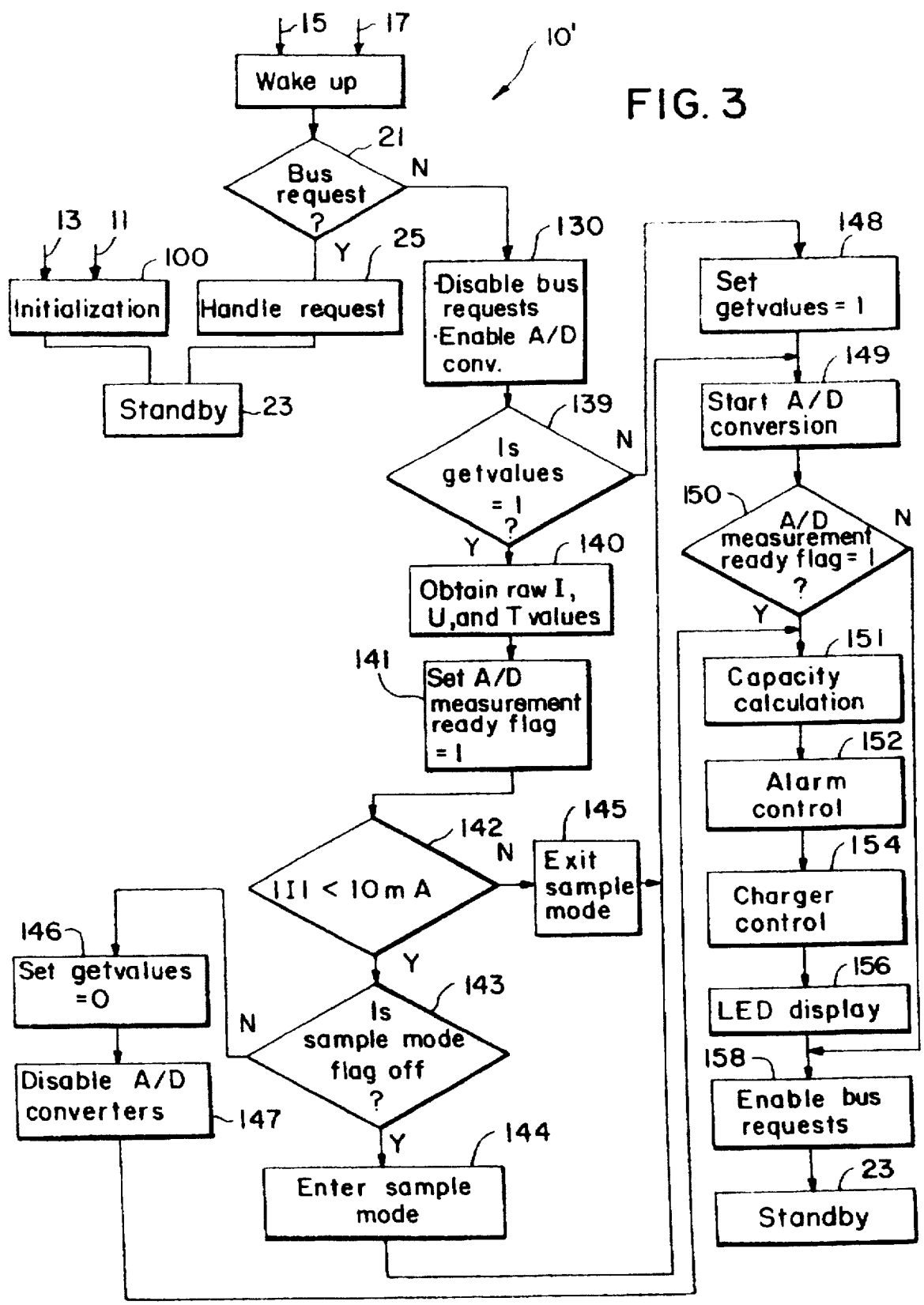
FIG. 3 is a general flow diagram illustrating the primary functional features of an algorithm and method for controlling the smart battery device of the instant invention.
Figure 10:
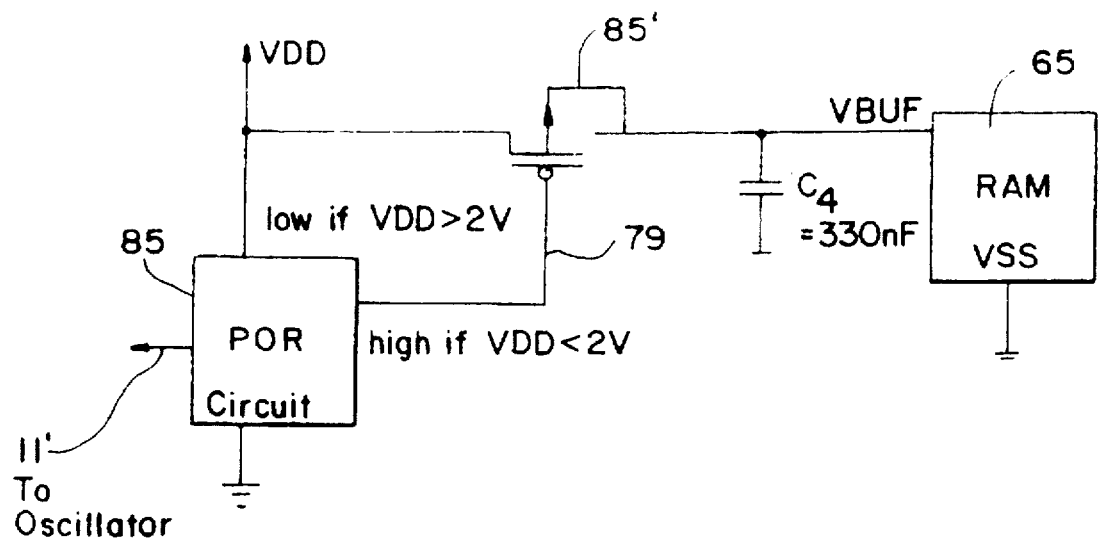
FIG. 10 is a detailed schematic of the power-on reset 85 and RAM de-latching circuit 85'.

As shown in FIG. 3, the battery operating system 10' will first perform an initialization routine 100 that is initiated upon system power up, enabled by a power ON signal/reset impulse signal 11, or, enabled by a wakeup from STANDBY signal 13 which is generated after the microprocessor has determined that it should exit the standby mode. As shown in FIGS. 2(b) and FIG. 10, the hybrid IC 32 is provided with a power-on reset circuit 85 which generates a reset impulse signal 11 to activate the external crystal oscillator 36 and reset the system every time the power supply voltage is applied to the ASIC. Specifically, this reset impulse initiates the start of the external crystal oscillator 36 to provide the precise triggering of the internal 450 kHz oscillator for providing the time base for the hybrid IC components. The threshold of this circuit is between 1.2 V and 1.6 V depending upon the type of transistors used in the circuit of FIG. 10.

More specifically, as illustrated in FIG. 10, the power-on reset circuit 85 is provided with a transistor network comprising n- and p- channel transistors that are tied to hybrid IC voltage supply $V_{DD}$. When $V_{DD}$ is sensed as dropping between 1.6V to 2.0V, or, in the case of battery short circuit 0.0 V, the transistors of circuit 85 generate a RAM memory de-latching signal 79 which turns off PMOS- transistor 85' and effectively de-latches RAM memory 65. As mentioned above, the voltage on buffer capacitor C4 will keep RAM memory contents alive for period dependant upon RAM leakage current.

After a power on/reset signal 11 is received, or, after the sleep mode is exited, the system is placed in a standby mode 23 (FIG. 3) until it is triggered by trigger signal 17 generated by the external oscillator 36 which provides the trigger for the system operations (capacity calculation) every 500 msec, or, is awakened by a bus request signal 15 as will be explained in further detail below. In the battery "standby" mode, the microprocessor is in an idle state until the operating cycle trigger 17 or external bus request signal 15 is received.

Initialization of algorithm variables

The initialization routine, which is described and shown (in FIG. 4) of the above-mentioned, copending patent application (U.S. Ser. No. 08/318,004), is conducted at the virginal start of the system. The initialization routine functions to clear all values to be stored in the system RAM and to assign all system default values. Preferably, many of the default values are constant values and are available in case of an emergency situation wherein all RAM memory has been lost while the system was in the STANDBY mode.

On power-on-reset as well as on a wakeup from the STANDBY mode of the chip (explained below), the program is started at an initial memory address. A "checksum" test is conducted for checking whether the RAM memory is valid whereby the capacity calculation is continued, or, whether the emergency mode (which uses ROM defaults) will be activated. Such an instance occurs when the chip switches into the STANDBY mode at low battery voltage and then back into the ON mode when the battery is to be recharged.

If the "checksum" test fails, the µP will first clear all RAM banks completely, and, as consequence an internally generated CALIBRATED flag will be cleared and the number of cells of the battery pack has to be learned, a process to be explained in greater detail below. Next, the default values (described below) are transferred from ROM to RAM. To prevent exceptions in the capacity calculations to be described hereinbelow, it is imperative that variables do not have undefined values. This enables the algorithm to work in a catastrophic emergency mode in the event that all RAM memory has been lost. The default values of critical variables may then be substituted by correct values when the battery system is reformatted at a battery service station using the original manufacturer's data.

Included in the initialization routine will be an initialization of FullChargeCapacity "full_cap", RelativeStateOfCharge "SOC" and the RemainingCapacity "ltf" values, as well as state and other variables to ensure a proper start of the capacity calculation. Then, the program resets all system timers such as the calculation of voltage, temperature and selfdischarge timers before passing out of the initialization routine. The capacity calculation will then initiated at each trigger signal 17 which is delivered every 500 msec by the external 32 kHz crystal 36.

As explained above, the default values are necessary to ensure that upon a power-on/ reset, the rechargeable battery capacity calculation (explained below) may be executed. The preferable nominal default values for the critical parameters used for the capacity calculation algorithm 151 and explained in detail in copending patent application (U.S. Ser. No. 08/318,004), are set forth as follows:

The DesignCapacity (theoretical or nominal capacity, hereinafter "nom_cap") may range between 1700 maH to 2400 mAH, but, after a memory loss, the capacity calculation algorithm defaults to a preferred value of 2000 mAh and the new capacity is relearned from that level; the default value of the number of battery cells in the rechargeable battery pack is 6 cells, however, this value may be changed depending upon the actual configuration of the battery pack; The AL_REM_CAP value represents the remaining capacity alarm triggering value and may range from 50 mAh to 500 mAh. Preferably, AL_REM_CAP has a default value (AL_REM_CAP_DEF) of 200 mAh. An alarm condition exists when the remaining capacity is below this value (without taking into account the remaining capacity after EDV due to current and temperature (i.e., the residual capacity correction)). The AL_REM_TIME value represents the estimated remaining time at the present discharge rate and may range from 1.0 min. to 20 min. Preferably, AL_REM_TIME has a default value (AL_REM_TIME_DEF) of 10 minutes. This alarm condition exists while the calculated remaining time to voltage breakdown (EDV), based on the minute average current (discussed below), is below the value of AL_REM_TIME and will automatically be disabled when the battery is in the charging mode. The AL_DTEMP value represents the dT/dt alarm trigger condition and may range from 1° K/min. to 5° K/min. Preferably, AL_DTEMP has a default value (AL_DTEMP_DEF) of 2° K/minute. This alarm condition will exist when the battery detects that the rate of its internal thermal rise (dT/dt) is greater than the AL_DTEMP value. The AL_HI_TEMP value represents the high temperature alarm trigger and may range from 310° K. to 345° K. Preferably, AL_HI_TEMP has a default value (AL_HI_TEMP_DEF) of 328° K. Additionally, when the capacity calculation is started by power-on-reset, the FullChargeCapacity, ("full_cap" represents the learned full charge capacity of the battery), will be initialized to the DesignCapacity (nom_cap); the RemainingCapacity ("ltf") to ⅛ of the full cap; and, the RelativeStateOfCharge ("soc") to 12.5% and the battery state to capacity decreasing, and, specifically, to selfdischarging mode. The alarm timer N_ALARM is set at 10 seconds and this is the amount of time that an alarm condition will be broadcast between a host device and/or a battery charger as will be explained in further detail below. It should be understood that these values are typical values for a NiMH battery intended for use in a portable computer. Other types of battery chemistry, or portable devices, may call for a different set of default values. 35

As shown in FIG. 3, after the system is initialized at step 100, the battery will enter into a standby or maintenance mode 23 where it will either awake upon a bus-request signal 15 or awake upon the external crystal trigger signal 17 every 500 msec. If the battery is awaked by a bus request signal 15 as determined at step 21, then the battery will handle the request by the handle request routine indicated at step 25 where it will thereafter exit into the standby mode. The routine for handling the requests 25 will be explained in further detail below.

If the system is triggered by the normal external crystal trigger signal 17, and there are no bus requests, then the program disables the bus requests (approximately 37 msec before the trigger signal) and enables the A/D converter to begin the current, voltage, and temperature measurements for the current operating cycle as shown at step 130 in FIG. 3. A "getvalues" status flag is then checked at step 139 to determine whether A/D conversions of the raw current, voltage, and temperature measurement values are to be performed. When this flag is set high (logic level=1), the raw current, voltage, and temperature values of the rechargeable battery are obtained for the current trigger cycle as shown at step 140. These raw A/D current, voltage and temperature values are built into a special function register 61, as shown in FIG. 2(b), which is one of sixteen such registers provided in the hybrid IC for subsequent storage in RAM as I, U, or T. If the "getvalues" flag is low (logic level=0), then no raw current, voltage, and temperature measurements will be obtained for the present cycle, and the getvalues flag will toggle high (logic 1) at step 148 and the process will continue as shown in FIG. 3.

After new current, voltage, and temperature values are obtained (step 140), the A/D measurements ready flag is set high (logic level=1) at step 141, and a check is made at step 142 to determine whether the system is in a sample mode. Thus, at step 142, if the absolute value of the raw current, III, is determined to be below a threshold value of 10 mA, then the battery system will operate at half the sample rate depending upon the status of the sample mode flag. Thus, at step 143 in FIG. 3, a determination is made as to whether the sample mode flag is low (i.e., logic 0) or high (logic 1). If the sample mode flag is low, then the sample mode flag will toggle to a high level at step 144, and the system is placed in a sample mode and the process proceeds at step 149 to initiate the A/D conversion. If the sample mode flag is already high (from the previous cycle), then the "getvalues" flag is set equal to zero at step 146, and the A/D converter is disabled at step 147. The A/D conversion will not occur (to save power) and the algorithm proceeds to the capacity calculation (step 151). The "getvalues" flag is always set low in the sample mode. The status of this flag ensures that an A/D conversion will be skipped, and, as a consequence, no new valid data will be available for the capacity calculation at step 150.

If the raw current, IIl, is determined at step 142 to be above the 10 mA threshold, then the battery system will exit the sample mode (and the sample mode flag is set at logic 0) at step 145, and the A/D conversion of the raw current, voltage, and temperature values will be performed at step 149. At step 150, a determination is made as to whether the A/D measurement ready flag is high (logic 1) indicating that valid raw battery parameter data has been received. If it is set high, then the capacity calculation and attendant battery characteristic conversions (voltage, current, and temperature) will be performed. If the A/D measurement ready flag is low (logic 0), then the capacity calculation is not performed in the current cycle, and the process proceeds to step 158 where the bus request line for message transfer is enabled and the hybrid IC is placed in the sleep mode at step 23. The oscillator trigger 17 continues to wake up the microprocessor every 500 msec, however, when the current is less than 10 mA, the A/D conversions and the capacity calculations may be performed at an arbitrarily determined rate that is less frequent, for e.g., once every two or once every five seconds, to conserve power.

FIG. 8(a) illustrates the timing of the operating cycles under normal mode operating conditions 57a as compared when the system operates under sample mode conditions 57b explained below. As shown in FIG. 8(a) and, as mentioned above, the 32 kHz external crystal delivers the trigger signal 17 every 500 msec to initiate the raw voltage, current, and temperature measurements, indicated as 158. Also initiated is the capacity calculation 160 which utilizes the current, voltage, and temperature measurements of the previous operating cycle. When the raw current value obtained is determined to be below a threshold value of 10 mA, the battery system will operate at half power, and no measurements will be taken during the next 500 msec operating cycle as indicated as 58b in FIG. 8(a). However, measurements are taken one second later at the next operating cycle as indicated as 58c. When the raw current value obtained is determined to be above a threshold value of 10 mA, the battery system will resume normal mode operation and during the next and subsequent operating cycles, the capacity calculation and attendant battery characteristic measurements (voltage, current, and temperature) will be taken.

FIG. 8(b) illustrates the approximate time durations for the various measurements. As a matter of design choice, the capacity calculation 160 is performed in approximately 71 msec for each operating cycle. Thereafter, the alarm control subroutine 152 will be performed for a duration of approximately 29 msec and the charger control subroutine 154 will be performed for a duration of approximately 2 msec if the smart battery determines these operations are to be performed (see FIG. 3). The LED display routine 156 may be performed if it is requested by a user and the LED display control functions will take place for approximately 23 msec as shown in FIG. 8(b). It should be understood that the aforementioned performance times for the various routines may vary due to the accuracy of the internal 455 kHz oscillator, which may vary with temperature. Each of the alarm control subroutine 152, charger control subroutine 154 and LED display subroutine 156 will be explained in further detail below.

Since the system management bus request line is inactive during the capacity calculation, alarm control, charger control, and LED display routines, the microprocessor will be unable to receive requests from a host device or battery charger as indicated for the time duration 158 for each operating cycle shown in FIG. 8(a). Therefore, in each operating cycle, after the capacity calculation has been performed, the System management bus request line is enabled for the remaining time of the 500 ms cycle, as indicated in FIG. 8(b), so that it may respond to a request from a host device or charger. Concurrently, the battery places itself in the standby mode 23 whereupon it will be awaked for the next cycle upon receipt of the system trigger signal 17, or, be awakened by a bus request signal 15 as shown in FIG. 3. For a remaining 37 msec of each operating cycle, the bus request is again disabled as shown for the time duration 158 prior to the next trigger signal 17. As mentioned above, each system trigger signal 17 initiates the start of the internal clock 48 generating the 455 kHz signal for controlling the hybrid IC, microprocessor, A/D converter, etc.

Algorithm for calculating battery capacity

Figure 22A:
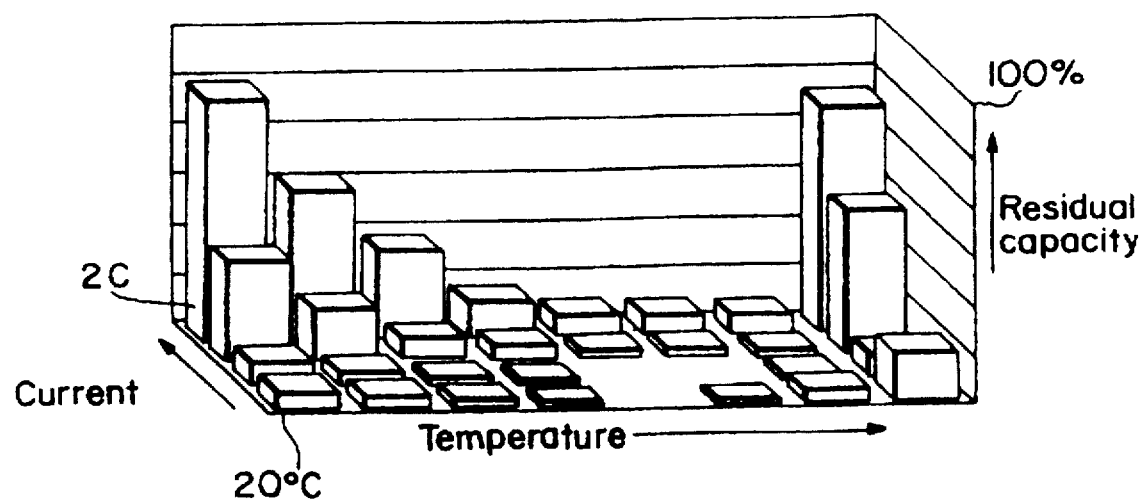
FIG. 22(a) is a three-dimensional graphic representation of look up tables that depict predicted residual capacity values as a function of discharging current and temperature.
Figure 22B:
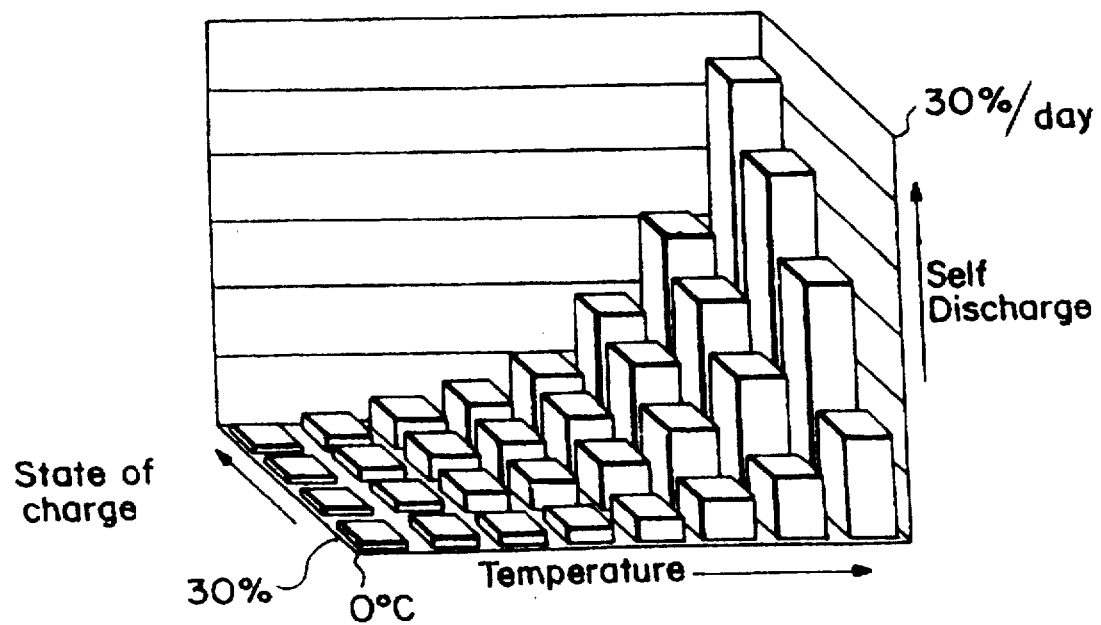
FIG. 22(b) is a three-dimensional graphic representation of look up tables that depict the amount of self-discharge current (vertical axis) as a function of relative battery state of charge and temperature.
Figure 22C:
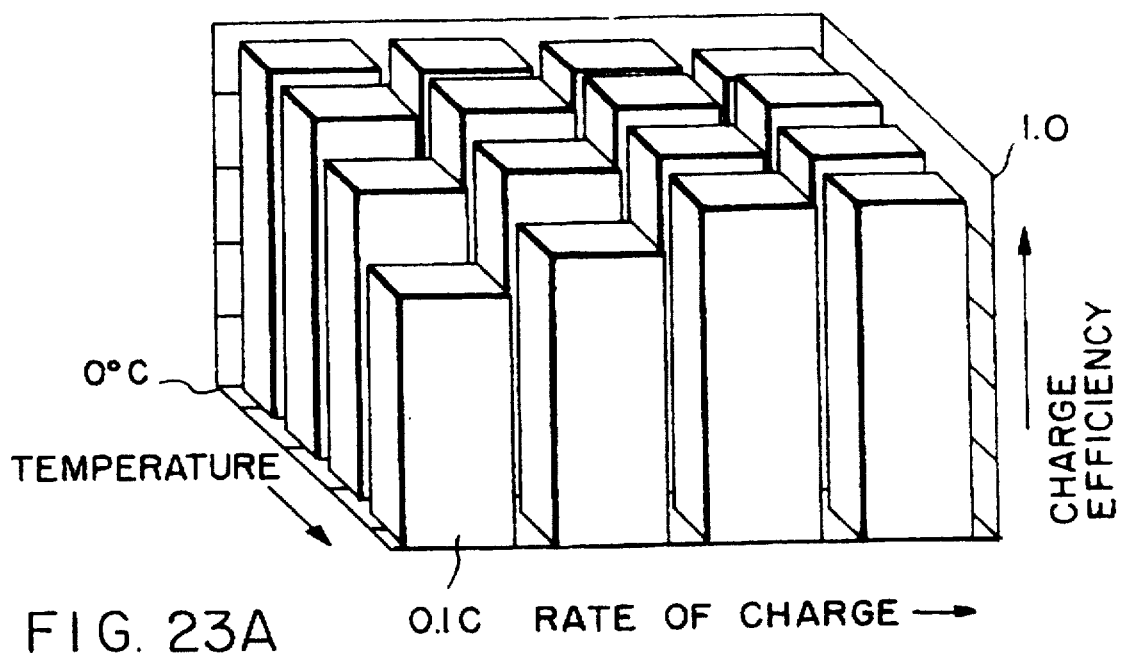
FIG. 22(c) is a three-dimensional graphic representation of charge efficiency look-up tables showing charge efficiency factors as a function of relative state of charge, charging current, and temperature.

The purpose of the capacity calculation is to continuously monitor the capacity of the rechargeable battery in accordance to the formula indicated by equation (1) as follows:

$$CAP_{rem}:=CAP_{rem}+\Sigma\epsilon_c I_c \Delta t_c - \Sigma I_d \Delta t_d - \Sigma I_s \Delta t_s \qquad (1)$$

where $CAP_{rem}$, also referred to hereinbelow as "Itf", and indicates the remaining capacity in the battery at any given time expressed as mAh (milliamperehours); the $\Sigma \epsilon_c I_c \Delta t_c$ term represents the sum of the incremental increases in capacity as the battery is being charged and takes into account a charge efficiency factor $\epsilon_c$ accessed preferably from look-up table values to be explained in further detail below with respect to FIG. 22(c), or, alternatively, may be obtained from a response equation or by interpolating between several points stored in memory; a $\Sigma I_d \Delta t_d$ term which represents the sum of the continuous decrease in battery capacity due to discharge associated with the battery's usage; and a $\Sigma I_s \Delta t_s$ term which represents the predicted and measurable amount of self-discharge based upon self-discharging effects associated with the battery's chemistry and is a function of the battery state of charge and temperature. By knowing the RemainingCapacity, Itf, at all times, it is possible to provide battery parameter information useable by a host computer (PC) or smart battery charger to ensure safe and reliable battery use and to ensure prolonged battery life.

Figure 13A:
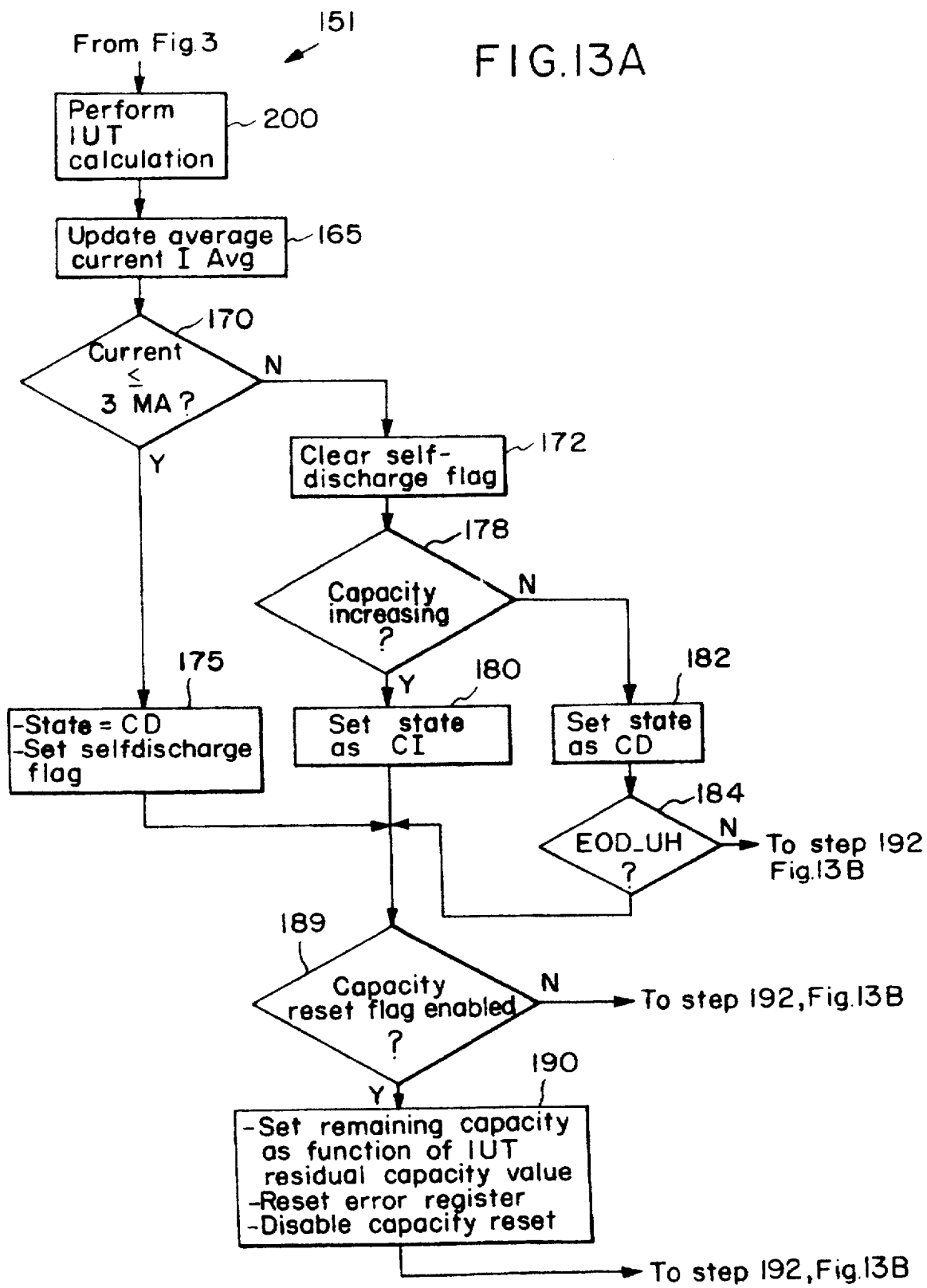

FIGS. 13(a) through 13(b) illustrate the capacity calculation routine performed for the rechargeable battery pack at each trigger cycle. In parallel, the current, voltage and temperature measurements are running except when in the "sample" mode where these measurements are taken once every second. The sample mode is designed to save power consumption (i.e., the A/D conversions occur at half-frequency) and is switched on and off depending upon the amount of detected current. For example, when the current falls below 10 mA, the "sample" mode is enabled and less frequent measurements are made.

Normally the temperature, voltage and current are measured and updated once per cycle. The current is measured with an integrating method (explained in detail below), which recognizes its changes during the conversion time. All output values taken from SMBus requests and capacity calculation are one period delayed. The A/D measurements are controlled by an on-chip oscillator at nominal 455 kHz and the operating cycles—responsible for the integration time—by the precise 32 kHz oscillator. The lower accuracy of the absolute frequency value of the on-chip oscillator has no influence on the accuracy of the measurement.

As shown in FIG. 13(a), at step 200, the first step of the capacity calculation, the IUT Calculation routine 200 is performed to first convert the raw analog/digital converter output data from register 61 (FIG. 2(b)) into values having appropriate units useful for the capacity calculation algorithm. Details of the IUT Calculation routine can be found in the above-mentioned, co-pending patent application (U.S. Ser. No. 08/318,004). Briefly, as illustrated in FIG. 12, at step 205, the raw A/D Current measurement, I_raw, is scaled and converted to the actual current value "T" in units of milliamps. Similarly, the raw A/D pack voltage measurement, U_raw, is scaled and converted to the actual battery pack voltage value "U" in units of millivolts. Next, as indicated at step 212, the µP checks the battery pack voltage "U" to determine whether or not the individual cells of the battery pack have an output voltage less than 0.9 V. If a cell is detected as outputting a voltage less than 0.9 volts, then the battery pack is placed in a Sleep mode, as indicated at step 212'. As shown in FIG. 12, the following actions take place when the battery state changes between an ON and SLEEP mode:

To save battery power and minimize current drain, the µP proceeds to switch off: the A/D converter 60 at step 213 and 455 kHz on-chip oscillator at step 216. While in the sleep mode, the RAM memory contents are kept alive by voltage from the battery with only memory leakage current drain (which is dependent upon the amount of RAM). Additionally, the wake-up comparator circuit 80 (FIG. 11) is activated at step 217 and then the µP sets a bit flag to tell the hardware to start a special voltage control logic to set itself for sleep, as indicated at step 218.

Figure 11:
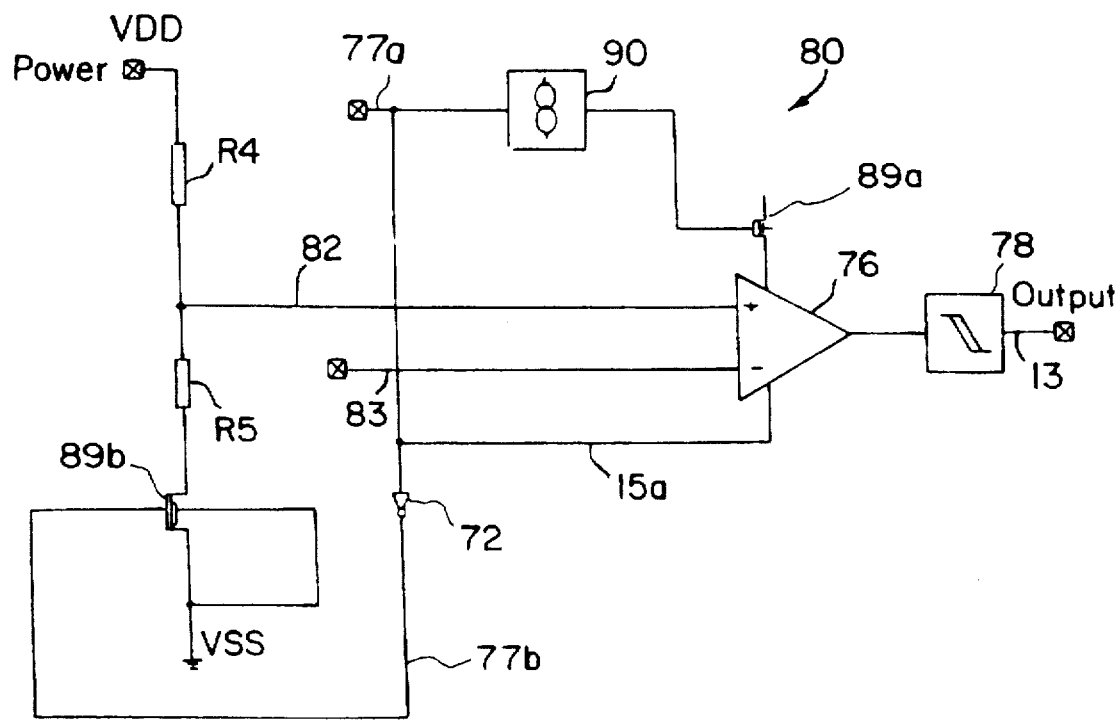
FIG. 11 illustrates a detailed schematic diagram of the comparator wake-up circuit 80.

As shown at step 219 in FIG. 12, and, as illustrated in FIG. 11 the wake-up comparator circuit 80 is periodically activated by a trigger signal 77a derived from the external 32 KHz oscillator. At each period, the comparator is turned on to compare the ratio of pack voltage signal 82 with the predetermined bandgap reference voltage signal 83 that is supplied from the bandgap reference circuit 62 (FIG. 4) and input to the inverting input of comparator 76. For a three cell battery pack, the bandgap reference voltage 83 is approximately 1.239 volts, but, this value may be changed in accordance with the battery pack design. When the ratio of pack voltage signal 82 $V_{DD}$ of the ASIC has increased above reference voltage signal 83, then the comparator circuit will toggle, as shown at step 220, to awake the µP and enable the A/D converter again to take measurements, as indicated at step 221. The capacity calculation will then continue with an initialization at step 100.

A detailed schematic of the wake-up comparator circuit 80 is shown in FIG. 11. As shown in FIG. 11, the wake-up comparator circuit 80 comprises a voltage divider comprising resistors R4 and R5 which are tied to the $V_{DD}$ ASIC power supply to supply a ratio of $V_{DD}$ pack voltage (signal 82) to a first non-inverting input of a comparator 76. As will be explained in further detail below, an NMOS (n-channel MOSFET) transistor switch 89b connected between resistor R5 and ground is nominally turned off in sleep mode to prevent battery current drain to ground, but, is periodically turned on once every 500 milliseconds (30 microseconds) by trigger signal 77a to enable the divided $V_{DD}$ voltage to appear at the non-inverting input of the comparator 76. Simultaneously, the external oscillator trigger signal 77a, triggers the wake-up comparator circuit 80 by simultaneously turning on the transistors 89a,b to enable comparator 76 operation. As shown in FIG. 11, a low power current source 90 which is derived from the battery by external circuitry, turns on transistor switch 89a, to provide a reference current to comparator 76. From this current source 90, the working point of the comparator is fixed. Additionally, enable line 15a is tied to signal 77a to simultaneously enable the comparator to take a measurement. Transistor switch 89b is turned on by signal 77b, which is output from inverter 72, to create a path to ground to enable $V_{DD}$ voltage divider signal 82 to appear at the comparator input so that the comparison may be made.

When the $V_{DD}$ ratio is low (<0.9 V/cell) and the ratio of pack voltage signal 82 is less than the A/D converter bandgap reference signal 83, then the comparator output signal 13 is low. When $V_{DD}$ rises above the reference voltage 83, i.e., 3.33 Volts (1.11 volts per cell for a three-cell battery pack) the wake-up (comparator output) signal 13 goes high, thus, allowing normal sample mode operation to resume. As shown in FIG. 11, element 78 is a Schmitt trigger device which is a bistable device that is provided at the output of the comparator 76 to prevent spurious oscillations appearing at the output of the comparator 76 that might be due to comparator switching characteristics and/or amplifier noise.

Due to the low power consumption of the MOS circuitry implemented in the hybrid IC, the total current consumption of all operating components while in the sleep mode is no greater than approximately 2.0 µamp (microamps).

Referring back to FIG. 12, as long as each cell is detected as outputting a voltage greater than 0.9 volts, the capacity calculation continues, and, at step 215, the raw A/D pack current temperature measurement, T_raw, is converted to the actual battery pack temperature in units of degrees Kelvin. This temperature value is additionally scaled to take into account thermistor scaling values, (not shown), and a final current temperature value of "T" is obtained. At step 222, the condition of the battery is checked to determine if an over temperature condition exists, where a temperature of 328° K. or greater is detected. When detected, a temperature alarm condition flag, HI_TEMP_ALARM, is set. If capacity is increasing and the over temperature condition exists then a TERMINATE_CHARGE_ALARM flag will be set indicating that one or more of the battery's charging parameters are out of range.

At this point, it should be mentioned that an end of charge condition may exist (if the capacity is increasing). This end of charge condition may be detected when the rate change in voltage or temperature taken between successive measurements is at a certain gradient. Thus, as shown in FIG. 12 at step 224, and described in detail (steps 240 through 249 of FIG. 5(b)) in co-pending patent application (U.S. Ser. No. 08/318,004), the change in temperature dT/dt calculation is performed. Additionally, as shown in FIG. 12, a change in voltage dU/dt calculation is performed at step 227.

The change in temperature (dT/dt) calculation is performed to evaluate the difference dT between the current temperature value T and a previous temperature value determined at a time 20 seconds previously, but may range anywhere from 10 to 120 seconds previous.

After the dT calculation is performed, a determination is made as to whether the amount of internal temperature change exceeds the allowable rate, i.e., whether the AL_DTEMP alarm condition exists, as shown at step 226 in FIG. 12. A temperature change of approximately 2° K./min or greater indicates an AL_DTEMP alarm condition and, when detected, an alarm condition flag, DTEMP_ALARM, is set.

The change in voltage (dU/dt) calculation is performed to evaluate the difference dU between the current voltage value U and a previous voltage value determined at a time preferably 255 seconds previous.

After the dU calculation is performed, a determination is made at step 260 as to whether the capacity is decreasing, and, as to whether the present voltage U is less than the end of discharge voltage (EDV) limit (typically 0.9 V/cell), indicating that an end of discharge condition EOD__U exists. Thus, the present voltage value U is compared to the preset end of discharge voltage (Uempty) to determine if it is less than this voltage. If an End of Discharge condition for voltage exists, then an EOD__U flag is set at step 262 and a Terminate__Discharge__Alarm flag is set indicating that the battery has supplied all the charge, and is now nominally fully discharged. If an End of Discharge condition does not exist, then the EOD__U flag and the Terminate__Discharge__ Alarm flag are cleared at step 264. Additionally, at step 264, the capacity reset flag is disabled. The IUT__Calculation procedure 200 is then exited and the capacity calculation continues at step 165 in FIG. 13(a).

At step 165 of the capacity calculation routine 151 of FIG. 13(a), a calculation of the rolling minute average current is performed utilizing the recent previous current (I) measurements. Rolling minute average current calculations are important for calculating battery conditions such as "average time to empty" which is based on the average current drain, and which might be requested by a host device, as will be explained in greater detail below. Then, at step 170 of FIG. 13(a), a determination is made as to whether the present current (I) value is less than or equal to the selfdischarge current I__SELFD, which, in the preferred embodiment, is 3.0 milliamps but may range anywhere from 2.0 ma to 10.0 ma and represents the limit for a mode and battery state recognition. If the present current (I) value is less than or equal to the selfdischarge current then the state of the battery is determined to be capacity decreasing without any external drain. Consequently, a selfdischarge flag bit is set at step 175. If the present current (I) value is greater than the selfdischarge current (3.0 mA), then the battery selfdischarge flag bit is cleared at step 172. The battery selfdischarge current is always calculated regardless as to whether the battery is in a capacity increasing or capacity decreasing state. The direction of current is established at step 178 in FIG. 13(a) to determine the present state of the battery. If the current (I) is determined to be a positive value, then the state of the battery is capacity increasing (hereinafter CI) and a capacity increasing flag is set at step 180. If the current is determined to be a negative value, then the state of the battery is capacity decreasing (hereinafter CD) and a capacity decreasing flag is set at step 182. If it is determined that the capacity is decreasing, then a determination is made at step 184 as to whether the end of discharge voltage (plus hysteresis) EOD__UH flag has been set.

For accurate battery parameter presentation and battery life predictions, it is important that the full battery capacity be reset after an end of discharge voltage condition (battery nominally fully discharged) has been detected. Even at a nominally discharged condition, some residual battery capacity remains and this is taken into account into the battery calculation, as will be explained below. Thus, a determination is made at step 189 as to whether the capacity reset flag has been set as a result of the EOD__UH flag having been set indicating that the battery pack end of discharge voltage has been reached (as determined at step 184), or, as a result of the battery self discharge flag having been set (as determined at step 175), or, if capacity is increasing. If the capacity reset flag has been set, then, at step 190, the remaining capacity (Itf) at the EOD voltage condition is reset to a predicted Residual Capacity "pd" value obtained from look up table depicted in FIG. 22(a). Additionally, at step 190, the error register is reset to zero and the capacity reset flag is cleared. The program then proceeds to the selfdischarge calculation and current integration procedures. If, at step 184, the EOD__UH flag has been determined not to have been set, or, if the capacity reset flag had not been set as determined at step 189, then the algorithm proceeds at step 192 in FIG. 13(b).

As described in further detail (with reference to FIG. 6(b) of co-pending patent application (U.S. Ser. No. 08/318,004), and in view of step 192 of FIG. 13(b), a state change determination is made for determining whether the state of the battery has changed, i.e., whether the battery has changed from a capacity increasing (CI) state to a capacity decreasing (CD) state, or vice versa. This step is necessary to avoid the instance of false battery cycle counting or the inaccurate learning of the full charge capacity due to current pulse sign changes or breaks of the current flow.

As indicated from steps 300 to 325 of FIG. 13(b), the selfdischarge calculation procedure is performed. Specifically, as described in further detail (with reference to FIG. 6(b) of co-pending patent application (U.S. Ser. No. 08/318,004), a 128 second timer for the selfdischarge calculation is first decremented. Preferably, steps 305-325 of the selfdischarge calculation are performed once every 128 seconds. If the self-discharge timer has not timed out, the program proceeds to step 400 (indicated by broken lines) to perform the current integration procedure 400, as shown in detail in FIG. 13(b) and explained in further detail below.

Selfdischarge calculation routine

Due to the electrochemical nature of batteries the selfdischarging correction of the remaining capacity has to be calculated all the time, independent from the existence of any charging or discharging currents. This is because there will always be a self-discharge current drain regardless of whether the battery is being charged or discharged and the amount current drain is a function of the battery charge and temperature. Thus, as indicated as step 305 in FIG. 13(b), the selfdischarge rate "s" as a function of the relative state of charge "soc" and current temperature T is accessed via a look-up table, shown in FIG. 22(b) which shows a three-dimensional graphic representation of self-discharge current (vertical axis) as a function of relative battery state of charge and temperature. These look up factors "s" for selfdischarge give the predicted selfdischarge rate scaled by the design (nominal) capacity, and, as is shown in FIG. 22(b), the amount of selfdischarge current, $I_s$, generally increases with increasing temperature and increased battery state of charge levels. For instance, at approximately 65° C. and a 95% relative state of charge, battery selfdischarge current might total an amount of up to 30% of the full battery capacity per day. The selfdischarge values depicted in FIG. 22(b) were empirically derived and will vary, depending upon the battery chemistry and battery architecture.

At step 310, a determination is made as to whether the state of the battery is capacity increasing or capacity decreasing. If the battery is in a discharging state, as shown at step 315, the total amount of capacity decrease (current drained) since the last state change is calculated and stored in a separate register. If the capacity is increasing, then the program is directed to step 320, where the effects of the selfdischarge rate are taken into account for the error calculation. Step 320 is also performed after the total amount of capacity decrease (current drained) since the last state change is calculated at step 315. Then, at step 325, the actual capacity integral "Itf" is decremented by the selfdischarge rate "s", thus, providing the $\Sigma I_s \Delta t_s$ in equation (1) described above. Afterwards, the self-discharge procedure ends and the current integration routine 400 is performed.

Battery charge integration routine

When the battery is being charged, it is said to be in the Capacity Increasing state (CI), else it is in the Capacity Decreasing state (CD). CD includes the standby mode of the battery, when no current flows through the battery terminals. In the standby mode, only the selfdischarging rate reduces the capacity.

The battery current will be precisely integrated during both charge and discharging states. The capacity integration itself is independent from the battery state, but, as will be hereinafter explained, look up tables (LUT) provide adjustment factors to enable more precise capacity adjustment. For instance, a first LUT (described below with respect to FIG. 22(c)) comprises current efficiency factors dependent upon the battery relative state of charge, the C__rate (current), and the temperature; a second LUT comprising selfdischarging rates dependent upon relative state of charge and temperature; and, a third LUT with residual capacity corrections dependent upon the discharging current rate and temperature which give the fraction of the full capacity which can be extracted from the battery under relaxed conditions after the battery has reached an end of discharge voltage condition at a given current rate.

Figure 13C:
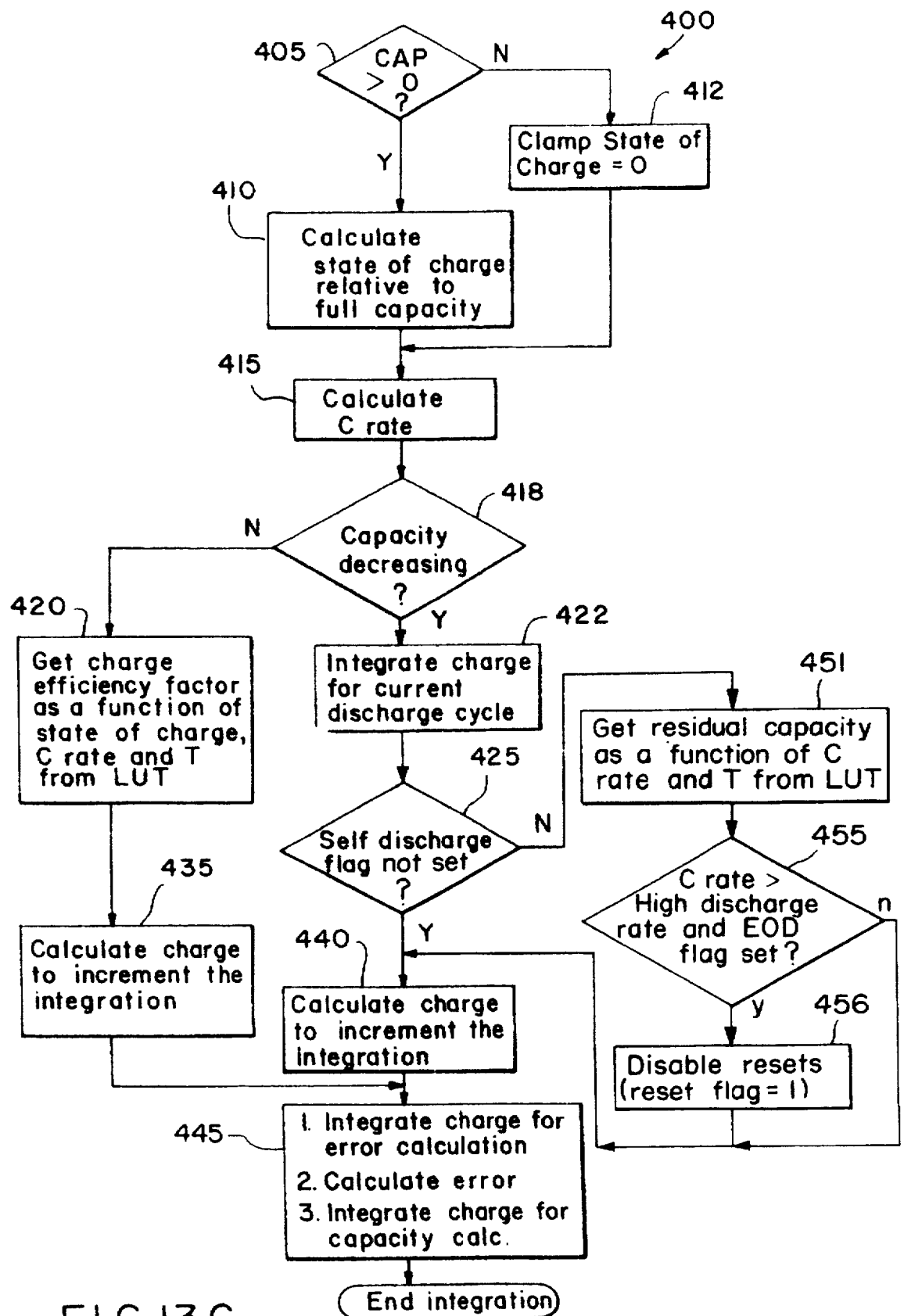
FIG. 13(c) illustrates the integration program 400 for calculating the amount of battery charge or discharge flowing into or out of its terminals.

The flow diagram for the current integration process 400 is shown in FIG. 13(c). As shown in FIG. 13(c) the first step of the current integration process is to determine the magnitude of the relative state of charge (soc). The soc is defined as the actual capacity expressed as a percentage of the full charge capacity (i.e., the capacity of the battery when fully charged) and is used to estimate the amount of charge remaining in the battery. Thus, as indicated at step 405, a determination is made as to whether the remaining capacity is greater than zero (0). If the remaining capacity Itf is a negative number, the full capacity is incorrect and must be learned and the soc value is clamped to zero (as indicated at step 412 in FIG. 13(c). Otherwise, the soc calculation will take place at step 410. As previously described, until the full charge capacity of the battery is learned, the full charge capacity is initialized as the design (nominal) capacity.

Next, as indicated at step 415 in FIG. 13(c), the C__rate is calculated. The C__rate is defined as the rate at which it would take the energy source to drain in one hour and is measured in units of reciprocal hours. The C__rate calculation in step 415 is based on the actual current value (I) and the present full charge capacity value and is additionally scaled. A determination is then made at step 418 as to whether the battery is in a capacity increasing or capacity decreasing (discharging) state. If the capacity is increasing, then the battery is being charged and the charge calculation must take into account a charge efficiency factor, made available in a LUT for charge efficiency, accessible by the microprocessor, as graphically represented in FIG. 22(c). Thus, at step 420 the charge efficiency factor dependent upon the charge current, relative state of charge (soc), and the temperature, is accessed. For instance, as shown in FIG. 22(c), when the battery is charged to approximately 95% of full capacity, and the current is being charged at a 0.1 C.__rate at a temperature of 45° C., the charge efficiency factor $\epsilon_c$ is found to be about 0.8. The charge efficiency factors are empirically derived and will vary depending upon the battery chemistry and battery architecture. The representations shown in FIG. 22(c) are for a battery state of charge 95% and it is understood that charge efficiency values will vary considerably depending upon (remaining capacity) state of charge.

Finally, the increase in charge for the current time interval taking into account the actual current and the charge efficiency factor is calculated at step 435 to form the term $\epsilon_c I_c \Delta t_c$ in equation (1).

This value will be used to increment the integration at step 445 as will be explained below.

If at step 418 it is determined that the capacity is decreasing, the amount of discharge will be integrated for the current discharge cycle as indicated at step 422 in FIG. 13(c). It is next determined at step 425 whether the self-discharge flag had been previously set (see step 175, FIG. 13(a)) indicating that the battery discharge current is less than 3 mA, and that only the self-discharging processes need to be considered. If the self-discharge flag bit has not been set, a charge calculation is made at step 440 to increment the integration. The final integration is accomplished at step 445 wherein the charge increment calculated at either step 435 or step 440 is added to the remaining capacity Itf, and, as indicated in equation (1). Additionally, at step 445, the charge is integrated for an error calculation and the running total of the error is also calculated as will hereinafter be discussed in detail.

If it is determined at step 425 that the self-discharge flag has been set (step 175), then the battery is selfdischarging without any external correct drain (step 175, FIG. 13(a)) and the residual capacity is calculated at steps 451 through 456. The first step of this routine is to determine the residual battery capacity value. This value, which is dependent upon the current C__rate and the temperature, is accessed at step 451 by the microprocessor from the look-up table depicted in FIG. 22(a). For instance, as shown in FIG. 22(a), at a temperature of −20° C. and a current drain of twice the C__rate, (2C), it has been empirically derived that approximately 92% of the full battery capacity will remain when the end of discharge voltage is reached. When applying a light load (e.g., C/10 discharge rate) at a temperature of about 23° C., virtually no residual capacity will remain when end of discharge voltage is reached.

At step 455, a determination is made as to whether the C__rate is greater than a high discharge threshold rate (preferably of __mAh) and whether End of Discharge flag (see step 262, FIG. 12) had been set. If not, then the capacity calculation at steps 440 and 445 is performed as described above. If the current discharge rate is higher than the high discharge threshold rate, then all of the capacity resets are disabled, as indicated at step 456, and the integration procedure continues at step 440.

During the operational state of the battery, whether the battery capacity is increasing (CI) or decreasing (CD), the end of charge conditions (EOC) and end of discharge (EOD) conditions, respectively, have to be observed. Therefore, the capacity calculation routine illustrated in FIGS. 13(a) and 13(b) continues by making a determination as to whether the battery is in a capacity increasing or capacity decreasing (resting or discharging) state, as indicated at step 198 in FIG. 13(b). If the capacity is increasing, then the routine for determining whether an End__Condition CI has been met as indicated at step 500. If the capacity is decreasing, then the routine for determining whether an End__Condition CD has been met as indicated at step 600.

Observation routine for capacity increasing end conditions

The microprocessor of the hybrid IC calculates a charge termination by one of three methods: a negative voltage slope greater than 10 mV/cell/min±5 m V/cell/min at a full charge voltage; a $\Delta T/\Delta t$ that exceeds 0.9°/min±0.2°/min, or a preferred calculated charge of 120% of full charge capacity (but may range from 100% to 150% of $CAP_{FC}$. The routine for determining if one of the EOC trigger conditions has been met is illustrated in the flow diagrams of FIGS. 14(a)-14(d).

Figure 14A:
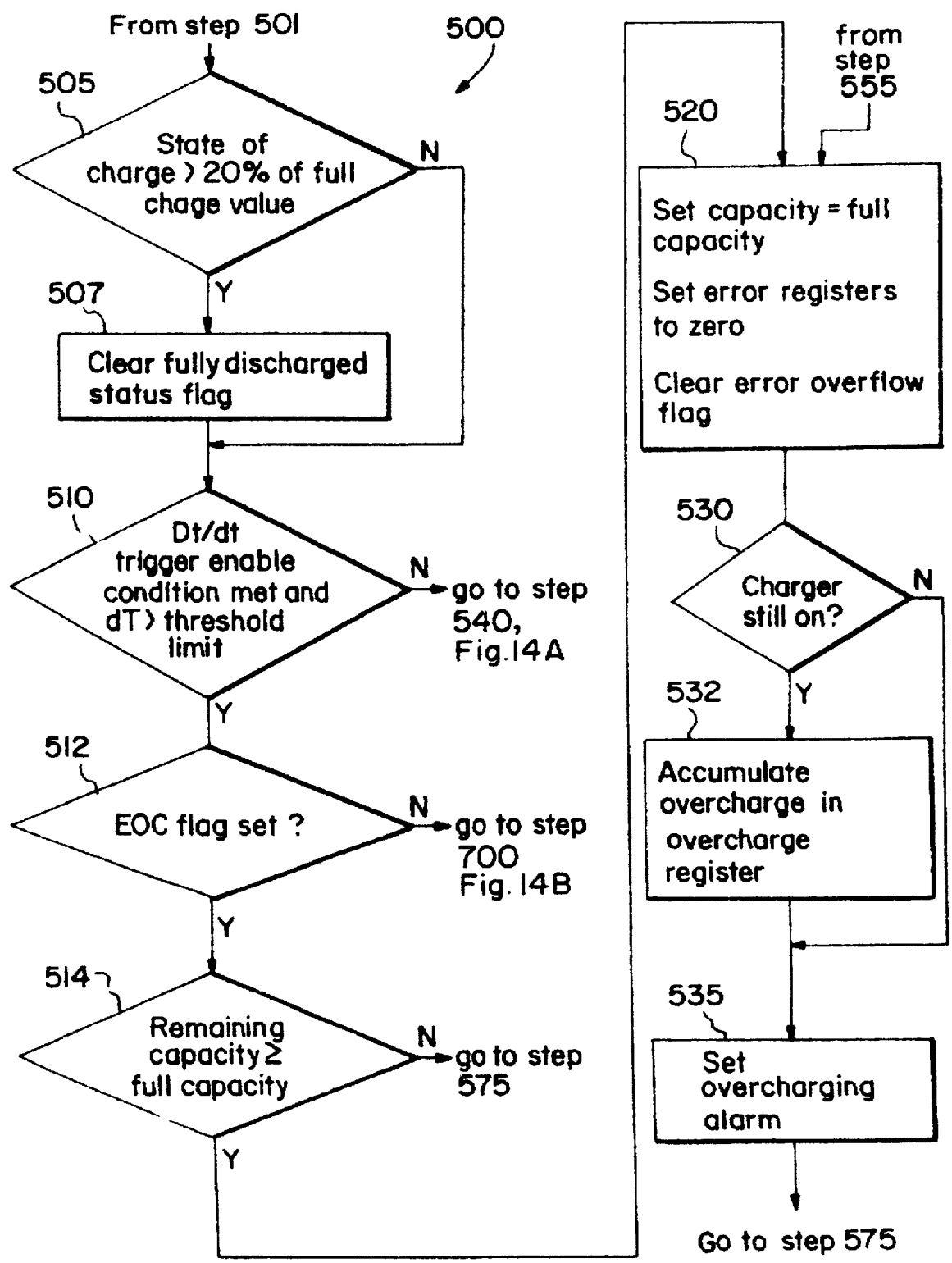
FIGS. 14(a) through 14(c) are flow diagrams illustrating the sequential processes 500 programmed in the microprocessor for determining battery end conditions when the battery is in a capacity increasing state.
Figure 14B:
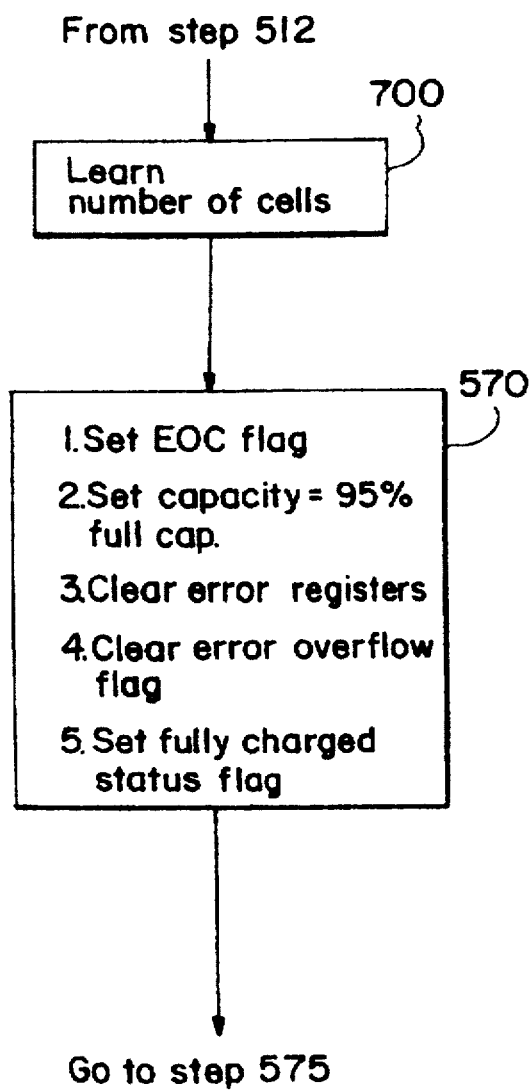

If it is determined that the capacity is increasing, then the first step 505 of the EOC (CI state) observation process 500 illustrated in FIG. 14(a), is a determination of whether the battery's relative state of charge (soc) value is greater than 20% of the battery's full charge capacity value. If the battery has attained that level of capacity, then the fully discharged status flag is cleared at step 507. As will be explained below, the fully discharged status flag is set when it is determined that the battery has supplied all the charge it can without being damaged. Until the battery reaches that capacity level, the FULLY_DISCHARGED status flag will remain set. Next, as indicated at step 510, the first EOC trigger detection method is performed. This first method is a determination as to whether the dT/dt trigger enable condition has been met, and, whether the slope of the temperature increase dT is greater than or equal to a threshold limit indicating an EOC condition. In the preferred embodiment, the dT/dt trigger enable condition is satisfied whenever the relative state of charge (soc) is above a 50% threshold limit, and, an end of charge condition is detected when the slope of the temperature increase becomes greater than a threshold of about 0.9° C./min. It should be mentioned that the slope of the temperature may trigger EOC when it is detected within the range from 0.5° C./min to 12° C./min. If either of these conditions are not satisfied, then a second method of detecting an EOC condition, namely, a detection of whether the slope of the voltage change, dU/dt, becomes negative wherein the value of dU/dt must have a minimum amount and the charging current rate (C_rate) must be greater than a certain value, is performed at step 540 as will be explained in further detail below. If the dT/dt trigger enable condition has been met and the slope of the temperature increase dT is greater than or equal to the EOC threshold limit, then a determination as to whether the EOC flag has been set is made at step 512. When the EOC flag has not been set, then the number of cells in the battery pack will have to be learned—a process indicated as element 700 in FIG. 14(b) to be described below. Whether or not the number of cells in the battery pack is learned (as will be explained below), at step 700, then step 570 is performed wherein: a) the EOC status flag is set; b) the remaining capacity is set equal to 95% of the full charge capacity; c) the error registers are cleared; d) the overflow flag for the uncertainty calculation is cleared; and, e) the fully charged status flag is set indicating that the battery has reached a charge termination point. Finally, the algorithm proceeds to step 575, shown in FIG. 14(c), where the terminate charge alarm flag is set.

If the dT/dt trigger enable condition has been met, the slope of the temperature increase dT is greater than or equal to the EOC threshold limit, and the EOC flag has been set (step 512), then a determination is made at step 514 as to whether the remaining capacity (ltf) is greater than or equal to the full charge capacity. If this condition is satisfied, then the remaining capacity is set to the full charge capacity as indicated at step 520. Additionally, at step 520, the error registers are cleared and the overflow flag for the uncertainty calculation is cleared. If the remaining capacity (ltf) is not greater than or equal to the full charge capacity (step 514) then the algorithm proceeds to step 575, shown in FIG. 14(c), where the terminate charge alarm flag is set. In the preferred embodiment, the terminate charge alarm flag must be set when the battery detects EOC on any of the EOC trigger conditions or when an over temperature condition exists, i.e., if T≧AL_HI_TEMP (step 222, FIG. 12). As explained above, the terminate charge alarm flag may already be set by the 95% full-trigger, which is initiated when the first temperature slope trigger condition is satisfied at step 510.

After the remaining capacity is set to the full charge capacity at step 520, the algorithm proceeds at step 530 to determine whether the battery charger is still on. This is accomplished by checking for a positive charge increase obtained during the charge integration process (see step 435, FIG. 13(c)). If the charger is still on, then it is known that the charger is continuing to overcharge the battery, and the algorithm must keep track of the amount of battery overcharge. Thus, at step 532 in FIG. 14(a), the total amount of overcharge is calculated by adding the charge increase to the overcharge registers (not shown).

It should be mentioned that the overcharge register is never reset, so that the total amount of overcharging since the system start-up is retained. Whether or not the battery charger is still on, the algorithm proceeds to step 535 where the overcharging alarm status flag is set indicating that the battery is being charged beyond an EOC indication. Finally, the algorithm proceeds to step 575, shown in FIG. 14(c), where the terminate charge alarm flag is set.

Figure 14C:
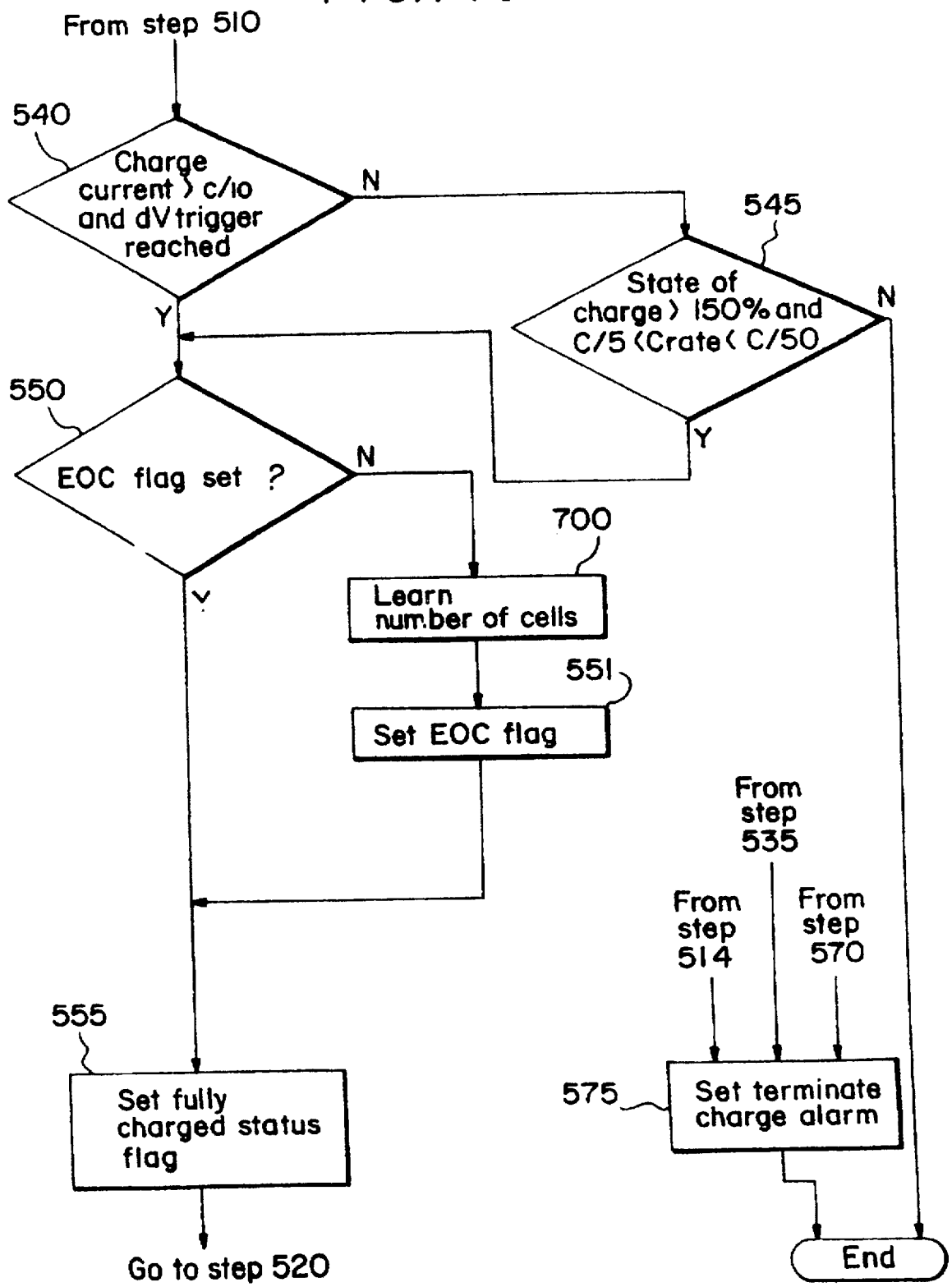

As mentioned above with respect to step 510, if either the dT/dt trigger enable condition has not been met, or, the slope of the temperature increase dT is not greater than or equal to the EOC threshold limit, then a second method of detecting an EOC condition is performed at step 540 shown in FIG. 14(c). At step 540, a determination is made as to whether: a) the charge is constant current, i.e., whether the difference between the current value and the average current value for one (1) minute is preferably less than 50 milliamps; b) whether the dU/dt voltage change is negative and is greater than a threshold amount of preferably 12 mV/m; and, c) whether the charge current is greater than a predetermined rate, preferably, a rate of C/10. If either of the second method EOC trigger conditions are not satisfied, then a third method of detecting an EOC condition, namely, a detection of whether the relative state of charge (soc) is above 120% and the current rate is between C/50 and C/5 is performed at step 545. It should be mentioned that the EOC condition may be triggered when the relative state of charge (soc) is detected within the range of 100% to 160%. If all of the second method EOC trigger conditions are satisfied, or, if all of the third method EOC trigger conditions are satisfied, then a determination as to whether the EOC flag has been set, is made at step 550 in FIG. 14(c). If either the second method EOC trigger conditions or third method EOC trigger conditions are satisfied, and the EOC flag has been set (step 550), then the fully charged status flag is set at step 555 indicating that the battery has reached a charge termination point. Afterwards, the process proceeds at step 520, FIG. 14(a), by clamping the remaining capacity value to the full charge capacity value as described above. If the EOC flag has not been set, then the number of cells might have to be learned—a process indicated as element 700 to be described below. When the process of learning the amount of cells in the battery is complete, then the EOC status flag will be set at step 551, and the fully charged status flag is 30 set at step 555 indicating that the battery has reached a charge termination point and the algorithm continues at step 520 described above. If all three EOC trigger conditions are not satisfied, then the EOC detection procedure 500 is exited and the capacity calculation (FIG. 6(b)) continues.

Alternately, a −dU trigger condition will be reached when it is determined that the battery capacity is increasing, dU>DU_MIN, where DU_MIN is a predetermined value equal to the number of battery pack cells multiplied by 10 mV, and the current is determined to be constant and the charge rate is higher than 0.3 C. The charge current is considered constant if |I−I_avg|<50 mA and |I−I$^{-1}$|<50 mA where I$^{-1}$ was the previous value of the current measurement. The constancy of the battery charging may be calculated in addition to, or, in place of steps 250 et seq. of the IUT calculation routine FIG. 5(b), where the method of calculating −dU may be accomplished without time dependency.

Learn number of cells routine

As described above, an emergency power-down condition may occur wherein all RAM contents are lost. In such a situation, it may be necessary to relearn the number of cells in the battery pack. Rather than burning in the number of cells for a particular battery module in the ASIC ROM, the number of cells may be learned to enable the ASIC to be configured with other battery packs having a different number of cells. The relearning of the number of cells is indicated by a bit (CALIBRATED bit) in the AL_STATUS register, which will indicate whether the number of battery cells has to be relearned. In the preferred embodiment, it is easily accomplished by utilizing the voltage measured at the battery pack terminals after an EOC condition, described above, is met.

The first step 705 in the learn number of cells procedure 700 shown in FIG. 14(d), is t o determine whether the battery pack is uncalibrated, i.e., whether the CALIBRATED bit in the AL_STATUS register indicates that the number of cells should be learned. If so, it is determined at step 710 whether the converted voltage value, U (mV), measured at step 210, FIG. 5(a) during the IUT calculation procedure, is greater than 11 volts. If so, then it is concluded that the battery pack has nine (9) cells and the number of cells is set at nine in step 720. If the measured voltage value, U, is not greater than 11 volts, then a determination is made at step 715 as to whether the voltage is greater than 7.5 volts. If so, then it is concluded that the battery pack has six (6) cells and the number of cells is set at six in step 725. If the measured voltage value, U, is not greater than 7.5 volts, then it is concluded that the battery pack has four (4) cells and the number of cells is set at four in step 730. After the number of cells is determined, the EOD cutoff voltage, Uempty, is set equal to the number of cells multiplied by the operating battery voltage of 1.02 Volts in the preferred embodiment as indicated at step 740 in FIG. 14(d).

Observation routine for capacity decreasing end conditions

Figure 15A:
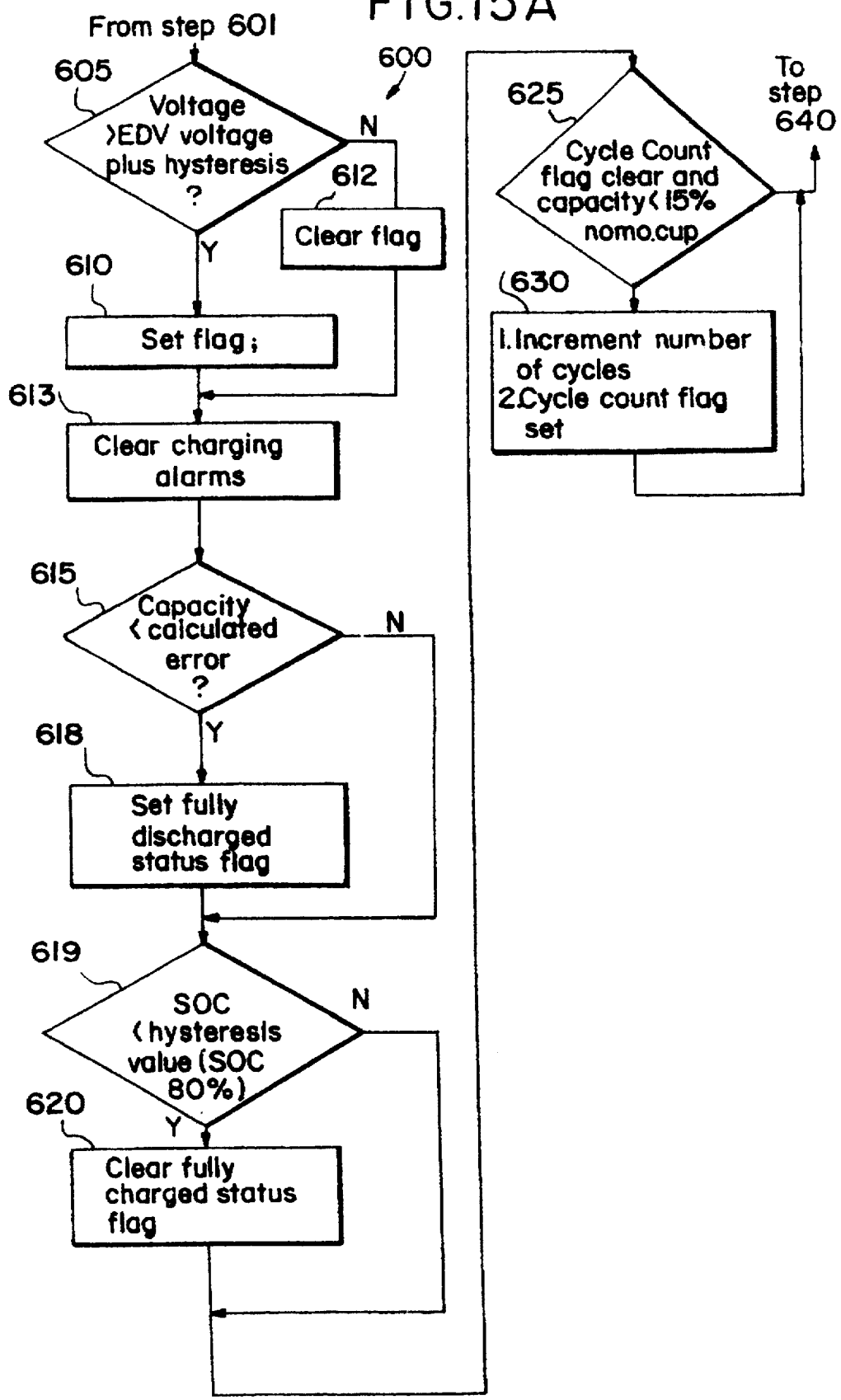
FIGS. 15(a) and 15(b) are logic flow diagrams illustrating the sequential processes 600 programmed in the microprocessor for determining battery end conditions when the battery is in a capacity decreasing state.
Figure 15B:
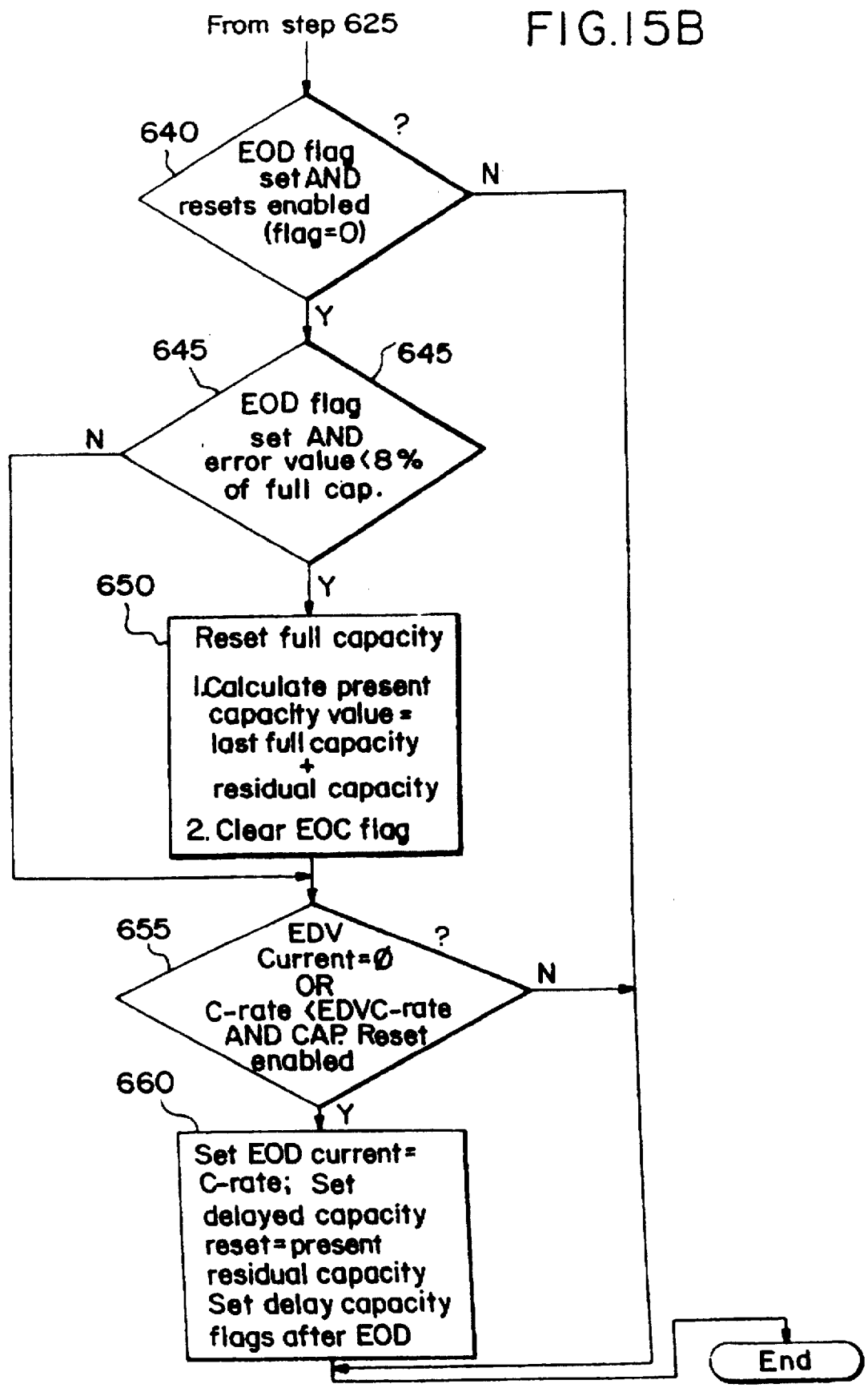

As previously mentioned, the capacity calculation routine 151 at step 198 makes a determination as to whether the battery is in a capacity increasing or capacity decreasing (resting or discharging) state. If it is determined that the capacity is decreasing, then the first step 605 of the EOD (CD state) observation process 600 illustrated in FIGS. 15(a) and 15(b), is a determination of whether the present voltage measurement (U) is greater than the end of discharge voltage (EDV) and any hysteresis. When the EDV voltage is reached, it is an indication that discharging should be stopped to save the battery from damage. Typically, the EDV is 1.02 V/cell. If the voltage obtained is greater than the EDV voltage, then a flag indicating that the voltage is greater than the EDV voltage plus hysteresis is set at step 610. If the voltage is not greater than the EDV voltage plus hysteresis, then the flag is cleared at step 612. Additionally, as indicated at step 613, since the capacity is decreasing, the Terminate Charge Alarm and Over Charging Alarm flags are cleared.

A determination as to the value of the remaining capacity (Itf) is made at step 615, where it is determined whether the remaining capacity is less than the calculated error (i.e., the uncertainty capacity). If the remaining capacity is less than the calculated error, then this is an indication that the battery pack has no more capacity and is fully discharged. Consequently, the FULLY_DISCHARGED status flag is set at step 618 and the process continues at step 619. If there is remaining capacity, then the FULLY_DISCHARGED flag is not set, and the process continues at step 619 where a determination of the relative state of charge is made. If the relative state of charge (soc) has dropped below some hysteresis value, preferably, about 80% of the full charge capacity, then the FULLY_CHARGED status flag is cleared, as indicated at step 620. Whether the FULLY_CHARGED status flag is cleared or not, the process continues at steps 625 and 630, where the cycle count number is updated. At step 625, a determination is made as to whether a cycle count flag is cleared, and, whether the capacity has decreased by 15% of nominal capacity. If these two events of step 625 have occurred, then the cycle count register, containing a value of the number of times the battery has been charged or discharged (not shown), will be incremented at step 630 and the cycle count flag will be set. It should be understood that in the preferred embodiment, the cycle count will be incremented whether or not the battery has been fully or partially charged. Whether the cycle count flag is incremented or not, the process continues at step 640, where a check is made as to whether the EOD flag is set, and, whether the reset flag is clear. If either the EOD flag is not set, or, the reset flag is not clear, then the end condition observation routine 600 is exited. If the EOD flag is set, and, the reset flag is clear, then a determination is made at step 645 as to whether the EOC (end of charge) flag has been set and whether the error value (uncertainty capacity) is less than 8% of nominal capacity. If these conditions are satisfied then the full charge capacity value is learned at step 650. Specifically, whenever the battery has performed a full cycle reaching an EOC trigger point and the EOD point and the uncertainty capacity is below 8% of the nominal capacity, the full charge capacity is reset at step 650 with the formula:

$$full\_cap = full\_cap + full\_cap * pd/256 - ltf$$

where "pd" is the predicted residual capacity correction value accessed from the look-up table of FIG. 22(a) and is dependent upon the discharging current rate and temperature. The divisor 256 provides for an integer scaling of pd. The meaning of the formula is to exchange the remaining capacity (ltf) by the residual capacity from the LUT table, which contains fractions of the full charge capacity (Note: the residual capacity obtained is calculated from step 451 of the charge integration process of FIG. 13(c)). If the EOD point is reached with less capacity output as in the former cycle, the amount of ltf (remaining capacity) will be higher at EDV (less discharged capacity compared with the accumulated charged capacity). The full charge capacity will be reduced by the difference of ltf compared with the former cycle so that the ageing of the battery is taken into account by this learning step. If the battery is used in several partial charge/discharge cycles without reaching an EOC or EOD point, the error of the calculation can accumulate to a heavy difference between the real capacity and the calculated remaining capacity (ltf). The algorithm (MaxError( )), to be explained in detail below, calculates the maximum possible error (uncertainty) during its operation as precise as the capacity integration itself on the base of a percentile error for each operating mode. The uncertainty is reset to zero at each EOC and EOD point. An uncertainty of above 8% disables the full capacity reset. Additionally, when the conditions at step 650 are satisfied, the EOC flag is cleared indicating that the full charge capacity has been reset. After the full charge capacity is reset (step 650), or, if it is determined that the uncertainty error is greater than the prespecified value of 8%, or, the EOC flag is not set, then the algorithm continues at step 655.

At step 655, a determination is made as to whether the C_rate at the EDV (end of discharge voltage) trigger is equal to zero, or, whether the present C_rate is less than the C_rate at the EDV trigger, and, whether the capacity reset is not disabled. If either of these conditions are satisfied, the present current at the EOD trigger is set equal to the present C_rate, the delayed capacity reset value is set equal to the present residual capacity value, and, the flags to delay capacity reset after EOD are set at step 660. Else, if both of the conditions of step 655 are not met, then the end conditions observation routine 600 is exited. As indicated in FIG. 13(b) of the capacity calculation routine 151, if the EOC and EOD triggering has not occurred, then the capacity calculation is exited.

System management bus and bus interface

As described above, and as shown in FIGS. 2(a) and 2(b), a modified Phillips I²C bus interface is used by the battery module 28 to communicate within a configuration comprising the ASIC 32 and the battery 10, a host computer 16, and a smart charger 22. As mentioned previously, requests are either from the host computer to the battery, from the charger to the battery, or, from the battery to either the host or charger. An example of a typical communication between the battery and the charger may be to switch the charger on and off, or, to demand a certain charging rate. The host computer may request information of the battery such as the battery state, or, the battery alarm conditions such as minimal capacity, or, overtemperature. The bus interface control circuit 75 controls all requests and alarm conditions via two serial ports SMBCLK and SMBDATA over the system management bus.

When the battery 10 needs to inform the host of an alarm condition or to inform the battery charger about its desired charging voltage or current, the battery acts as a bus master with write function capabilities. The battery will function to: evaluate the request from the µP 50; check if the system management bus is free; generates a start bit and sends the address of the battery charger or host; checks whether the ACK-bit has been sent from the charger or host and gives a message to the µP; sends the data supplied from the µP on the bus and checks for ACK bit; generates a stop-bit at the end of the transfer.

Figure 16:
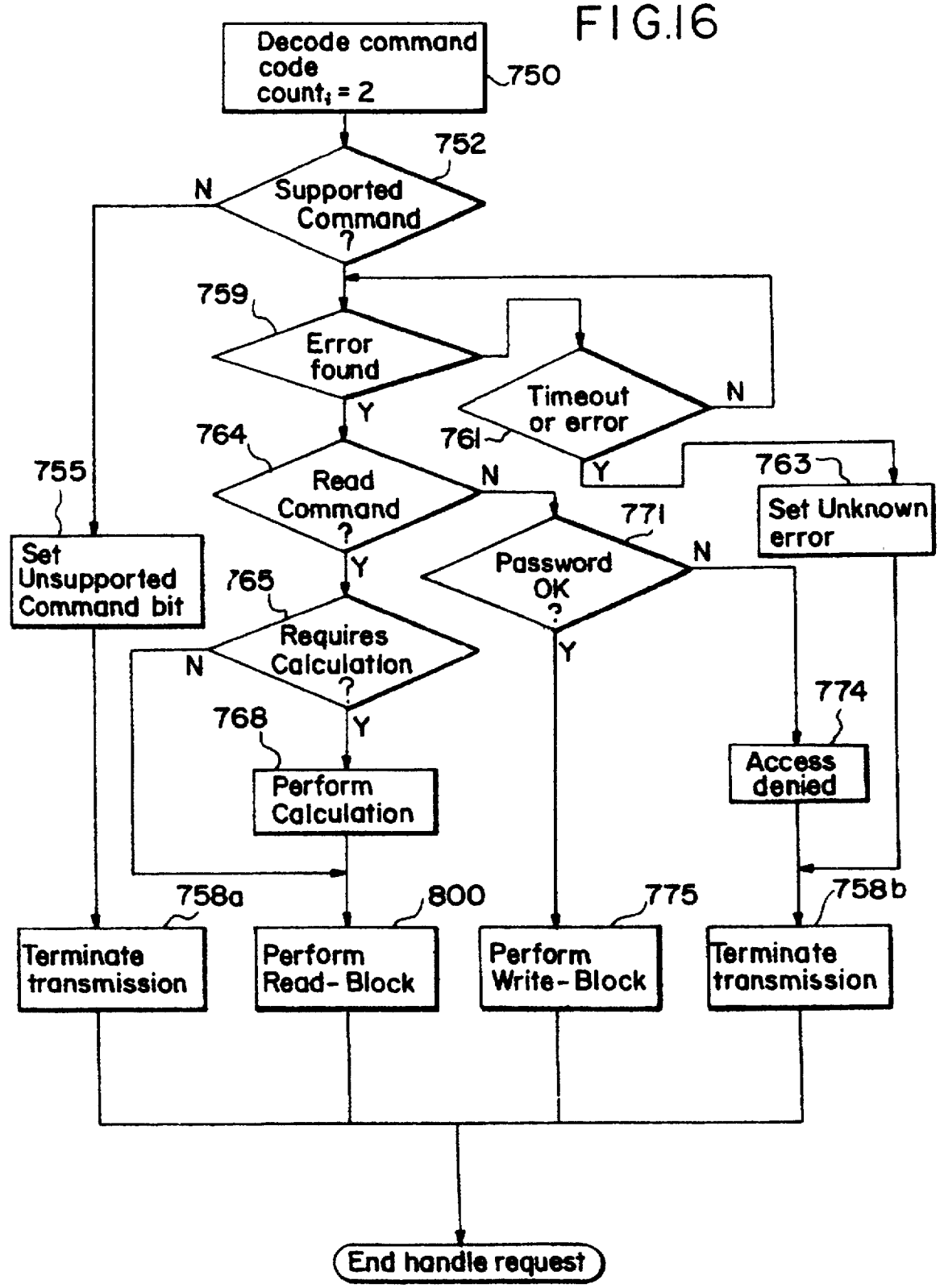
FIG. 16 illustrates a logic flow diagram of the handle request routine that is invoked when there is communication between the smart battery and the host computer or battery charger.

When the battery 10 is requested by the host to provide it with information to be explained below, the battery acts as a bus slave with read and write capabilities. For instance, during the steady-state operation, the host might request some information from the battery and will formulate a request. FIG. 16 illustrates the software algorithm compatible with the system management bus interface protocol for providing communication between an external device (host PC or battery charger), and the battery, which acts as a slave thereto.

Specifically, the first step 750 in FIG. 16, is to decode the command code that has been sent by the external device. Illustrative command codes are discussed hereinbelow, and each typically requires two bytes of data to be transmitted which is indicated as the variable "count". The next step, indicated as step 752, is to determine whether the command code sent is a valid, recognizable command word. If not, a unsupported command bit is set at step 755 and the transmission will be terminated as indicated at step 758a in FIG. 16. If the command is supported, the battery will perform an internal check to determine if an error has occurred at step 759. If an internal error is found, then the algorithm will enter a timer loop which will keep checking the internal flag until an error is confirmed or the timer (not shown) times out. This is indicated at step 761. If a correct value is found at step 759, then the algorithm will continue at step 764 to determine if the decoded command code calls for a read or write function. If the timer has timed out, or, an error is confirmed at step 761, then an unknown error flag is set at step 763 and the software transmission is terminated at step 758b.

When functioning as a slave, the battery will perform either read or write functions. At step 764, a determination is made as to whether the command code input (step 750) is a read or write command. If it is a read command, a determination is made at step 765 as to whether the battery is to perform a calculation as requested by the external device and return a value to be read by the external device. Examples of calculations made by the battery in response to a query (for e.g., AvgTimeToEmpty( )) from a host device are described in greater detail below. The battery µP will proceed to perform the calculations at step 768 and will return a data value to a specified address location as indicated by the read block routine at step 800 and explained in detail below. If it is determined at step 765 that a calculation is not to be performed, (for e.g., only a voltage value is requested) then the algorithm will proceed directly to the read block routine 800 as shown in FIG. 16.

If, at step 764, it is determined that a write function is to be performed wherein a data value is to be written to the battery address location from an external device, (for e.g., the AL_REM_TIME threshold value), then a write block authorization check must be performed to determine if the external device may perform the write function. This is indicated at step 771 where a password is checked for validity. If the password checked is not an authorized password, then access will be denied as indicated at step 774, and the external device will not be able to perform the write function and will terminate the software transmission at step 758b. If the external device is authorized to write data to a battery address, then the device will write a data value to pre-specified address locations, as indicated by the write block routine at step 775 to be explained in detail below.

Host to Smart Battery Communication

A host to smart battery communication transfers data from the battery to either a user (of a host PC, for e.g.), or, the power management system of an external device. A user can get either factual data, such as battery characteristic data, (Voltage( ), Temperature( ), charge/discharge Current( ), AverageCurrent( ) etc.), or, predictive (calculated) data such as the battery's remaining life at the present rate of drain, or, how long it will take to charge the battery. It should be mentioned that a real load, e.g., a host PC monitor, has a constant power consumption. When remaining time values described below are calculated (using the assumption that the currents are constant), errors and inaccuracies may occur. Thus, it should be considered to assume a constant power consumption of the load when calculating the remaining time and other variables. Thus, in the following calculations such as RemainingCapacityAlarm( ), AtRate( ), RemainingCapacity( ), FullChargeCapacity( ), and DesignCapacity( ) . . . . , average power values may be utilized as an alternative to average current values.

The following control commands are representative of battery supplied information when queried by a host device or host PC:

The RemainingCapacity( ) function returns the battery's remaining capacity and is a numeric indication of remaining charge. Depending upon the capacity mode bit, the RemainingCapacity( ) function will return a value in mAh or 10 mWh. The value returned is calculated as follows:

$$|tf|mAh|-|tf\_err|mAh|$$

where the uncertainty error Itf_err is the subtracted value and the output value is set at 0 if (|Itf|<|Itf_err|).

The RemainingCapacityAlarm( ) function sets or retrieves the low capacity threshold value AL_REM_CAP (described above) for the low capacity alarm value stored in RAM. When the RemainingCapacity( ) falls below the AL_REM_CAP value, the battery sends Alarm Warning( ) messages to the host with the REMAINING_CAPACITY_ALARM bit set. At manufacture, the AL_REM_CAP value is set to 10% of design capacity and will remain unchanged until altered by the RemainingCapacityAlarm( ) function. This function is used by any host system that desires to know how much power it will require to save its operating state. It enables the host system to more finely control the point at which the host will transfer to a low power mode.

The RemainingTimeAlarm( ) function sets or retrieves the AL_REM_TIME alarm value. When the estimated remaining time at the present discharge rate as calculated by the AverageTimeToEmpty( ) function falls below the AL_REM_TIME value, the battery sends Alarm Warning( ) messages to the host with the REMAINING_TIME_ALARM bit set. An AL_REM_TIME value of zero (0) effectively disables this alarm and the value is initialized to 10 minutes at time of manufacture. The FullChargeCapacity( ) function returns the predicted or learned battery pack capacity when it is fully charged and is expressed either in current (mAh or 10 mWh) depending upon the setting of the CAPACITY_MODE bit (discussed below). The DesignCapacity( ) returns the theoretical capacity of a new battery pack which when compared with the value returned by the FullChargeCapacity( ), will provide an indication of the battery wear. This information is useful by a host device or host PC to adjust its power management policy.

The AtRate( ) function is the first half of a two-function call-set used to set the AtRate value used in calculations based on capacity made by the AtRateTimeToFull( ), AtRateTimeToEmpty( ), and, AtRateOK( ) functions.

When the AtRate value is positive, the AtRateTimeToFull( ) function returns the predicted time, preferably in minutes, to fully charge the battery at the AtRate value of charge (value is in mA or 10 mW). The calculation formula is governed by equation:

$$time: = 60 * \frac{(full\_cap[mAh] - Itf[mAh])}{|AT\_RATE|}$$

where "time" is the returned value in minutes.

The AverageTimeToFull( ) function returns the predicted remaining time in minutes until the battery is full if a current like the last minute rolling average, I_avg, value is continued. The calculation formula is governed by equation:

$$time: = 60 * \frac{(full\_cap[mAh] - Itf[mAh])}{I\_avg}$$

where "time" is the returned value in minutes.

When the AtRate value is negative, the AtRateTimeToEmpty( ) function returns the predicted operating time, preferably in minutes, at the AtRate value of battery discharge, until the battery will be exhausted (EDV condition). The calculation formula is governed by equation:

$$time: = 60 * \frac{(Itf[mAh] - full\_cap[mAh] * pd\_at\_rate/256 - Itf\_err[mAh])}{|AT\_RATE|}$$

where "time" is the returned value in minutes, |AT_RATE| and pd_at_rate values are calculated by the AtRate( ) function where pd_at_rate represents the remaining capacity (fraction of full_capacity) and is divided by the value of 256 to scale that value to a fraction. Itf_err is the uncertainty error as explained below.

When the AtRate value is negative, the AtRateOK( ) function returns a Boolean value that predicts the battery's ability to supply the AtRatevalue of additional discharge energy for 10 seconds, i.e., if the battery can safely supply enough energy for an additional load after the host PC sets the AtRate value.

The RunTimeToEmpty( ) function returns the predicted remaining battery life at the present rate of discharge (minutes) and is calculated based on either current or power depending upon the setting of the CAPACITY_MODE bit (discussed below). The value returned by this function can used by the host PC or device power management system to get information about the relative gain or loss in remaining battery life in response to a change in power policy. The calculation formula is governed by equation:

$$time: = 60 * \frac{(Itf[mAh] - full\_cap[mAh] * pd/256 - Itf\_err[mAh])}{|I|[mA]}$$

where "time" is the returned value in minutes and takes into account the remaining capacity in the battery after EDV which can be get out only by reduction of the load; |I| is the current, pd:=pd(C_rate(|I|, T) and is calculated in the capacity calculation algorithm pd represents the remaining capacity (fraction of full_capacity). This value is divided by 256 to obtain a fraction. Itf_err is the uncertainty error as explained below.

The AverageTimeToEmpty( ) function returns a one-minute rolling average of the predicted remaining battery life (in minutes) and is calculated based on either current or power. This function provides an averaging of the instantaneous estimations, thereby ensuring a more stable display of state-of-charge information. The calculation formula is governed by equation:

$$time: = 60 * \frac{(Itf[mAh] - full\_cap[mAh] * pd\_avg/256 - Itf\_err[mAh])}{I\_avg[mA]}$$

where "time" is the returned value in minutes, I_avg is updated every 0.5 sec, pd_avg:=pd(C_rate(I_avg), T) and is calculated in the alarm_control routine one cycle before and represents the predicted residual capacity (fraction of full_capacity). This value is divided by 256 to obtain a scale fraction. Itf_err is the uncertainty error as explained below.

Figure 23A:
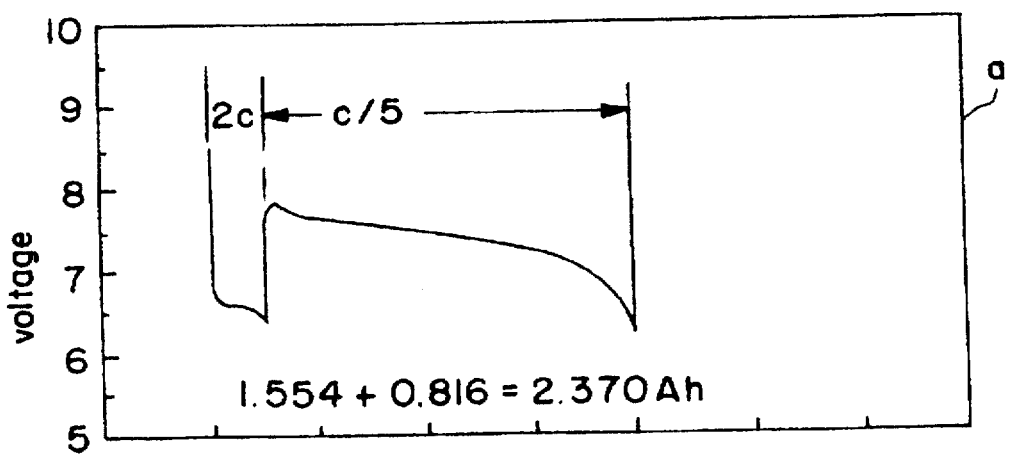
FIG. 23 illustrates two voltage versus time graphs, a and b, comparing calculated battery capacity characteristics at various discharging current rates for a six (6) cell battery pack.
Figure 23B:
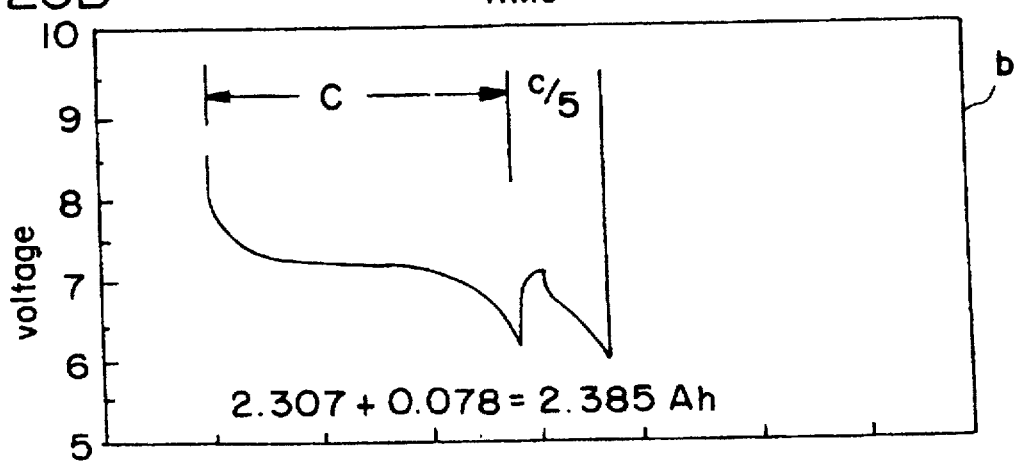

FIG. 23 illustrates two voltage versus time graphs, a and b, comparing calculated battery capacity characteristics at various discharging current rates for a six (6) cell battery pack. As shown in FIG. 23, graph a, the voltage will rapidly decrease to an end of discharge condition in a short amount of time when a load amounting to a discharge rate of 2 C and yielding approximately 1.554 Ah (amperehours) is applied to the battery. When the load is significantly decreased to a C/5 discharge rate, the battery pack voltage will rise to extend the life of the battery for an amount of time to yield another 0.816 Ah. Graph b, which is of a different time scale than graph a, shows that discharge at the C_rate will yield approximately 2.307 Ah. When that load is lightened to one half the C_rate, the battery voltage will increase slightly and the battery life can be predicted to extend for an amount of time to yield another 0.078 Ah until end of discharge voltage is reached.

As discussed above, certain calculations are dependent upon the value of the uncertainty capacity, i.e., the maximum possible error obtained during the capacity calculations. The MaxError( ) function returns the actual uncertainty in the capacity calculation in percentage. A MaxError( ) output of 20% means that the real value may be between 10% below and 10% above the internally calculated capacity. Most of the calculations in the system management bus interface already subtract the uncertainty error, so that the error will be −0/+MaxError( )%. The uncertainty is set to zero on EOC and EOD conditions by the capacity algorithm as explain ed above. The calculations performed are as follows:

$$Itf\_err := \frac{Itf\_err\_C\_D * EPS/256 + Itf\, err\, S * EPS\, S}{256}$$

$$max\_error := 2 * 100 * Itf\_err[mAh]/full\_cap[mAh]$$

where Itf_err_C_D is the always positive accumulated charge during the charging and discharging mode; Itf_err_S is the accumulated charge of the self_discharging process. Because of the permanent presence of selfdischarging, even while charging, this accumulation is done all the time using the LUT dependency from relative state of charge (soc) and temperature. Both accumulators are reset to zero at EOC and EOD condition. EPS is the error fraction of the capacity calculation—especially from the LUT and from A/D measurement—while charging or discharging, with the scaling factor 256 applied. EPS_S is the error for selfdischarge-charge integration as fraction. The uncertainty will grow undesirable if the battery will not be fully or discharged over several cycles and the learn mode of the full capacity will be disabled.

The CycleCount( ) function returns the number of charge/discharge cycles the battery has experienced. The cycles count on each charge decrease with the amount of 15% of the design capacity after the last recharging, which needs not to be a full charging.

Other registers contained in the DBOS memory scheme is the BatteryMode( ) register which is used to select the battery's various operational modes. For instance, the BatteryMode( ) register is defined as containing a CAPACITY_MODE bit which is set to specify whether capacity information is to be broadcast in units of mAh or mWh (milliwatthours). This bit allows power management systems to best match their electrical characteristics with those reported by the battery. For example, a switching power supply is best represented by a constant power model, whereas a linear supply is better represented by a constant current model. Additionally, the BatteryMode( ) register contains a CHARGER_MODE bit which is set to specify whether charging voltage and charging current values are to be broadcast to the smart battery charger 22 (FIG. 1) when the smart battery requires charging. This bit allows a host PC or battery charger to override the smart battery's desired charging parameters by disabling the smart battery's broadcast of the charging current and charging voltage.

Another function calculated on the basis of capacity is the BatteryStatus( ) function which is used by the power management system of a host device or PC to get alarm and status bits, as well as error codes from the battery status register. This function returns the battery's status word flags including alarm warning bits such as OVER_CHARGED_ALARM, TERMINATE_CHARGE_ALARM, DTEMP_ALARM, OVER_TEMP_ALARM, TERMINATE_DISCHARGE_ALARM, REMAINING_CAPACITY_ALARM, and, REMAINING_TIME_ALARM and status bits including INITIALIZED, DISCHARGING, FULLY_CHARGED, and, FULLY_DISCHARGED.

Ancillary functions that the battery 10 is capable of performing include: the SpecificationInfo( ) for providing the version number of the smart battery specification the battery pack supports; the ManufactureDate( ) for providing a system with information that can be used to uniquely identify a particular battery; the Serial Number( ), which provides information for identifying a particular battery; the ManufacturerName( ) function returns the name of the smart battery's manufacturer; the DeviceName( ) function returns a character string that contains the battery's name; the DeviceChemistry( ) returns a character string that contains the battery's chemistry; the ManufacturerData( ) function which allows access to the manufacturer data (e.g., lot codes, number of deep cycles, discharge patterns, deepest discharge, etc., contained in the battery.

Write Block Routine

Figure 17:
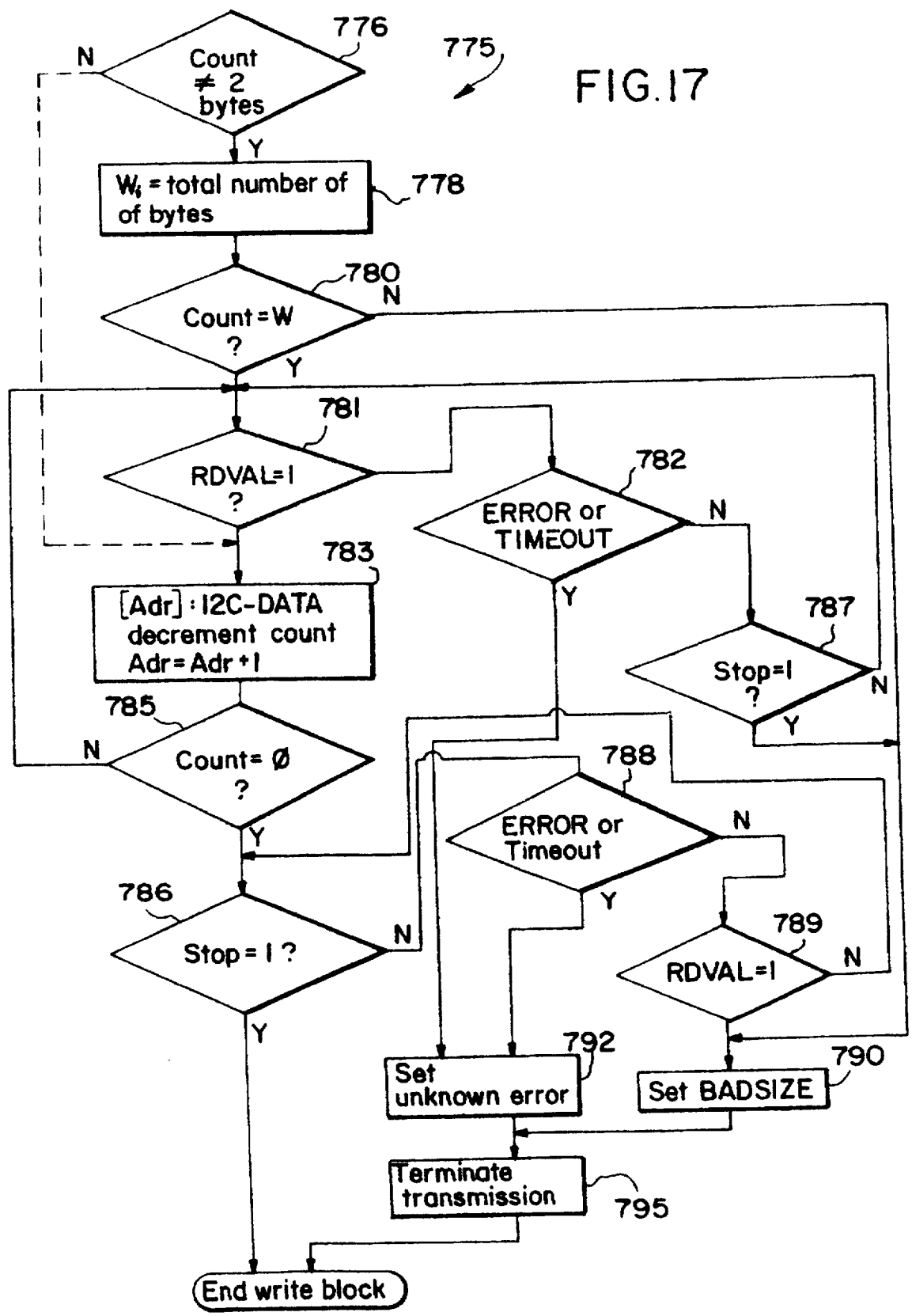
FIG. 17 illustrates a detailed logic flow diagram of the write block routine for writing data to the smart battery.

As mentioned above, the battery may receive data from an external device to be used in a control command calculation, or, as an alarm threshold value. The write block 775 illustrated in FIG. 17, controls this transfer of data to the battery. First, at step 776, a determination is made as to whether the data value to be read from the external host device is greater than two bytes long. In the preferred embodiment, most control commands will write a data value to the battery that is two bytes long. If the data is longer than two bytes, i.e., if count>2, then the variable "w" is set equal to the number of address locations allocated for and corresponding to length of data in number of bytes at step 778. Then, at step 780, a determination is made as to whether the previously determined count value has been set equal to the address locations allocated. If this is not the case, then an error flag is set at step 790 indicating that an inordinate amount of data is to be sent, or, that there is not enough locations allocated for receiving the data. If the previously determined count value "count" has been set equal to the number of address locations allocated, then the program enters a loop indicated as steps 781, 783 and 785 wherein each byte of data is sequentially written to the I$^2$C bus to the battery address location [Adr] (step 783). After each byte is sent, the count of the number of bytes is decremented and the address location for the next sequential data byte to be written is incremented. Until count=0, indicating that the last byte of data has been transmitted to the battery as shown at step 785, the loop will continue and enter at step 781 to determine if the battery has read each data byte (RDVAL=1) sent by the external device and indicating that the data byte has been successfully transmitted. If the read acknowledge flag has been received after each byte transfer, the loop continues at step 783 until the last data byte is sent. If the read acknowledge flag has not been received, then an error may have occurred and the program proceeds to step 782 where a determination is made as to whether a bus error or timeout has occurred. If none of these instances has occurred, then the program will proceed to step 787 to determine if the bus master has terminated the transmission. If the bus master has terminated the transmission, then an error flag is set at step 790 indicating that an inordinate amount of data is being transmitted and the transmission will be terminated at step 795. If the bus master has not terminated the transmission, then the system will continue to look for the RDVAL flag until an internal handshake timer (not shown) times out (step 782) and an unknown error flag is set and the transmission will be terminated, as shown at steps 792 and 795. In view of FIG. 17, it is understood that in some cases, a fixed two-byte data word is to be read, as indicated at step 776, and the algorithm will proceed directly to step 783 where the first data byte is read by the battery at the first battery address location.

After the last data byte has been received, as indicated at step 786, a determination is made as to whether the stop bit flag has been received from the modified I²C bus master indicating the end of bus control due to the fact that the external device will not be sending any more data. If the stop bit is received the write block routine is exited. If the stop bit has not been received, then an error may have occurred and the program proceeds to step 788 where a determination is made as to whether a bus error or timeout has occurred. If an error or timeout has occurred, then the program will proceed to set an unknown error flag and the transmission will be terminated, as shown at steps 792 and 795. If none of these instances has occurred, then the program will proceed to step 789 to determine if the RDVAL flag has been set to indicate if the last data byte has been successfully read. If it has been successfully read, then this is an indication that the external device has not finished sending data or that not enough address locations have been allocated and an error flag will be set as shown at step 790 and the transmission will be terminated at step 795. If the last data value has been successfully read at step 789, then the process will continue to look for the modified I²C bus master stop bit at step 786 until either an internal handshake timer (not shown) times out or an error occurs (step 788).

Read Block Routine

Figure 18:
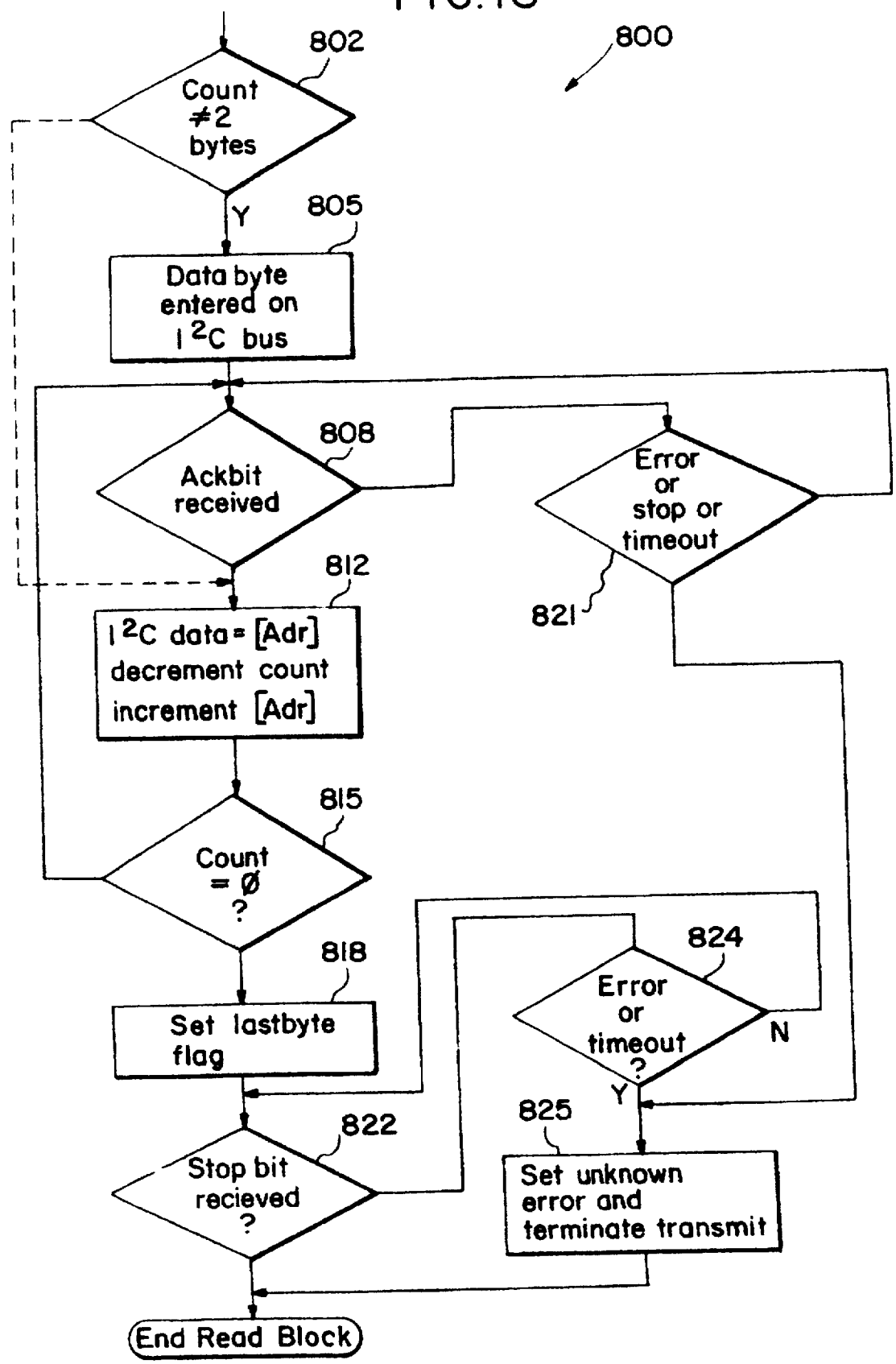
FIG. 18 illustrates a detailed logic flow diagram of the read block routine for reading data from the smart battery.

As mentioned above, the battery will return a calculated or measurement data value to a specified address location as indicated by the read block routine 800 as illustrated in FIG. 18. At step 802, a determination is first made as to whether the data value to be written to the host device is greater than two bytes long. If the data is longer than two bytes, i.e., if count>2, then the address is pointed to at step 805 and the program enters a loop indicated as steps 808, 812, and 815 wherein each byte of data is sequentially written to the SMBus bus to an address location of the requesting host device as indicated at step 812. After each byte is sent, the count of the number of bytes is decremented and the address location for the next byte to be written is incremented. Until count=0, indicating that the last byte of data has been transmitted to the external device as shown at step 815, the loop will continue and enter at step 808 to determine if the acknowledge bit has been sent by the external device indicating that the current data byte has been successfully transmitted. If the acknowledge bit has been received after each byte transfer, the loop continues at step 812 until the last data byte is sent. If the acknowledge bit has not been received, then an error may have occurred and the program proceeds to step 821 where a determination is made as to whether a bus error, termination, or timeout has occurred. If none of these instances has occurred, then the program will proceed to step 808 to again determine if the data byte acknowledge bit has been received. This process will continue until an internal handshake timer (not shown) times out wherein the process will continue at step 825 where an unknown error flag is set and the transmission will be terminated. After it is determined that the last data byte has been sent (step 818) then a flag indicating that the last byte has been sent is set at step 818 of FIG. 18. In view of FIG. 18, it is understood that in some cases, no data is to be returned as shown at step 802, and the algorithm will proceed directly to step 812 and bypass the receipt acknowledgment bit step 808.

Next, as indicated at step 822, a determination is made as to whether the stop bit flag has been received from the I²C bus master indicating the end of bus control due to the fact that the external device will not be receiving any more data. If the stop bit is received the read block is exited. If the stop bit has not been received, then an error may have occurred and the program proceeds to step 824 where a determination is made as to whether a bus error or timeout has occurred. If none of these instances has occurred, then the program will proceed to step 822 to again determine if the stop bit has been received. This process will continue until an internal handshake timer (not shown) times out wherein the process will continue at step 825 where an unknown error flag is set and the transmission will be terminated.

Alarm Control

All of the alarm status flags heretofore mentioned indicate that the battery has reached a certain state of charge (fully charged, empty discharged) or a critical state (maximal temperature, being overcharged). These events are encoded in the Al_Status battery register and the warning message AlarmWarning( ) is sent by the battery to an external device when the battery detects an alarm condition. In this event, the battery becomes the bus master and alternately notifies the host computer or battery charger of any critical and/or alarm conditions at a rate of preferably once every five seconds, until the critical state is corrected. The alarm condition may be broadcast to the host computer for 10 seconds if the alarm condition is such that the battery charger does not need to be notified of an alarm condition, for e.g., REMAINING_CAP_ALARM warning message is not the broadcast to the charger device. If alarm conditions such as OVER_CHARGED_ALARM, TERMINATE_CHARGE_ALARM, DTEMP_ALARM, OVER_TEMP_ALARM, and TERMINATE_DISCHARGE_ALARM exist, then the alarm is broadcast, alternating between the charger device and the host device, in five (5) second intervals.

Figure 19A:
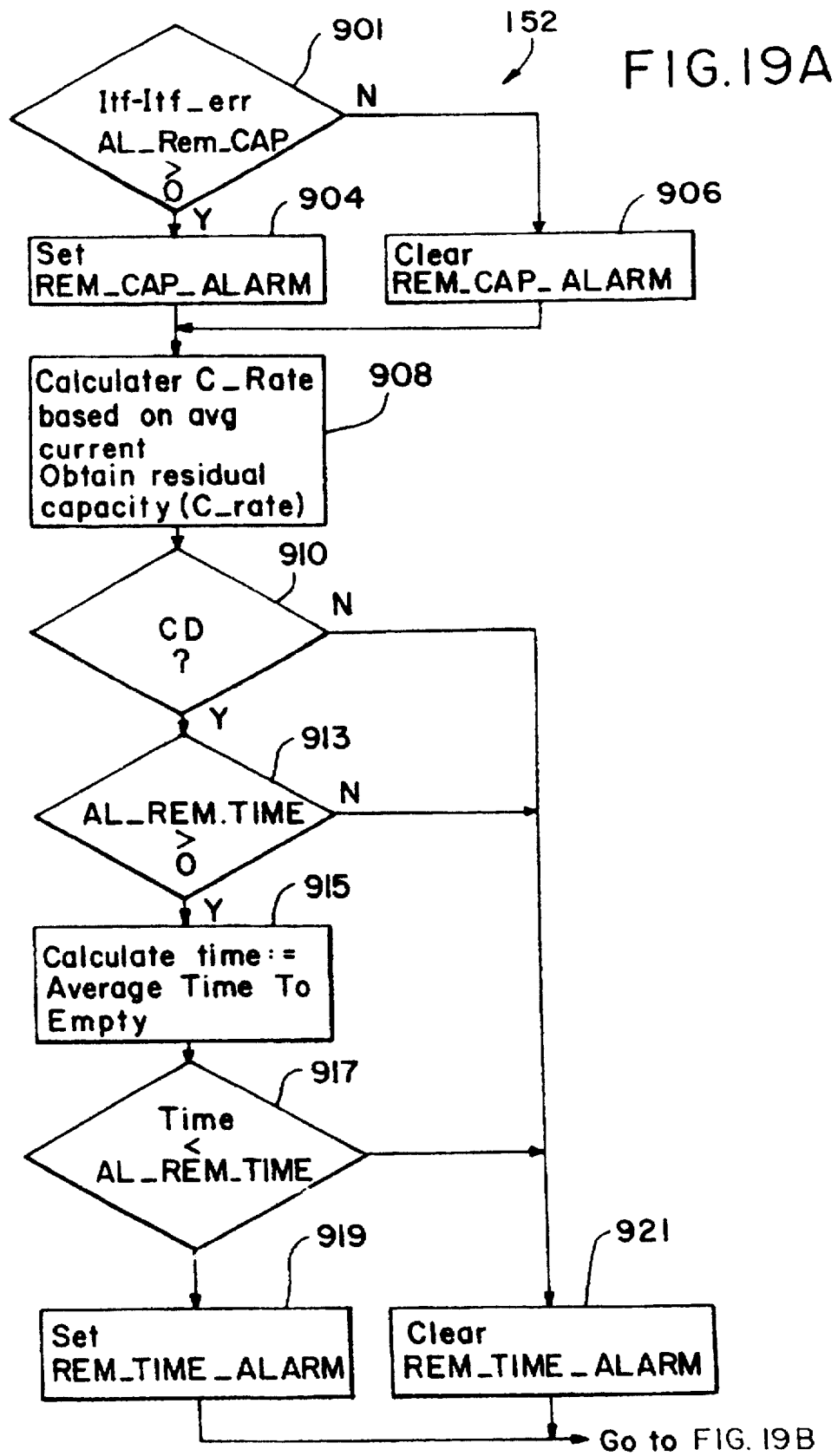
FIGS. 19 illustrates a flow diagram describing the logic steps invoked by the smart battery system when broadcasting an alarm condition to an external device.
Figure 19B:
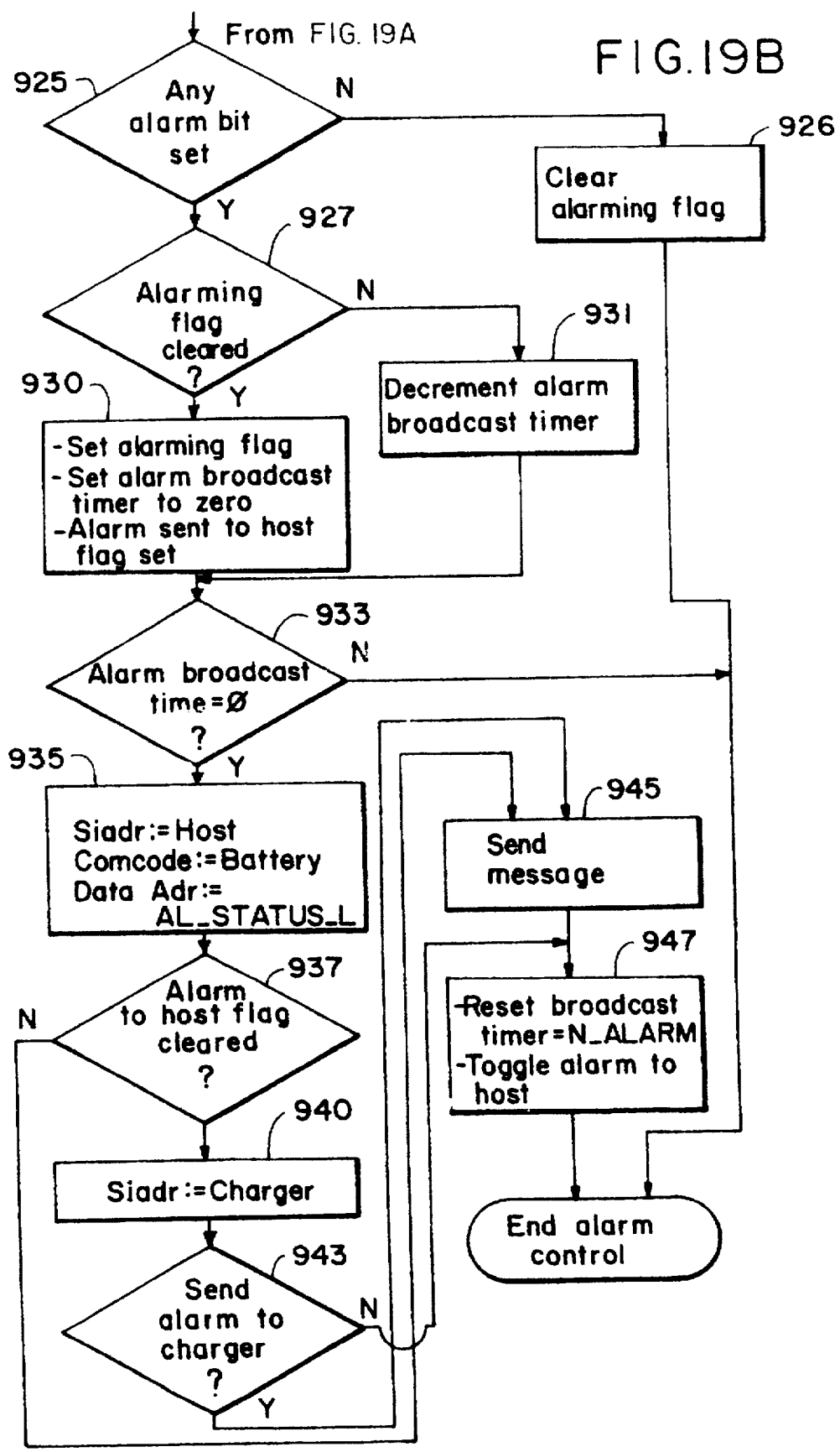

The modified SMBus protocol for communicating alarm or warning messages are illustrated in the alarm control routine 152 as shown in detail in FIG. 19.

This routine runs through all possible alarm conditions for possible broadcast to a host device after a capacity calculation is performed as shown in FIG. 3.

The first step, indicated as step 901 in FIG. 19 is to verify the status of the remaining capacity. Specifically, a determination is made as to whether the AL_REM_CAP run value is greater than 0 and that the remaining capacity (less the uncertainty error) is less than the AL_REM_CAP value. If these conditions hold true, the REMAINING_CAPACITY_ALARM bit is set at step 904. If none of these conditions holds true, the REMAINING_CAPACITY_ALARM bit is cleared at step 906. Next, the C_rate based on the one minute rolling average current is calculated and the residual capacity based on the C_rate [pd_avg:=pd(C_rate(I_avg), T)] is accessed from the look-up table of FIG. 22(a). Then, at step 910, a determination is made as to whether the battery state is capacity decreasing. If the battery capacity is decreasing, then a determination is made at step 913 as to whether the AL_REM_TIME alarm threshold value is greater than zero (0). If so, then the estimated remaining time at the present discharge rate is calculated at step 915 by the AverageTimeToEmpty( ) command code. When the calculated remaining time falls below the AL_REM_TIME threshold value, as determined at step 917, the program sets the REMAINING_TIME_ALARM bit as indicated at step 919 and the program proceed at step 925 shown in FIG. 19. If, it is determined either that the battery state is not capacity decreasing (step 910), or, that the AL_REM_TIME is equal to zero (step 913), or, that the calculated remaining time falls below the AL_REM_TIME threshold value (step 917), then the program clears the REMAINING_TIME_ALARM bit as indicated at step 921 and the program proceed at step 925 shown in FIG. 19.

As shown at step 925, the upper byte of the Alarm status register is checked to determine if any alarm bits, e.g., alarm bits such as OVER_CHARGED_ALARM, TERMINATE_CHARGE_ALARM, DTEMP_ALARM, OVER_TEMP_ALARM, TERMINATE_DISCHARGE_ALARM, REMAINING_CAPACITY_ALARM, and, REMAINING_TIME_ALARM have been set. If so, then a check of the alarm broadcast flag "alarming" is made at step 927. If the upper byte of the Alarm status register indicates no alarm condition, i.e., no bits set, then the process will continue at step 926 and the alarming broadcast flag is cleared. Note, that upon initialization, the alarming broadcast flag is not set. However, as long as an alarm condition exists, this flag will be set. Therefore, as shown at step 927, if the alarming flag is cleared, the process continues and the alarming flag is set at step 930. Additionally, at step 930, the alarm broadcast timer is set to zero, and, the "alarm to host" flag is set indicating that the alarm will be sent to a host external device and not a battery charger. The process continues at step 933, where a determination is made as to whether the alarm broadcast timer has timed out (=0). Since the broadcast timer has been set to zero at step 930 for this first operating cycle of the alarm condition, or, if the alarm broadcast timer has timed out, then the process will continue at step 935. If the timer has not timed out, then the alarm control process is exited. At step 935, the address location for the alarm broadcast is set to the host device, and the command code is set equal to the battery status [BatteryStatus( )] function described above. This will initiate the transfer of the particular alarm to the host device. A determination is then made at step 937 as to whether the alarm to host flag is cleared (=0). During the first operating cycle of the alarm condition (step 930), the alarm to host flag had been set (=1) so the algorithm skips over steps 940 and 943 (discussed below) and performs the send message routine 945 which changes the function of the battery as having bus master control so that the alarm message can be sent. Details of the send message routine 945 will be explained in detail below.

Afterwards, at step 947, the broadcast alarm timer is reset to its 10 second time (N_ALARM) and the alarm sent to host flag is toggled to the alarm sent to charger flag.

After the message is initiated to broadcast an alarm warning message to the host device at step 945 (by the send message routine), and, the alarm broadcast timer has been reset, then the process continues. After the next capacity calculation (FIG. 3), if the alarm condition still exists (i.e., the alarm bits are set) at step 925, the process is continued. However, for the next and subsequent operating cycles of the alarm condition, the alarming flag has already been set as determined (at step 927), so the alarm broadcast timer (initialized as 10 seconds) is decremented at step 931 until the timer has timed out or the alarm status has been changed. Thus, after the broadcast timer has decremented, the process continues at step 933, where a determination is made as to whether the alarm broadcast timer has timed out (=0). If the broadcast timer has not timed out, then the alarm control routine is exited and these set of steps will continue until the alarm broadcast timer has timed out (step 933). Until the alarm message has been broadcast to the host device for preferably five (5) seconds, then steps 935 and 937 will not be performed. When the broadcast timer has timed out, and, since the alarm to host flag has toggled (during the first operating cycle of the alarm condition), the condition at step 937 will be true. Therefore, the address location for the alarm broadcast is changed and set to the battery charger at step 940, and the program will proceed to step 943 where a determination is made as to whether the particular alarm warning message is meant to be sent to the battery charger for the next 10 seconds. If, the alarm condition is not meant to be transmitted to the battery charger, then the send message routine (step 945) will be bypassed, and the broadcast timer will be reset at step 947 and the alarm to host bit toggled so that the message will be retransmitted to the host device.

Charger Control

Whenever the BatteryMode( ) CHARGER MODE bit is set to zero, and the battery detects the presence of a smart battery charger, the battery is able to communicate with the smart battery charger and will send ChargingCurrent( ) and Chargingvoltage( ) values to the smart battery charger. The ChargingCurrent( ) function sets the maximum current that a smart battery charger may deliver to the battery and will return the desired charging rate in mA. This allows the battery charger to dynamically adjust its output current to match optimal recharging requirements. A maximum value of 0xFFFF means constant voltage charging with the output value of ChargingVoltage( ). Results are broadcast with the battery as active bus master under the conditions set forth in the charger control routine 154 of FIGS. 3 and 20.

Figure 20:
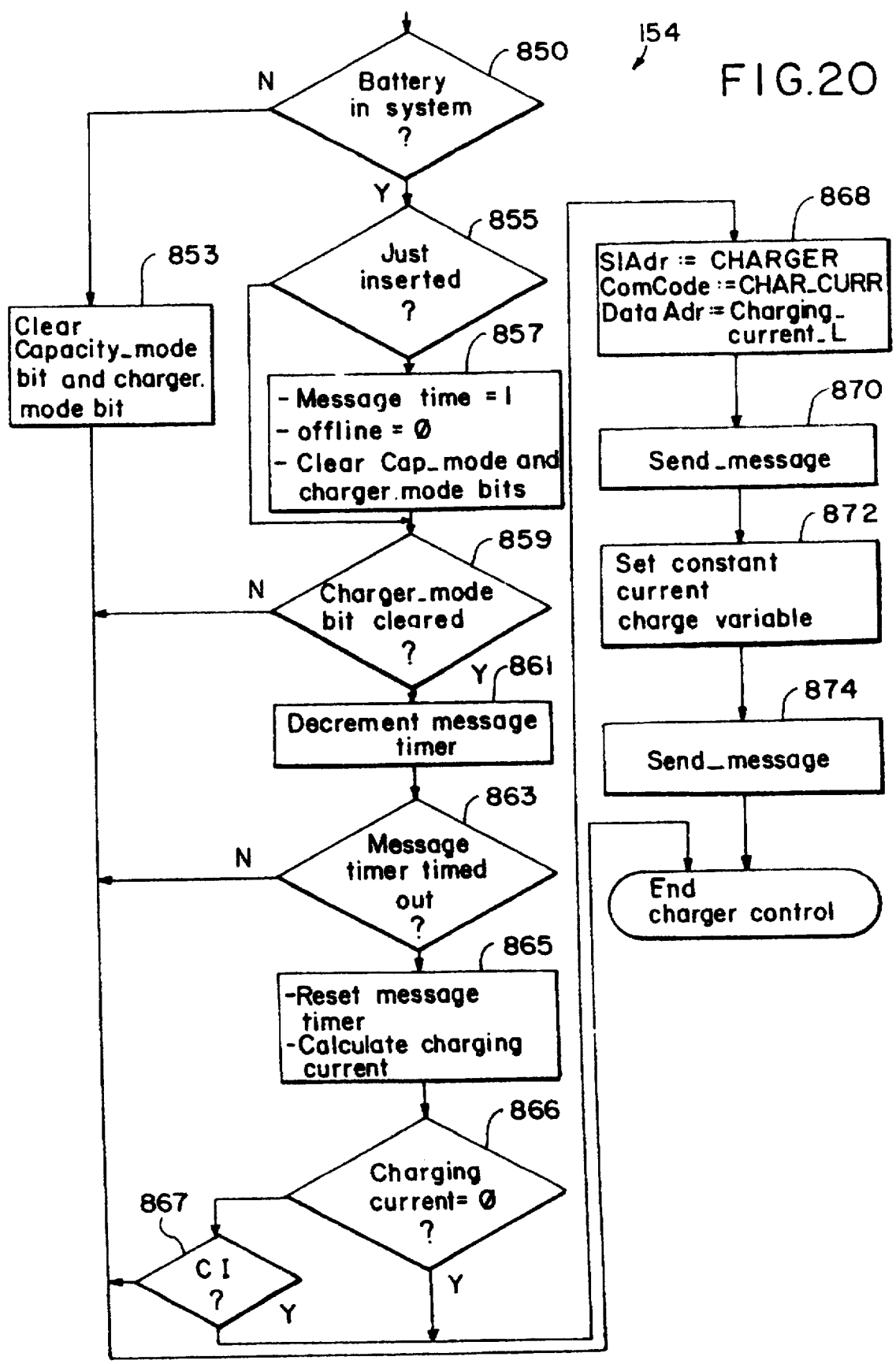
FIG. 20 illustrates a logic flow diagram describing the steps invoked by the smart battery system when broadcasting a charge condition to a battery charger.

The first step 850 in FIG. 20 is to determine whether the battery is in the system. If not, CAPACITY_MODE and CHARGER_MODE variables are cleared at step 853 and the routine is exited. If the battery is installed in the system, a determination is made at step 855 as to whether the battery was just inserted in the system. If the battery was just inserted, then the message timer is set to one (1), and the CAPACITY_MODE and CHARGER_MODE variables are cleared at step 857 and the algorithm continues at step 859. If the battery has not just been inserted (step 855), then the algorithm skips to step 859 where a determination is made as to the state of the charger mode bit. If the bit is not cleared at step 859, then the routine is exited. If the CHARGER_MODE bit is set at step 859 then the timer is decremented at step 861. The next step at 863 is to determine whether the message timer has timed out. If it has, then the message timer is reset at step 865 and the charging current calculation is additionally made. If the message timer has not timed out at step 863, then the routine is exited. The next step 866 is to determine whether the returned value of the calculated charging current is zero. If the charging current value returned is zero, then the process proceeds at step 868. If the charging current is not zero, then the determination is made at step 867 as to whether the state is capacity increasing (CI). If the battery is in a CI state, then the process proceeds at step 868. If the capacity is decreasing, then the routine is exited.

At step 868, the address location for the charger broadcast is set to the battery charger, and the command code is set equal to the command code ChargingCurrent( ). Next, at step 870, the charging current command message is sent to the battery charger by the send message routine (discussed below). Then, at step 872, the maximum value (hex FFFF) fed into the ConstantVoltage( ) function which indicates that the charger will be a constant current charging device. This instruction is broadcast to the charger via the send message routine at step 874. After the charging current is broadcast, the routine is finally exited.

Send Message Routine

Figure 21A:
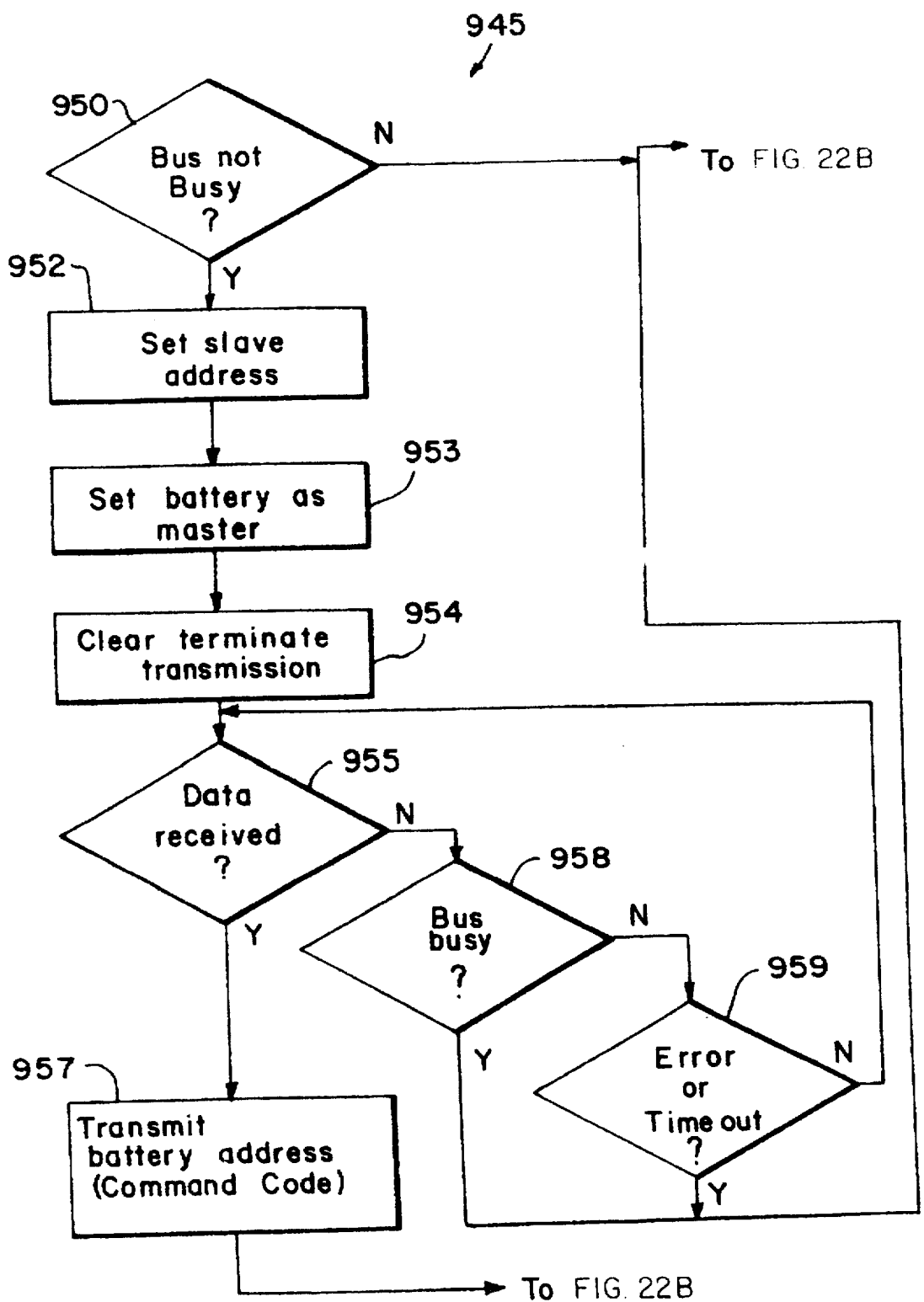
FIG. 21 illustrates a logic flow diagram describing the steps invoked by the smart battery system when broadcasting a message.

As indicated at step 945 in FIG. 19 and step 870 in FIG. 20, the send message routine changes the function of the battery to have bus master control so that the alarm messages can be sent. FIG. 21 illustrates the send message routine.

The first step 950 is to determine the data bus availability. If it is determined that the data bus is available, then the first piece of data to be sent is the slave address, i.e., the address of the external host device or battery charger, as indicated at step 952. As soon as the data bus is acquired, then two flags are set; the first flag is an internally generated flag that is set to indicate that the battery now has bus master control (step 953), and, the second flag is the transmission termination flag that is cleared at step 954. The next step, as indicated at step 955, is a check as to whether the acknowledge bit has been sent, i.e., whether the first byte of data (slave address) has been received by the slave device. If the acknowledge bit has not been sent, then a check is made at step 958 to determine if the bus is busy. If the bus is now busy, then the program continues at step 960 of FIG. 21. If the bus is not busy at step 958, then a determination is made as to whether a bus error or timeout flag has been generated at step 959. If an error or timeout has occurred, then the program will proceed to step 973 where the transmission will be terminated and the routine exited. If an error or timeout condition does not exist, the routine will continue at step 955 until an acknowledge bit has been sent by the slave indicating that the data has been received. If the acknowledge bit has been received, then the current command code is transmitted at step 957. It should be understood that when the send message routine is invoked during a critical alarm condition, then the command code word is set to the battery address (see step 935, FIG. 19) and the slave will recognize that only two bytes of data are to be sent. The next step, as indicated at step 960, is a check as to whether the acknowledge bit has been sent, i.e., whether the command code (or battery address) has been received by the slave device. If the acknowledge bit has not been received, then a check is made at step 962 to determine whether a bus error or timeout flag has been generated. If an error or timeout has occurred, then the program will proceed to step 973 where the transmission will be terminated and the routine exited. If an error or timeout condition does not exist, the routine will continue at step 960 until it is acknowledged that the command code (or battery address) has been received. If the acknowledge bit has been received, then the first byte of data is transmitted to the specified address location (see step 935, FIG. 19) at step 965. The next step, as indicated at step 966, is a check as to whether the acknowledge bit has been sent, i.e., whether the first byte of command code data has been received by the slave device. If the acknowledge bit has not been received, then a check is made at step 967 to determine whether a bus error or timeout flag has been generated. If an error or timeout has occurred, then the program will proceed to step 973 where the transmission will be terminated and the routine exited. If an error or timeout condition does not exist, the routine will continue at step 966 until it is acknowledged that the first data byte has been received. If the acknowledge bit has been received, then the second byte of data is transmitted to the next address location at step 968. The next step, as indicated at step 969, is a check as to whether the acknowledge bit has been sent, i.e., whether the second byte of command code data has been received by the slave device. If the acknowledge bit has not been received, then a check is made at step 971 to determine whether a bus error or timeout flag has been generated. If an error or timeout has occurred, then the program will proceed to step 973 where the transmission will be terminated and the routine exited. If an error or timeout condition does not exist, the routine will continue at step 969 until it is acknowledged that the second data byte has been received. After the full message has been transmitted by the battery to the slave device, the send message routine is exited.

LED display

As shown in FIG. 2(a), the battery 10 of the instant invention provides manually controlled four (4) segment light emitting diode (LED) display indicating the relative state of charge of the battery (similar to a fuel gauge) with respect to the full__cap value. After the capacity calculation, alarm control 152, and charger control 154 routines are performed during each 500 msec period (operating cycle), the system will look for a hardware trigger of the LED display. At any time, a user can initiate the LED display by a switch 35 on the battery 10 as shown in FIG. 2(a). The control logic for generating the LED display is described in detail (in view of steps 975 through 996 of FIG. 15) in copending patent application (U.S. Ser. No. 08/318,004).

While the invention has been particularly shown and described with respect to the preferred embodiments thereof, it will be understood by those skilled in the art that the foregoing and other changes in form and details may be made therein without departing from the spirit and scope of the invention, which should be limited only by the scope of the appended claims.

We claim:

1. A battery pack comprising:
   terminal means for connecting the battery pack to a battery powered device and to a battery recharger;
   a battery including at least one rechargeable battery cell connected to the terminal means, said battery having
   i) a discharge mode for supplying electrical power to the battery powered device, and
   ii) a charge mode for receiving electrical power from the terminal means;
   sensing means for sensing and generating analog signals representing battery voltage, battery temperature, and battery current;
   an analog-to-digital converter for receiving said analog signals and for converting both positive and negative analog signals to digital signals representing battery voltage, battery temperature, and battery current;
   a processor connected to the analog-to-digital converter for receiving the digital signals therefrom, and for performing a predefined series of calculations using said digital signals; and
   a memory area for storing data values including at least values representing battery voltage, battery temperature and battery current.

2. A battery pack according to claim 1, wherein the analog-to-digital converter includes:
   a bandgap reference circuit to provide a preset analog voltage; and
   a voltage shifting circuit to provide a variable base reference voltage to facilitate generating digital values representing positive and negative analog signals.

3. A battery pack according to claim 2, wherein the analog-to-digital converter further includes a voltage divider network to receive the preset analog voltage from the bandgap reference circuit and to divide said preset analog voltage into a plurality of voltage output values.

4. A battery pack according to claim 2, wherein the analog-to-digital converter further includes a sigma-delta converter for receiving the analog signals from the sensing means and for converting said analog signals to digital values representing battery voltage, battery temperature, and battery current.

5. A battery pack according to claim 1, wherein the analog-to-digital converter processes each of the analog signals representing battery voltage, battery temperature, and battery current for a respective period to produce the digital values representing battery voltage, battery temperature, and battery current.

6. A battery pack according to claim 5, further including:
an oscillator for generating clock signals at a given frequency; and
means to transmit said clock signals to the analog-to-digital converter; and
wherein each of said periods has a length determined by said clock signals.

7. A smart battery pack according to claim 6, wherein:
the analog-to-digital converter processes the analog signals representing battery voltage, battery temperature, and battery current for first, second and third periods respectively; and
the lengths of said first, second and third periods are determined by the lengths of time required for the analog-to-digital converter to receive, respectively, first, second and third numbers of the clock signals.

8. A battery pack according to claim 2, wherein the voltage shifting circuit includes:
a first capacitor having first and second opposite sides;
means to generate a reference ground voltage level; and
a switching network for applying the reference ground voltage level and the analog signals to the first and second sides of the capacitor to develop a voltage level at the capacitor;
the switching network having
  i) a first state for applying the reference ground voltage level to the first side of the capacitor, and for applying at least one of said analog signals to the second side of the capacitor, and
  ii) a second state for applying the reference ground voltage level to the second side of the capacitor, and for applying at least one of said analog signals to the first side of the capacitor.

9. A battery pack according to claim 8, wherein:
the analog-to-digital converter further includes a sigma-delta converter including
  i) means to generate a second reference voltage level,
  ii) an integrator having first and second inputs,
  iii) means to apply the second reference voltage level to the first input of the integrator, and
  iv) a switch electrically located in series between the first capacitor and the second input of the integrator; and
the switch has
  i) a conductive state for applying the voltage level of the first capacitor to the second input of the integrator, and
  ii) a non-conductive state for electrically decoupling the first capacitor from the second input of the integrator.

10. A battery pack according to claim 8, wherein the sigma-delta converter further includes:
a second capacitor electrically located in parallel with the integrator; and
a further switch electrically located in parallel with the second capacitor to selectively discharge said second capacitor.

11. A battery pack according to claim 8, wherein:
the integrator has an output voltage level;
the sigma-delta converter further includes
  v) a comparator having first and second inputs,
  vi) means to apply the second reference voltage level to the first input of the comparator, and
  vii) means to apply the output voltage level of the integrator to the second input of the comparator; and
the comparator has
  i) a first output when the voltage level applied to the first input of the comparator is less than the voltage level applied to the second input of the comparator, and
  ii) a second output when the voltage level applied to the first input of the comparator is greater than the voltage level applied to the second input of the comparator.

12. A battery pack according to claim 11, wherein:
the sigma-delta converter further includes
  vii) a counter, and
  ix) means for applying the output of the comparator to the counter; and
the counter maintains a count of the number of times the first output of the comparator is applied to the counter during a defined period of time.

13. An analog-to-digital converter including:
input means to receive positive and negative analog input signals;
a signal converter to receive the analog signals from the input means and for converting both positive and negative analog signals to digital signals; and
output means for receiving the digital signals from the converter means and transmitting the digital signals from the analog-to-digital converter.

14. An analog-to-digital converter according to claim 13, wherein the signal converter includes:
a bandgap reference circuit to provide a preset analog voltage; and
a voltage shifting circuit to provide a variable base reference voltage to facilitate generating digital values representing positive and negative analog signals.

15. An analog-to-digital converter according to claim 14, wherein the signal converter further includes a voltage divider network to receive the preset analog voltage from the bandgap reference circuit and to divide said preset analog voltage into a plurality of voltage output values.

16. An analog-to-digital converter according to claim 13, wherein:
the input means receives a plurality of different types of input signals; and
the signal converter further includes a sigma-delta converter to receive said different types of input signals and to process the different types of input signals for different periods of time to produce digital signals representing the input signals.

17. An analog-to-digital converter according to claim 16, wherein:
the sigma-delta converter includes a clock input to receive clock input signals at defined frequencies; and
the different periods of time have lengths determined by the lengths of time required for the sigma-delta to receive different numbers of the clock signals.

18. An analog-to-digital converter according to claim 14, wherein the voltage shifting circuit includes:

a first capacitor having first and second opposite sides;
means to generate a reference ground voltage level; and
a switching network for applying the reference ground voltage level and the analog signals to the first and second sides of the capacitor to develop a voltage level at the capacitor;

the switching network having
i) a first state for applying the reference ground voltage level to the first side of the capacitor, and for applying analog signals to the second side of the capacitor, and
ii) a second state for applying the reference ground voltage level to the second side of the capacitor, and for applying the input signals to the first side of the capacitor.

19. An analog-to-digital converter according to claim 18, wherein:

the signal converter further includes a sigma-delta converter including
i) means to generate a second reference voltage level,
ii) an integrator having first and second inputs,
iii) means to apply the second reference voltage level to the first input of the integrator, and
iv) a switch electrically located in series between the first capacitor and the second input of the integrator; and the switch has
i) a conductive state for applying the voltage level of the first capacitor to the second input of the integrator, and
ii) a non-conductive state for electrically decoupling the first capacitor from the second input of the integrator.

20. An analog-to-digital converter according to claim 19, wherein the sigma-delta converter further includes:

a second capacitor electrically located in parallel with the integrator; and
a further switch electrically located in parallel with the second capacitor to selectively discharge said second capacitor.

21. An analog-to-digital converter according to claim 19, wherein:

the integrator has an output voltage level;
the sigma-delta converter further includes
v) a comparator having first and second inputs,
vi) means to apply the second reference voltage level to the first input of the comparator, and
vii) means to apply the output voltage level of the integrator to the second input of the comparator; and the comparator has
i) a first output when the voltage level applied to the first input of the comparator is less than the voltage level applied to the second input of the comparator, and
ii) a second output when the voltage level applied to the first input of the comparator is greater than the voltage level applied to the second input of the comparator.

22. An analog-to-digital converter according to claim 21, wherein:

the sigma-delta converter further includes
i) a counter, and
ii) means for applying the output of the comparator to the counter; and the counter maintains a count of the number of times the first output of the comparator has been applied to the counter during a defined period of time.

23. A method of operating a battery system having a rechargeable battery, a processor, a memory area and an analog-to-digital converter, the method comprising:

connecting the rechargeable battery to a battery powered device to supply electrical power thereto;
sensing, and generating analog signals representing, battery voltage, battery temperature and battery current, said analog signal including both positive and negative signals;
transmitting said analog signals to the analog-to-digital converter;
the analog-to-digital converter, converting both the positive and negative analog signals to digital signals representing battery voltage, battery temperature and battery current; and
storing data values in the memory area, said stored data values including at least values representing battery voltage, battery temperature and battery current.

24. A method according to claim 23, wherein the step of converting the analog signals to digital signals includes the steps of:

generating a preset analog bandgap references voltage; and
generating a variable base reference voltage to facilitate generating digital values from both positive and negative analog current signals.

25. A method according to claim 24, wherein the step of generating the bandgap reference voltage includes the step of dividing the bandgap reference voltage into a plurality of output voltage values.

26. A method according to claim 25, wherein the step of converting the analog signals to digital signals further includes the steps of processing each of the analog signals representing battery voltage, battery temperature and battery current for a respective period of time to produce the digital values representing battery voltage, battery temperature and battery current.

27. A method according to claim 26, further including the steps of:

generating clock signals at a given frequency;
transmitting the clock signals to the analog-to-digital converter; and
using the clock signals to determine the lengths of said periods of time.

28. A method according to claim 24, wherein:

the step of generating the base reference voltage includes the steps of generating a reference ground voltage level; and
the step of converting the analog signals to digital signals further includes the step of developing a voltage level in a capacitor having first and second opposite sides, including the steps of
i) at first times, applying the reference ground voltage level to the first side of the capacitor, and applying the analog signals to the second side of the capacitor, and
ii) at other times, applying the reference ground voltage level to the second side of the capacitor, and applying at least one of the analog signals to the first side of the capacitor.

29. A method according to claim 28, wherein the step of converting the analog signals to digital signals further includes the steps of:

generating a second reference voltage level;

applying the second reference voltage level to a first input of an integrator; and selectively applying the voltage level of the capacitor to a second input of the integrator.

30. A method according to claim 29, wherein:

the integrator has an output voltage level;

the step of converting the analog signals to digital signals further includes the steps of
i) applying the second reference voltage level to a first input of a comparator, and
ii) applying the output voltage level of the integrator to a second input of the comparator;

the comparator has a first output voltage level when the voltage level applied to the first input of the comparator is less than the voltage level applied to the second input of the comparator, and the comparator has a second output voltage level when the voltage level applied to the first input of the comparator is greater than the voltage level applied to the second input of the comparator; and the step of converting the analog signals to digital signals further includes the step of (iii) counting the number of times the comparator has the first output voltage level during a defined period of time.

31. A method of operating an analog-to-digital converter, comprising the steps of:

conducting both positive and negative analog signals to the converter; and converting both the positive and negative analog signals to digital signals, including the steps of
i) generating a preset analog signal, and
ii) generating a variable base reference signal to facilitate generating digital signals representing positive and negative analog signals.

32. A method according to claim 31, wherein the step of converting the positive and negative analog signals includes the step of dividing the preset analog signal into a plurality of voltage output values.

33. A method according to claim 31, wherein:

the conducting step includes the step of conducting a plurality of different types of input signals to the converter; and the step of converting the positive and negative analog signals further includes the step of processing the different types of input signals for different periods of time to produce digital signals representing the input signals.

34. A method according to claim 33, wherein:

the step of processing the different types of input signals includes the step of conducting clock signals to the converter at defined frequencies; and the different periods of time have lengths determined by the lengths of time required for the converter to receive different numbers of the clock signals.

35. A method according to claim 31, wherein:

the step of generating the base reference voltage includes the steps of generating a reference ground voltage level; and the step of converting the analog signals to digital signals further includes the step of developing a voltage level in a capacitor having first and second opposite sides, including the steps of
i) at first times, applying the reference ground voltage level to the first side of the capacitor, and applying the analog signals to the second side of the capacitor, and
ii) at other times, applying the reference ground voltage level to the second side of the capacitor, and applying at least one of the analog signals to the first side of the capacitor.

36. A method according to claim 35, wherein the step of converting the analog signals to digital signals further includes the steps of:

generating a second reference voltage level;

applying the second reference voltage level to a first input of an integrator; and selectively applying the voltage level of the capacitor to a second input of the integrator.

37. A method according to claim 36, wherein:

the integrator has an output voltage level;

the step of converting the analog signals to digital signals further includes the steps of
i) applying the second reference voltage level to a first input of a comparator, and
ii) applying the output voltage level of the integrator to a second input of the comparator;

the comparator has a first output voltage level when the voltage level applied to the first input of the comparator is less than the voltage level applied to the second input of the comparator, and the comparator has a second output voltage level when the voltage level applied to the first input of the comparator is greater than the voltage level applied to the second input of the comparator; and the step of converting the analog signals to digital signals further includes the step of (iii) counting the number of times the comparator has the first output voltage level during a defined period of time.

* * * * *